United States Patent
Sluyski et al.

(10) Patent No.: US 10,979,209 B1
(45) Date of Patent: Apr. 13, 2021

(54) SYSTEM, METHOD, AND APPARATUS FOR MAPPING SYNCHRONOUS AND ASYNCHRONOUS DATA

(71) Applicant: Acacia Communications, Inc., Maynard, MA (US)

(72) Inventors: Michael Sluyski, Maynard, MA (US); Pierre Humblet, Cambridge, MA (US); James Duda, Waltham, MA (US)

(73) Assignee: Acacia Communications, Inc., Maynard, MA (US)

( * ) Notice: Subject to any disclaimer, the term of this patent is extended or adjusted under 35 U.S.C. 154(b) by 0 days.

(21) Appl. No.: 16/595,275

(22) Filed: Oct. 7, 2019

Related U.S. Application Data

(60) Provisional application No. 62/742,886, filed on Oct. 8, 2018, provisional application No. 62/744,509, filed on Oct. 11, 2018, provisional application No. 62/751,062, filed on Oct. 26, 2018.

(51) Int. Cl.
*H04B 10/50* (2013.01)
*H04L 7/00* (2006.01)
*H03M 13/45* (2006.01)

(52) U.S. Cl.
CPC ........ *H04L 7/0075* (2013.01); *H03M 13/458* (2013.01); *H04B 10/50* (2013.01)

(58) Field of Classification Search
CPC ......... H04B 10/27; H04B 10/50; H04J 14/02; H03M 13/458
See application file for complete search history.

(56) References Cited

U.S. PATENT DOCUMENTS

| | | | | |
|---|---|---|---|---|
| 2010/0067905 A1* | 3/2010 | Dong | .................... | H04J 3/1664 398/45 |
| 2010/0226652 A1* | 9/2010 | Vissers | .................. | H04B 10/27 398/98 |
| 2012/0014270 A1* | 1/2012 | Honma | ...................... | H04J 3/07 370/252 |
| 2015/0295840 A1* | 10/2015 | Loehr | ................... | H04J 3/1652 398/68 |

* cited by examiner

*Primary Examiner* — Dzung D Tran
(74) *Attorney, Agent, or Firm* — Joseph D'Angelo

(57) ABSTRACT

A method, system, and apparatus for transmitting information over an coherent optical link comprising enabling synchronous and asynchronous data sources to be mapped together into a single payload using a generic mapping system which performs decoupling of a clock from each data source, and mapping data from each data source into a tributary of an oFrame.

20 Claims, 40 Drawing Sheets

CM: Common alignment marker
UP: Unique pad
UM: Unique alignment marker

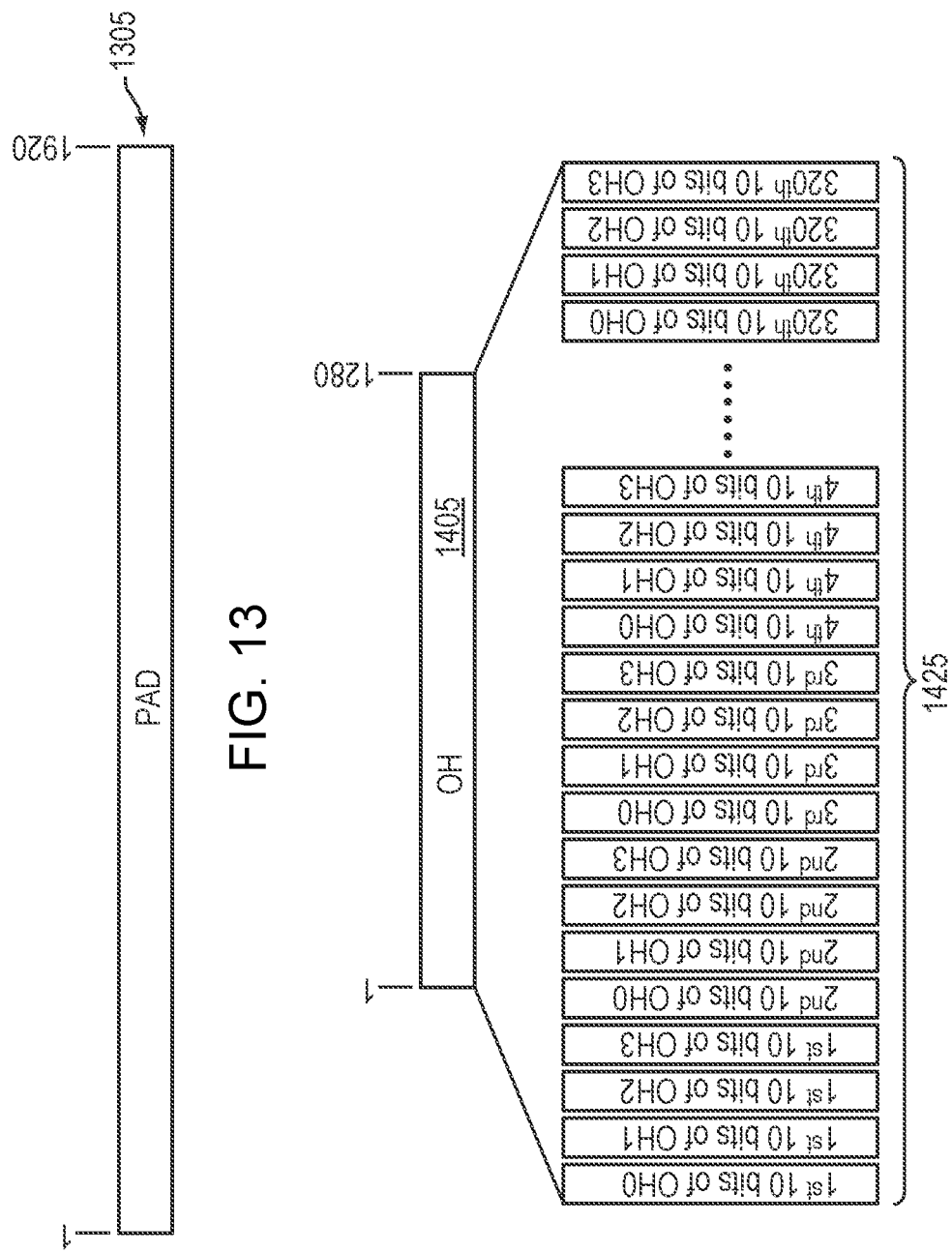

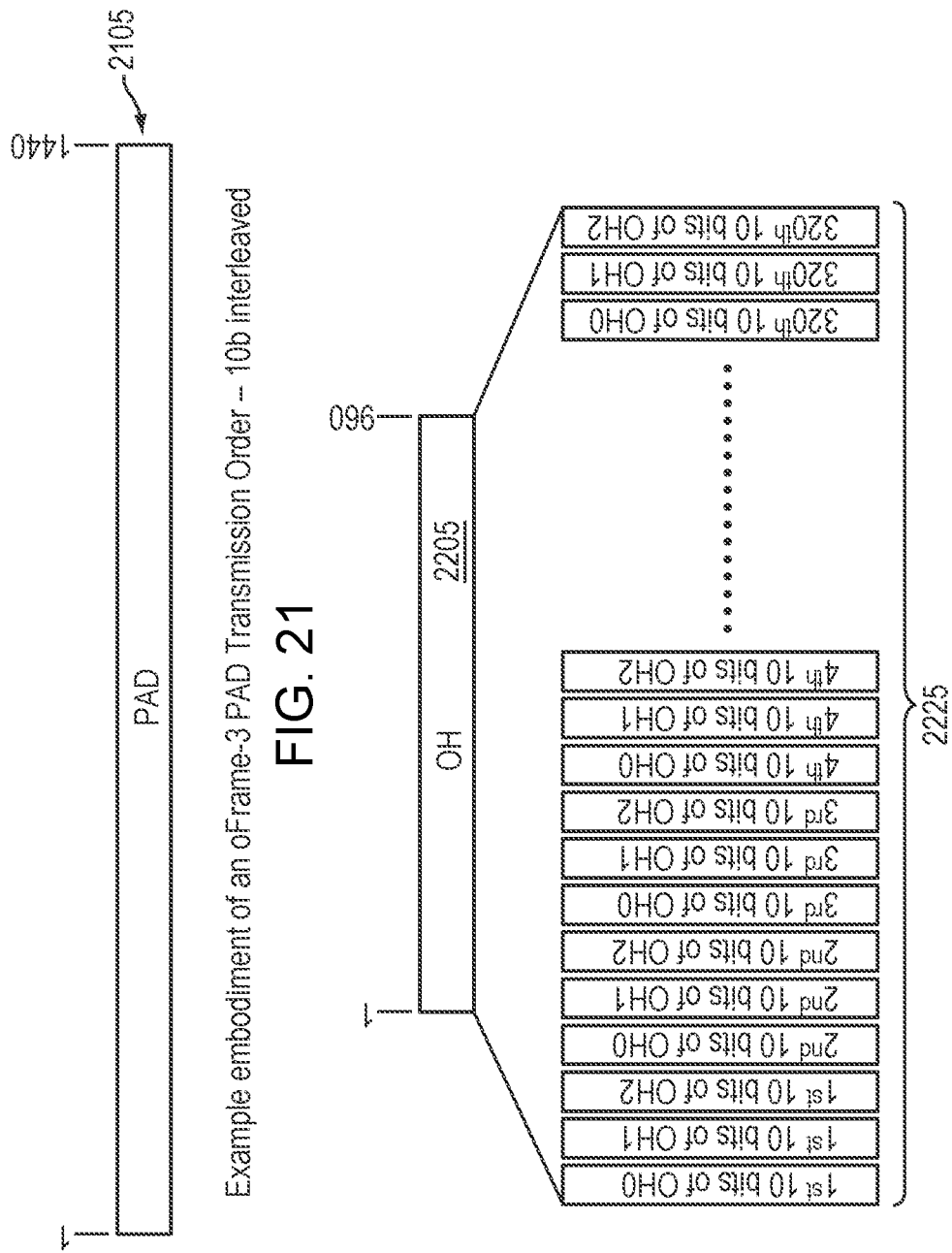

SYSTEM, METHOD, AND APPARATUS FOR MAPPING SYNCHRONOUS AND ASYNCHRONOUS DATA

RELATED APPLICATIONS

This application claims the benefit of U.S. Provisional Patent Application 62/742,886 filed Oct. 8, 2018 entitled "Forward Error Correction;" U.S. Provisional Patent Application 62/744,509 filed Oct. 11, 2018 entitled "Forward Error Correction;" and U.S. Provisional Patent Application No. 62/751,062 filed Oct. 26, 2018 entitled "Oframe;" all of which are incorporated herein in their entireties. This application is related to U.S. patent application Ser. No. 15/637,808, titled "Forward Error Correction Systems and Methods," which is incorporated by reference in its entirety for all purposes.

SUMMARY

A method, system, and apparatus for transmitting information over an coherent optical link comprising enabling synchronous and asynchronous data sources to be mapped together into a single payload using a Generic Mapping Procedure (GMP) which decouples a clock associated with each data source, and mapping data from each data source into a tributary slot(s) of an oFrame.

BRIEF DESCRIPTION OF THE FIGURES

FIG. 13 is a simplified illustration of an oFRAME-4 PAD Transmission Order—10b interleaved, in accordance with an embodiment of the present disclosure;

FIG. 14 is a simplified illustration of an oFRAME-4 OH Transmission Order—10b interleaved, in accordance with an embodiment of the present disclosure;

FIG. 21 is a simplified illustration of an oFRAME-3 PAD Transmission Order—10b interleaved, in accordance with an embodiment of the present disclosure;

FIG. 22 is a simplified illustration of an oFRAME-3 OH Transmission Order—10b interleaved, in accordance with an embodiment of the present disclosure;

FIG. 43 is a simplified illustration of a Sequencing of bits within an input rectangle, in accordance with an embodiment of the present disclosure;

FIG. 44 is a simplified illustration of a Bit numbering within an output rectangle, in accordance with an embodiment of the present disclosure;

DETAILED DESCRIPTION

Figure 1:
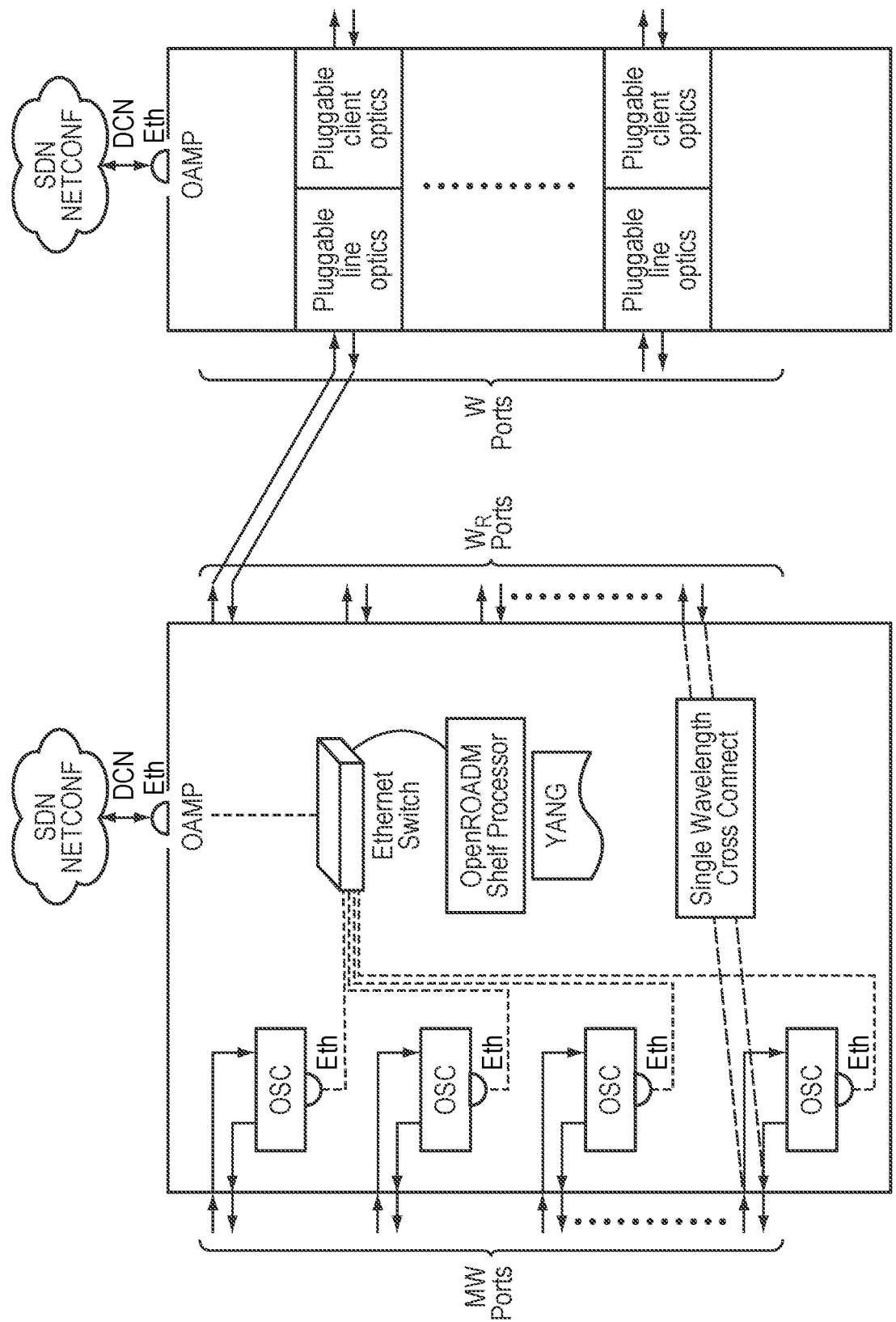
FIG. 1 is a simplified illustration of an OpenROADM Architecture reference, in accordance with an embodiment of the present disclosure.

In certain embodiments, the current disclosure may provide embodiments of a communication format and processing done by a DSP and PIC function for a coherent interface. In many embodiments, the current disclosure may enable mapping and multiplexing client signals into an open Frame (oFrame) container for transport over a coherent optical link.

In many embodiments, the current disclosure may enable data from different source or clients to be combined into a single transport container to be sent over an optical link. In some embodiments, an optical transport container may be encoded and interleaved before being sent over an optical link. In most embodiments, multiple data sources or client data may be combined into a single transport carrier for transportation together over an optical link as the optical link may be able to transport more data, i.e. has a higher bandwidth, than can produced by a single data source or client. In different embodiments, there may be oFrames of different size.

In many embodiments, the current disclosure may enable mapping synchronous and non-synchronous data together into a single payload. In many embodiments, the current disclosure may use a generic mapping procedure, such as ITU-T G.709/Y.1331 Annex D, to map synchronous and non-synchronous transmissions together. In certain embodiments, the current disclosure may enable combination of synchronous and asynchronous data source for optical transport.

This document may use the following abbreviations and acronyms.

AM Alignment Marker
BMP Bit-synchronous Mapping Procedure
CBR Constant Bit Rate
CRC Cyclic Redundancy Check
DSP Digital Signal Processor
ENOB Equivalent Number of Bits
FA Frame Alignment
FAS Frame Alignment Signal
FCC FlexO Communications Channel
FEC Forward Error Correction
FlexE Flexible Ethernet
FlexO Flexible Optical Transport Network
FOIC FlexO Interface
GFP Generic Framing Procedure
GID Group Identification
GMP Generic Mapping Procedure
IA Implementation Agreement
IPG Inter Packet Gap
LSB Least Significant Bit
MAP PHY Map field
MFAS Multi-Frame Alignment Signal
MS Multiplexed Section
MSB Most Significant Bit
NNI Network Node Interface
ODTUG Optical Data Tributary Unit Group
ODTUGk/Cn Optical Data Tributary Unit Group-k/Cn
ODTUjk Optical Data Tributary Unit j into k
ODTUk/Cn.ts Optical Data Tributary Unit k/Cn with ts tributary slots
ODU Optical Data Unit
ODUk/Cn Optical Data Unit-k/Cn
ODUk/Cn.ts Optical Data Unit k/Cn fitting in ts tributary slots
ODUk/CnP Optical Data Unit-k/Cn Path monitoring level
ODUk/CnT Optical Data Unit-k/Cn Tandem connection monitoring level ODUFlex
ODU-k*ts
OH Overhead
OPU Optical Payload Unit
OSMC OTN synchronization messaging channel
OTL Optical Transport Lane
OTLk.n Group of n Optical Transport Lanes that carry one OTUk
OTLC.n Group of n Optical Transport Lanes that carry one OTUC of an
OTN Optical Transport Network
OTU Optical Transport Unit
OTUk/Cn Optical Transport Unit-k/Cn
PCS Physical Coding Sublayer
PHY Physical Layer
PIC Photonic Integrated Circuit
PID Physical Identification
PPM Parts Per Million
PSRR Power Supply Rejection Ratio
RES Reserved for future international standardization
RPF Remote Physical Layer Fault
RS Regeneration Section
RS Reed-Solomon
SM Section Monitoring
STAT Status
UM Unique Marker
UP Unique Padding In almost all embodiments, Applicants have realized that previous optical transport solutions may not have been able to combine synchronous and asynchronous data sources. In most embodiments, Applicants have realized that previous optical transport solutions may have been limited to either transmitting synchronous data or transmitting asynchronous data. In most embodiments, Applicants have realized that previous solutions may have not been able to synchronize plesiosynchronous data when transmitted with synchronous or asynchronous data.

Refer now to the example embodiment of FIG. 1, which illustrates an example OpenROADM Architecture reference. In the example architecture of FIG. 1, Applicants have realized that it may be advantageous to input multiple different types of data, which may be both synchronous and asynchronous and by clients of different bandwidths, and combine them in a common format that may be able to be sent over an optical link.

In certain embodiments, in the current disclosure may enable synchronous transmission of a coherent signaling path and the system side interface may be synchronous or asynchronous. In some embodiments, a generic mapping procedure may be used to combine both synchronous and asynchronous data. In many embodiments, a GMP may be used to insert filler data to enable synchronous and asynchronous data to be mapped together.

In some embodiments, generic mapping procedure (GMP) may be enabled to map one or more client signals of lower speed into a frame format of a higher speed. In certain embodiments, mapping asynchronous data into a higher frame rate may include the additional of variable stuffing. In many embodiments, GMP mapping may transform variable rate data stream(s) into fixed size tributarie(s) of an oFrame. In almost all embodiments, GMP may enable any type of client traffic to be mapped into an oFrame. In most embodiments, one or more clients may be mapped into a tributary slot(s) of an oFrame. In many embodiments, a tributary slot(s) may represent a place to store data in an oFrame. In many embodiments, use of GMP mapping may enable data received from a client to be decoupled from the transmit clock of the oFrame. In certain embodiments, GMP demapping may recover the client data from an oFrame and recreate the client clock. In certain embodiments, using a GMP demapping procedure may strip out the overhead (stuff) data added to an oFrame.

In many embodiments, this document may enable mapping and multiplexing up to n*Y+m*Z Gbits/Sec. data, where n and m are integers and Y and Z are client bit rates, into an open Frame (oFrame) container for transport over a coherent optical link, provided that the combined bandwidth of n*y+m*Z is less than the bandwidth of the oFrame. In many embodiments, this document may enable mapping and multiplexing up to N×200G client signals into an open Frame (oFrame) container for transport over a coherent optical link. In many embodiments, this document may enable mapping and multiplexing up to N×300G client signals into an open Frame (oFrame) container for transport over a coherent optical link. In many embodiments, this document may enable mapping and multiplexing up to N×400G client signals into an open Frame (oFrame) container for transport over a coherent optical link.

In most embodiments, this document may describe an open FEC (oFEC) Forward Error Correction technique. In some embodiments, an oFEC may be a block code based encoder and iterative soft decision decoder with 11.6 dB @ $10^{-15}$ (16 QAM) Net Coding Gain (NCG) after 3 SD iterations (correction to $\leq 10^{-15}$ with pre-FEC BER $2.0^{-2}$). In some embodiments, oFEC may be a block code based encoder and iterative soft decision decoder.

In some embodiments, asynchronous mapping may have data transparency and timing transparency and may be mapping function dependent. In some embodiments, asynchronous mapping may be stable on both client and line during fault conditions. In most embodiments, each tributary slot may be individually mapped and a fault in a particular tributary may not affect any remaining tributaries. In many embodiments, asynchronous mapping may be a least expensive clock solution. In certain embodiments, asynchronous mapping may require fewer components than synchronous mapping. In some embodiments, asynchronous mapping may be extensible to support multiple system-side interfaces. In some embodiments, asynchronous mapping may enable faster link recovery time. In certain embodiments, asynchronous mapping may require higher overhead for mapping into higher rate containers. In other embodiments, asynchronous and synchronous mapping may require de-correlator logic if timing transparency is required.

In certain embodiments, synchronous mapping may be data transparent and timing transparent. In other embodiments, synchronous mapping may have a higher cost for clocking. In some embodiments, synchronous mapping may have link instability on both client and line under failure condition. In many embodiments, synchronous mapping may have single system-side interface. As used herein, the terms system-side, client side, client, or host interface may be used interchangeably. As used herein the terms line-side and network side may be used interchangeably In a particular embodiment, Synchronous Mapping may require that a datapath is synchronized to an external clock reference. In some embodiments, synchronous mapping may require that voltage controlled crystal oscillator (VXCO) and phase lock loops in both TX and RX datapaths. In certain embodiments, synchronous mapping may require that a line-side Transmit clock is ratio locked to system-side interface. In many embodiments, synchronous mapping may require that a system-side Transmit clock is ratio locked to line-side interface. In other embodiments, synchronous mapping may require that a TX/RX datapath can by pseudo-synchronous (e.g. delta of +/−n ppm).

In some embodiments, in asynchronous mapping, a datapath may be synchronized to a local clock reference using methods (e.g. GMP mapping) along a medium.

In certain embodiments, data transparency may mean a Datapath is preserved but timing is not (e.g. Packet payload). In some embodiments, timing transparency may mean a data path is preserved and timing is preserved end-to-end. In many embodiments, both synchronous and asynchronous methods may be used to support Data Transparency and Timing transparency.

In certain embodiments for synchronous mapping, a TX Ratio may be locked to recovered clock from System-Side $f_2=f_1*m/n$. In many embodiments for synchronous mapping, a RX Ratio may be locked to recovered clock from Line-Side $f_4=f_3*n/m$. In some embodiments for synchronous mapping, Small Jitter may transfer/wander. In certain embodiments for synchronous mapping, there may be a limit # of cascaded hops if there is sufficient buffering to accommodate peaking. In many embodiments for synchronous mapping, a TX/RX datapath may be pseudo-synchronous (e.g. delta of +/−n ppm).

In certain embodiments, synchronous mapping may require that a datapath may be synchronized to a local clock, such as a crystal oscillator. In certain embodiments, synchronous mapping may have a reference clock that is a crystal oscillator. In certain embodiments, synchronous mapping may have a tolerance of +/−100 or +/−20 ppm. In certain embodiments, synchronous mapping may have low phase noise, High PSRR drive cost, and not have ppm tolerance. In certain embodiments, synchronous mapping may have decoupled line-side and transmit clocks. In some embodiments, coherent Link requirements may drive oscillator definitions. In certain embodiments, synchronous mapping may have low phase noise and high PSRR—Cost drivers. In certain embodiments, synchronous mapping may require a more expensive VCXO. In certain embodiments, asynchronous mapping may use a lower cost crystal oscillator. In certain embodiments, PPM Tolerance may be secondary consideration. In some embodiments, a minimum cost delta between +/−20 ppm vs. +/−100 ppm.

In some embodiments, asynchronous mapping may use GMP mapping into a container. In many embodiments, asynchronous mapping may support data and timing transparency. In certain embodiments, asynchronous mapping may have a system side clock tolerance of +/−100 ppm. In some embodiments, asynchronous mapping may have a network side clock tolerance of +/−20 ppm. In many embodiments, there may not be peaking for cascaded hops, since data may be retimed at each hop. In certain embodiments, it may be recommended that a +/−20 ppm reference oscillator with low phase noise and PSRR immunity be used. In particular embodiments, phase noise and PSRR requirements may be driven by Coherent Link requirements (ADC/DAC ENOB). In some embodiments, a +/−20 ppm tolerance may simplify Modem design.

In some embodiments, Generic Mapping Procedure (GMP) may be enabled to map one or more client signals of lower speed into a frame format of a higher speed. In certain embodiments, mapping asynchronous data into a higher frame rate may include the additional of variable stuff. In many embodiments, GMP mapping may transform variable rate data stream(s) into fixed size tributarie(s) in an oFrame. In almost all embodiments, GMP may enable any type of client traffic to be mapped into an oFrame. In most embodiments, one or more clients may be mapped into a tributary slot(s) of an oFrame. In many embodiments, a tributary slot(s) may represent a place to store data in an oFrame. In many embodiments, use of GMP mapping may enable data received from a client to be decoupled from the transmit clock of the oFrame. In certain embodiments, GMP demapping may recreate client data from an oFrame and recreate a client clock. In certain embodiments, using a GMP demapping procedure may strip out overhead data added to an oFrame.

Figure 2:
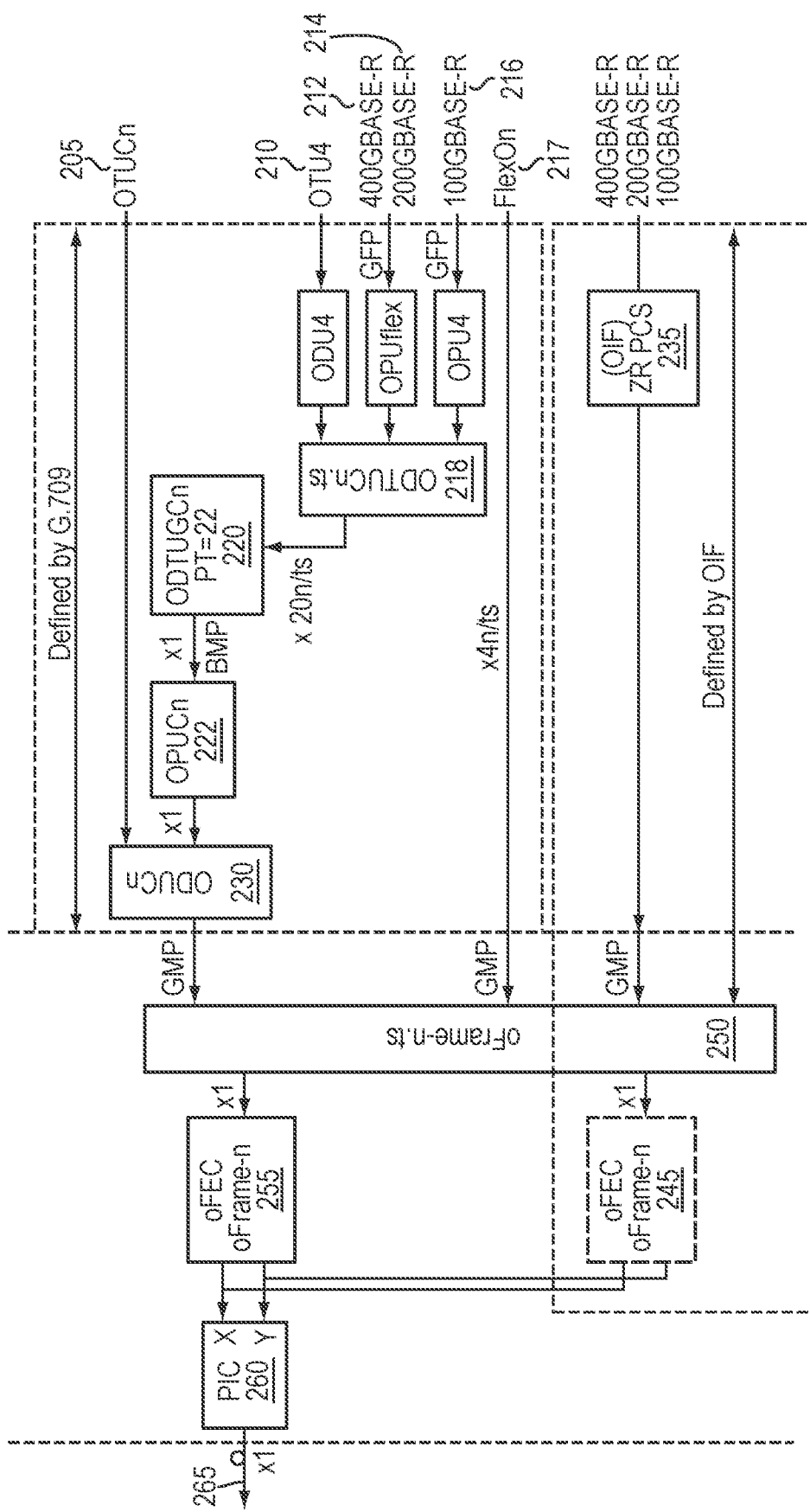
FIG. 2: is a simplified illustration of DSP container relationships, in accordance with an embodiment of the present disclosure.

Refer now to the example embodiment of FIG. 2, container relationships of a DSP mapping/multiplexing functions. In the example embodiment of FIG. 2, OTUCn 205, OTU-4 210, 40 GBASE-R 212, 200G Base-R 214, 100G Base-R 216, and FlexOn 217 are shown to be mapped to a common container of an oFrame 250. OTU-4 210, 40GBASE-R 212, 200G Base-R 214, 100G Base-R 216, are mapped to ODTUC 218, which is mapped to ODTUG 220, which is mapped to OPUC 222, which is mapped to ODUC 230, to oFrame 250. FlexOn 217 is mapped directly into oFrame 250. oFrame 250 is mapped with OFEC 255 and sent to photo integrated circuit (PIC) 260 to be transmitted as x1 265.

In certain embodiments, openFrame (also referred to herein as oFrame)—may be a X00G-Y00G like transport container, where X and Y are integers, consisting of frame alignment markers, OH fields, and a payload area. In some embodiments, a payload area of an oFrame may carry a single or multiple muxed clients. In certain embodiments, traffic may be GMP mapped and multiplexed into tributary slots in the payload area. In many embodiments, each client may be independently mapped providing end-to-end data and timing transparency.

Figure 3:
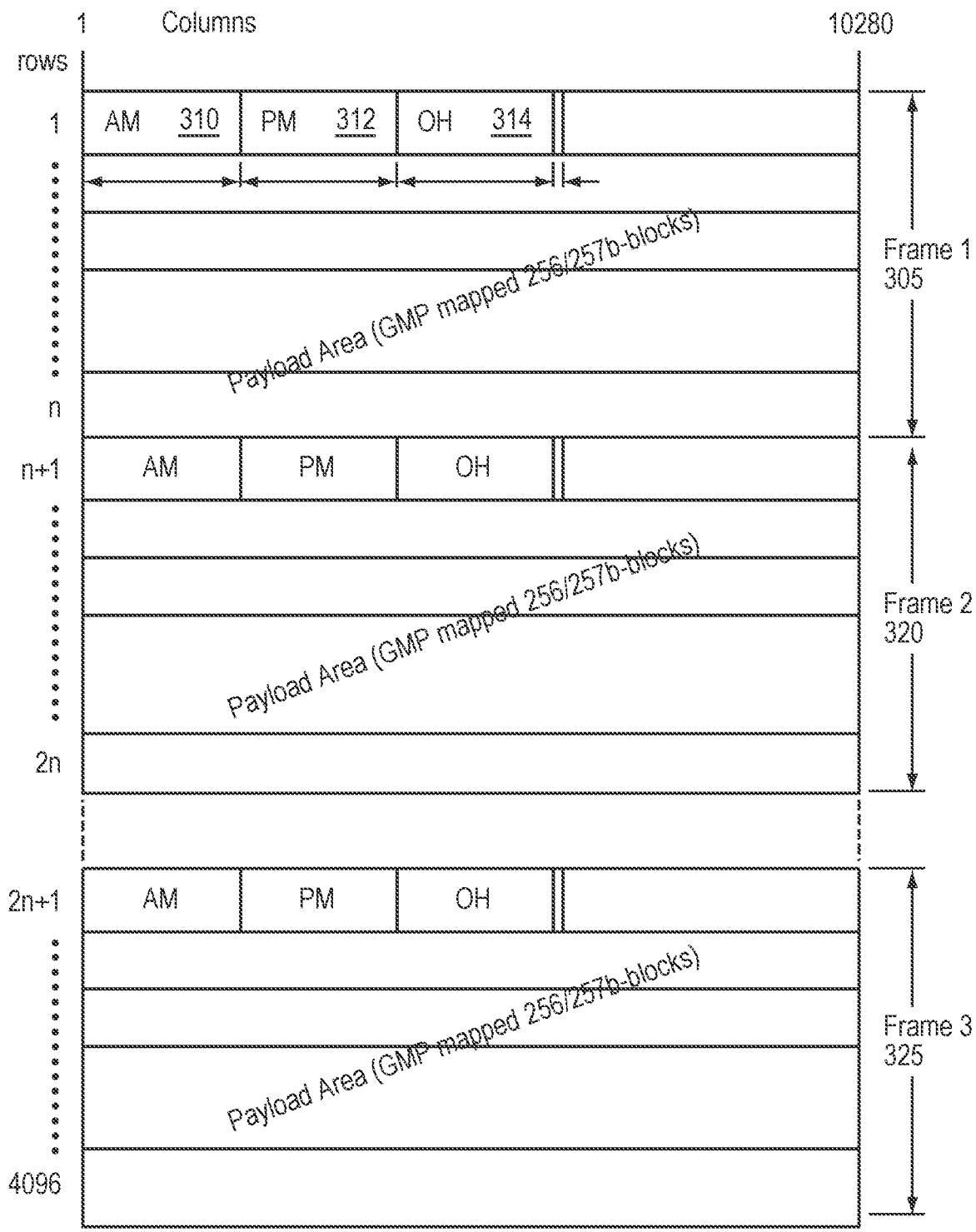
FIG. 3 is a simplified illustration of an oFrame frame and multi-frame structure, in accordance with an embodiment of the present disclosure.

Refer now to the example embodiment of FIG. 3, which illustrates a sample oFrame. In this embodiment, oFrame has 3 frames, frames 305, 320, and 325. Each frame has an AM, PM, and OH, such as AM 310, PM 312, and OH 314 of frame 305.

In certain embodiments, openFEC (also referred to herein as oFEC) may be a block code based FEC encoder and iterative soft decision (SD) decoder with a Net Coding Gain (NCG) of 11.6 dB @ $10^{-15}$ (16QAM) using 3 SD iterations (correction to $\leq 10^{-15}$ when pre-FEC BER$\leq$2.0 $e^{-2}$)

Figure 4:
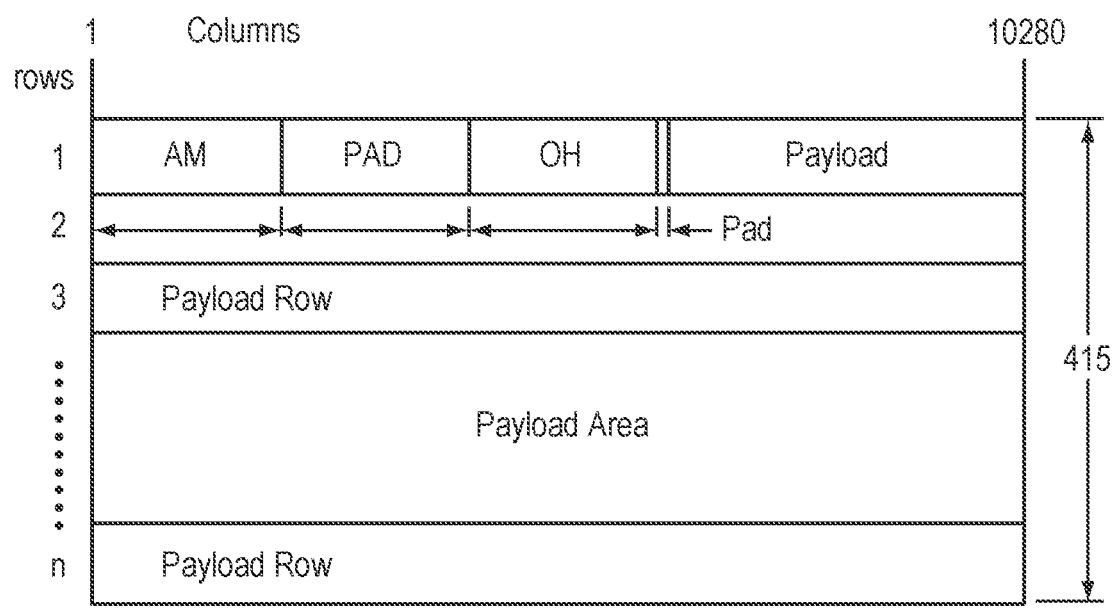
FIG. 4 is a simplified illustration of an oFrame, in accordance with an embodiment of the present disclosure.

Refer now to the example embodiment of FIG. 4, which illustrates a combination of an oFrame with oFEC. oFEC portion 415 represents added forward error correction data that has been added to an oFrame.

In certain embodiments, transmission order may be an order of transmission of information in diagrams in this IA is first from left to right and then from top to bottom unless explicitly called out as different. In certain embodiment, a most significant bit (bit 1) may be illustrated at the left in all the diagrams (e.g. Row 1, Column 1). In some embodiments, reserved bit(s) may be a value of a reserved bit or reserved bit for future standardization may be set to "0". In many embodiments, non-sourced bit(s) may be a value of any non-sourced bit may be read back as "0".

In some embodiments, a transponder may be a device enabling conversion of a digital signal to an optical signal. In certain embodiments, a muxponder may be a device that combines several digital signal sources into an optical signal. In most embodiments, a 200-400G Transponder/Muxponder may support multiple client types (e.g. Ethernet and OTN) operating over standards based physical links such as OTN of OTUCn (n=1 . . . 4) and FLEXOn (x=1 . . . 4). In most embodiments, a 200-400G Transponder/Muxponder may support multiple client types (e.g. Ethernet and OTN) operating over standards based physical links such as Ethernet 400GBASE-R, 200GBASE-R, and 100GBASE-R.

In certain embodiments, Clients or data sources may be expected to conform to existing protocol and container standards such as ITU-T G.709, and IEEE802.3 and operate over standard physical layer interface(s). In some embodiments, a client PMD, PMA, and lower PCS layers may be terminated and then mapped/multiplexed into a DSP oFRAME. In most embodiments, an oFEC may be applied followed by symbol mapping, polarization distribution and optical frame signaling. In certain embodiments, a DSP may hands symbol streams to a Photonic Interface.

In many embodiments, the following chart may map capacities of a link to transmission protocols.

TABLE 1

| Capacity | Mux Mode | 400GBE | 200GBE | 100GBE | FLEXO (400G) (OTUC4) | FLEXO (300G) (OTUC3) | FLEXO (200G) (OTUC2) |
|---|---|---|---|---|---|---|---|
| 400G | Transponder | 1 | | | | | |
| 400G | Transponder | | | 1 | | | |
| 300G | Transponder | | | | | 1 | |
| 200G | Transponder | | 1 | | | | |
| 200G | Transponder | | | | | | 1 |

In most embodiments, a 200-400G Muxponder may support aggregation of multiple clients of the same type up to its specified output bandwidth. In certain embodiments, it may not be required to mix client types.

In certain embodiments, the following tables shows example embodiments of various baseline client combinations although in other embodiments further combinations are possible.

TABLE 2 example embodiment of an OpenROADM3.0 Muxponder (MUXP) applications

| Capacity | Mux Mode | 400GBE | 200GBE | 100GBE | FLEXO (400G) (OTUC4) | FLEXO (300G) (OTUC3) | FLEXO (200G) (OTUC2) | OTUC1 |
|---|---|---|---|---|---|---|---|---|
| 400G | Muxponder | | 2 | | | | | |
| 400G | Muxponder | | | 4 | | | | |
| 400G | Muxponder | | | | | 1 | | 1 |
| 400G | Muxponder | | | | | | 2 | |
| 400G | Muxponder | | | | | | | 4 |
| 300G | Muxponder | | 1 | 1 | | | | |
| 300G | Muxponder | | | 3 | | | | |
| 300G | Muxponder | | | | | | 1 | 1 |
| 300G | Muxponder | | | | | | | 3 |
| 200G | Muxponder | | 1 | | | | | |
| 200G | Muxponder | | | 2 | | | | |
| 200G | Muxponder | | | | | | | 2 |

In certain embodiments, client frames may have a rate of 100G, 200G, 300G, 400G, or X00G, where X is an integer. In many embodiments, the following client flows may be multiplexed into the oFRAME 1) the ODUC1 from an OTLC.4(2) client port (OTUC1), FLEXO-SR client, or ODUCn, 2) the ODUCn from a bonded FLEXO-SR, 200G FLEXO-SR, 400G FLEXO-SR, or locally originated ODUCn with 100G ODU4 or 200/400G ODUflex with mapped 200G/400G Ethernet payload, 3) the FLEXO-SR from a FLEXO transponder flow (no OTUC OH processing), the ODU4 from an OTL4.4(2) client port (OTU4) or from the LO ODU4 mapper with mapped 100G Ethernet payload and the 100GE, 200GE, 400GE from an Ethernet client and are mapped via ODUflex.

TABLE 3

| client | client nominal bit rate | tolerance |
|---|---|---|
| ODUC1 | 239/226 * 99.5328 Gbit/s = 105.2581381 Gbit/s | ±20 ppm |
| ODUC2 | 2 * 239/226 * 99.5328 Gbit/s = 210.516276106 Gbit/s | ±20 ppm |
| ODUC3 | 3 * 239/226 * 99.5328 Gbit/s = 315.774414159 Gbit/s | ±20 ppm |
| ODUC4 | 4 * 239/226 * 99.5328 Gbit/s = 421.032552212 Gbit/s | ±20 ppm |
| FLEXO-SR | 256/241 * 239/226 * 514/544 * 99532800000 = 105643510782 Gbits/s | ±20 ppm |
| ODU4 | 239/227 × 99.5328 Gbit/s = 104.7944458 Gbit/s | ±20 ppm |
| 100GE | 16383/16384 * 257/256 * 100 Gbit/s = 100.384497 Gbit/s | ±20 ppm |
| 200GE | 20479/20480 * 257/256 * 200 Gbit/s = 200.771446 Gbit/s | ±20 ppm |
| 400GE | 20479/20480 * 257/256 * 400 Gbit/s = 401.542892 Gbit/s | ±20 ppm |

In certain embodiments, a client FLEXO-SR or ODUCn streams may be multiplexed into an oFRAME. In many embodiments, ODUCn streams may be gearboxed into 257-bit blocks. In certain embodiments, OIF 400ZR Implementation Agreement may define the process of multiplexing the 257-bit blocks.

In some embodiments, oFRAME payloads may be broken down into 257-bit blocks. In many embodiments, a number of 257-bit blocks may be the same in all rows of the frame accept the first row. In most embodiments, a first row may be shared with the frame overhead. Table 4 provides example embodiments for number of 257-bit payload blocks for various framing formats.

TABLE 4

| Server Mode | First Row Blocks | N Row Blocks | Number of 257-bit Blocks in 1 Frames | Number of 257-bit Blocks in 4 Frames |
|---|---|---|---|---|
| oFRAME-1 (100G) | 15 | 20 | 2555 | 10220 |
| oFRAME-2 (200G) | 30 | 40 | 5110 | 20440 |
| oFRAME-3 (300G) | 25 | 40 | 7665 | 30660 |
| oFRAME-4 (400G) | 20 | 40 | 10220 | 40880 |

Table 5 provides example embodiments for container rates for the various carrier frames before any FEC overhead is added.

TABLE 5

| Line framing | Line framing nominal bit rate | tolerance |
|---|---|---|
| oFRAME-1 (100G) | 1 * (239/225) * (512/511) * 99.5328 Gbit/s = 105.932852102 Gbits/s | ±20 ppm |
| oFRAME-2 (200G) | 2 * (239/225) * (512/511) * 99.5328 Gbit/s = 211.865704204 Gbits/s | ±20 ppm |
| oFRAME-3 (300G) | 3 * (239/225) * (512/511) * 99.5328 Gbit/s = 317.798556305 Gbits/s | ±20 ppm |
| oFRAME-4 (400G) | 4 * 239/225)*(512/511) * 99.5328 Gbit/s = 423.731408407 Gbits/s | ±20 ppm |

Table 6 provides example embodiments payload rates for the various carrier frames before any FEC overhead is added.

TABLE 6

| Line framing | Line framing nominal bit rate | tolerance |
|---|---|---|
| oFRAME-1 (100G) | 1* (239/225) * 99.5328 Gbit/s = 105.725952000 Gbits/s | ±20 ppm |
| oFRAME-2 (200G) | 2 * (239/225) * 99.5328 Gbit/s = 211.451904000 Gbits/s | ±20 ppm |
| oFRAME-3 (300G) | 3 * (239/225) * 99.5328 Gbit/s = 317.177856000 Gbits/s | ±20 ppm |
| oFRAME-4 (400G) | 4 * (239/225) * 99.5328 Gbit/s = 422.903808000 Gbits/s | ±20 ppm |

In some embodiments, 200GBASE-R, 400GBASE-R, 400ZR and oFRAME frames may have similar structures. In most embodiments, frames may have block formats, 10280 columns×n rows (e.g. 11×4096, 16×256, 32×128, etc.). In certain embodiments, Alignment Markers (AM), Padding (PAD) and OverHead (OH) may be inserted in a first row of each oFRAME. In many embodiments, an oFRAME payload and overhead area may be protected with an open Forward Error Correction Algorithm (oFEC).

In certain embodiments, an oFRAME AM field may be partitioned as n×480b (n×60 Byte) blocks. In most embodiments, a role of the AM may be to find the oFEC block boundary. In many embodiments, an alignment marker field may carried at the beginning of each frame ($1^{st}$ row), and may be protected by the oFEC and its value is scrambled. In most embodiments, AM alignment may be processed post FEC decode (after descrambling) to locate the row number corresponding to the start of the oFRAME (oFEC being already row aligned). In certain embodiments, AM may be specific to oFRAME interface and oFEC alignment.

In some embodiments, for 100GE, 200GE, and 400GE clients with either KR4 FEC (Clause 91) or KP4 FEC (Clause 119) alignment markers carried in the client signal(s) may be terminated/generated at a client interface PCS. In many embodiments, following the AM field may be n×480b PAD area, defined as all-Zero's. In some embodiments, an oFRAME OH area may be partitioned as n×320b (n×40 byte) blocks.

Figure 5:
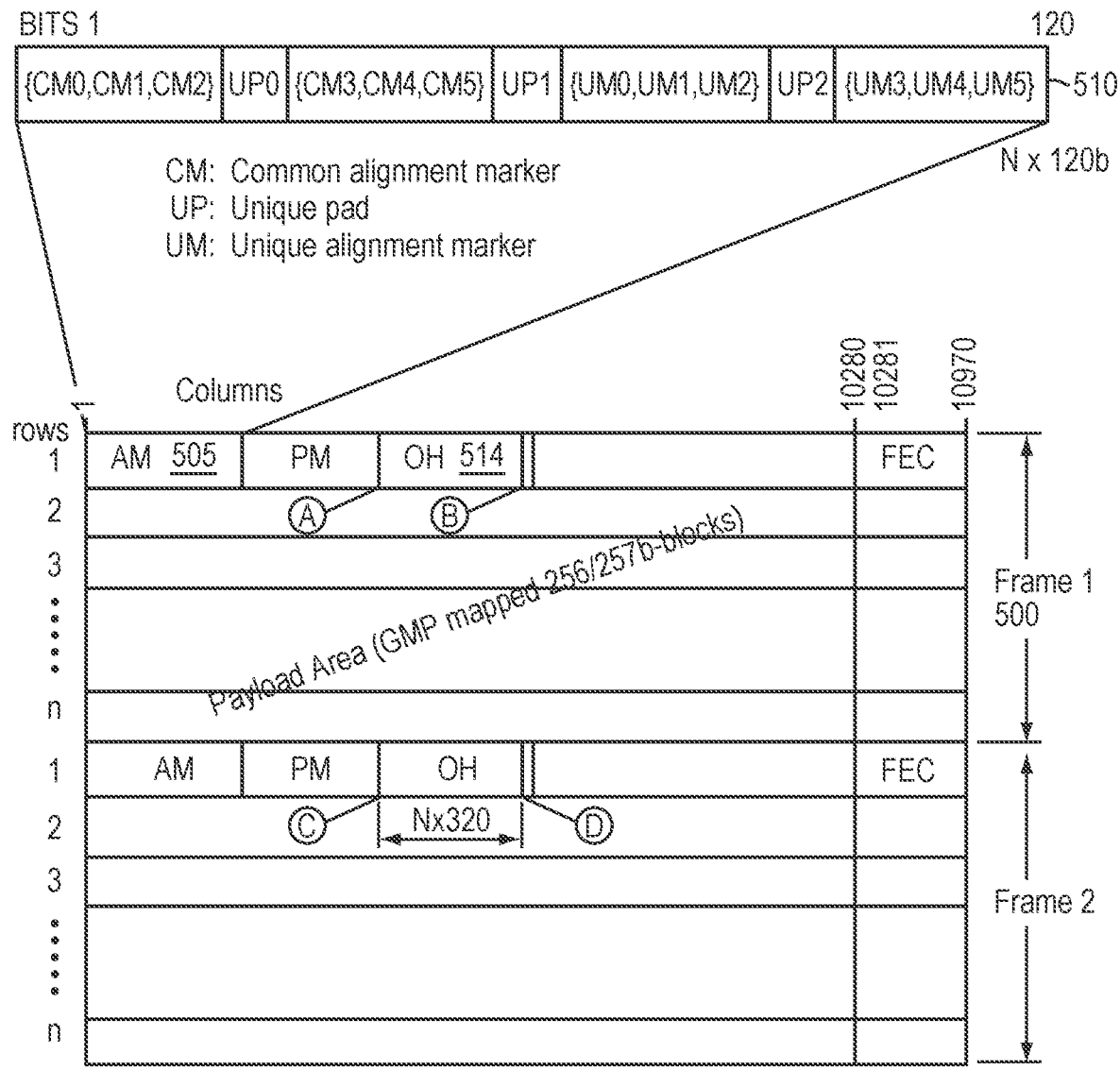
FIG. 5 is an illustration of an oFrame overhead, in accordance with an embodiment of the present disclosure.
Figure 5:
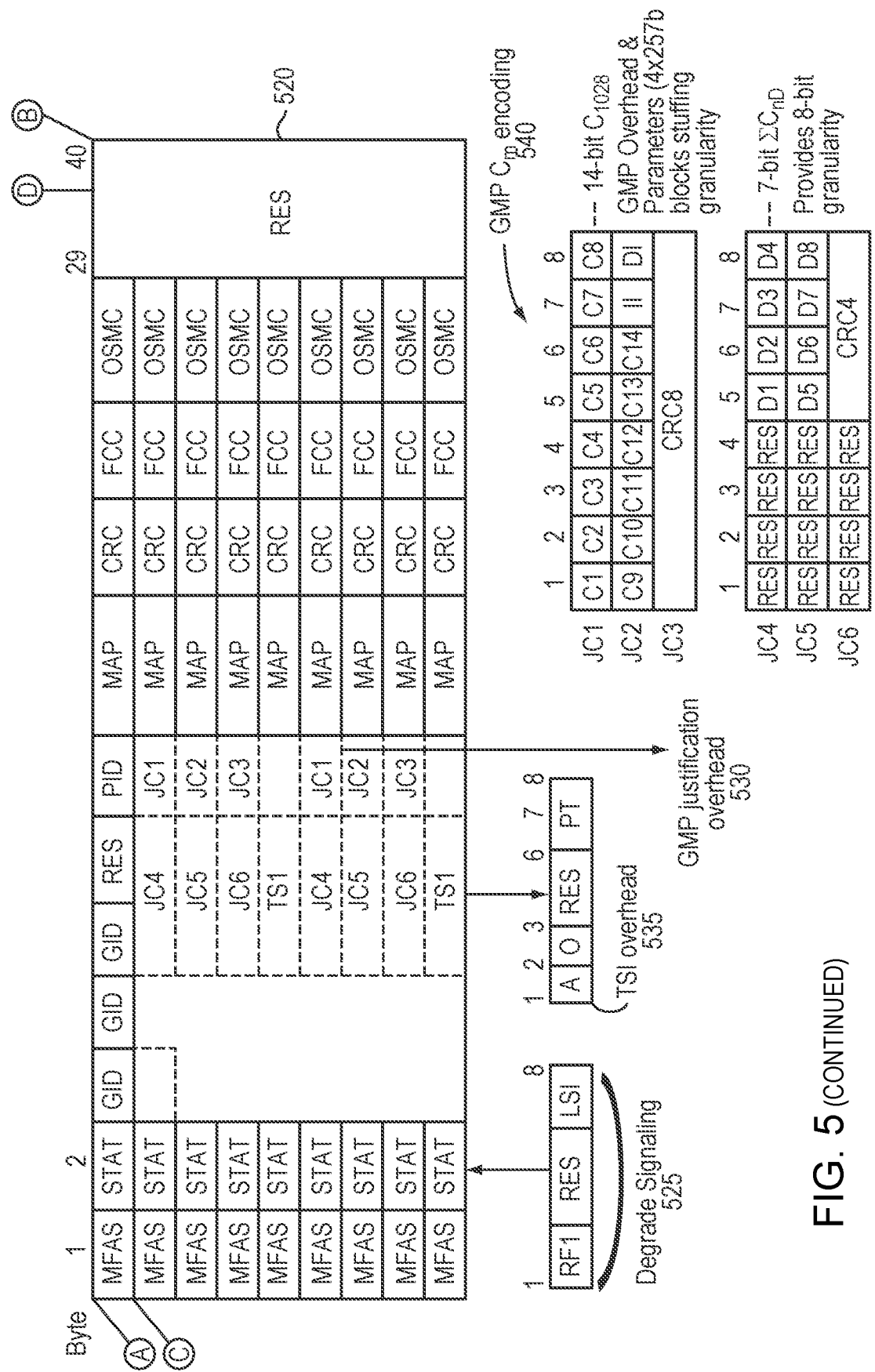

Refer now to the example embodiment of FIG. 5, which illustrates overhead associates with an oFrame. oFrame 500 has AM 505, expanded out as AM 510, and OH 514 expanded out as OH 520. OH 520 has degrade signaling 525, GMP justification overhead 530, TSI Overhead 535, and GMP C encoding 540. In FIG. 5, OH requirements in black text are required and are option in greyed out text.

In many embodiments, an oFRAME OH area may include up to 4 sets of GMP mapping bytes (one per 100G tributary). In certain embodiments, an oFRAME OH may provide additional OAM, or just be set to default value and ignored at the oFRAME receiver. In certain embodiments, an additional n×5b PAD may follow an oFRAME OH to provide 257b block alignment within and across the oFRAME-n rows.

In many embodiments, an oFRAME may use a same overhead definition as defined in G.709.1 for FLEXO-SR. In other embodiments, an oFRAME may add additional fields for Multiplex Structure Identifier (MSI) and GMP JC1-JC6.

Table 7 provides example embodiments of oFec overhead.

TABLE 7

| | Overhead Bytes | | | | | | | | | | |
|---|---|---|---|---|---|---|---|---|---|---|---|
| | 1 | 2 | 3 | 4 | 5 | 6 | 7-10 | 11-12 | 13-26 | 27-28 | 29-40 |
| 0 | MFAS | STAT | GID | GID | GID   RES | PIP | MAP | CRC | FCC | OSMC | RES |
| 1 | MFAS | STAT | AVAIL | | JC4 | JC1 | MAP | CRC | FCC | OSMC | RES |
| 2 | MFAS | STAT | | | JC5 | JC2 | MAP | CRC | FCC | OSMC | RES |
| 3 | MFAS | STAT | | | JC6 | JC3 | MAP | CRC | FCC | OSMC | RES |
| 4 | MFAS | STAT | | | MSI | | MAP | CRC | FCC | OSMC | RES |
| 5 | MFAS | STAT | | | JC4 | JC1 | MAP | CRC | FCC | OSMC | RES |
| 6 | MFAS | STAT | | | JCS | JC2 | MAP | CRC | FCC | OSMC | RES |
| 7 | MFAS | STAT | | | JC6 | JC3 | MAP | CRC | FCC | OSMC | RES |

In a particular embodiment an oFRAME-4 (400G) may have a 400G frame containing 256 rows×10280 bits, an AM area that contains 16 lanes of 120-bit alignment markers (1920b), a PAD area that contains 4 blocks of 480 bits (1920b), an OH area that contains 4 blocks of 320 bits (1280b), an additional PAD between OH and payload that is 20 bits, and 20 257-bit blocks of framing and 10220 257 bit blocks of payload in the frame.

Figure 6:
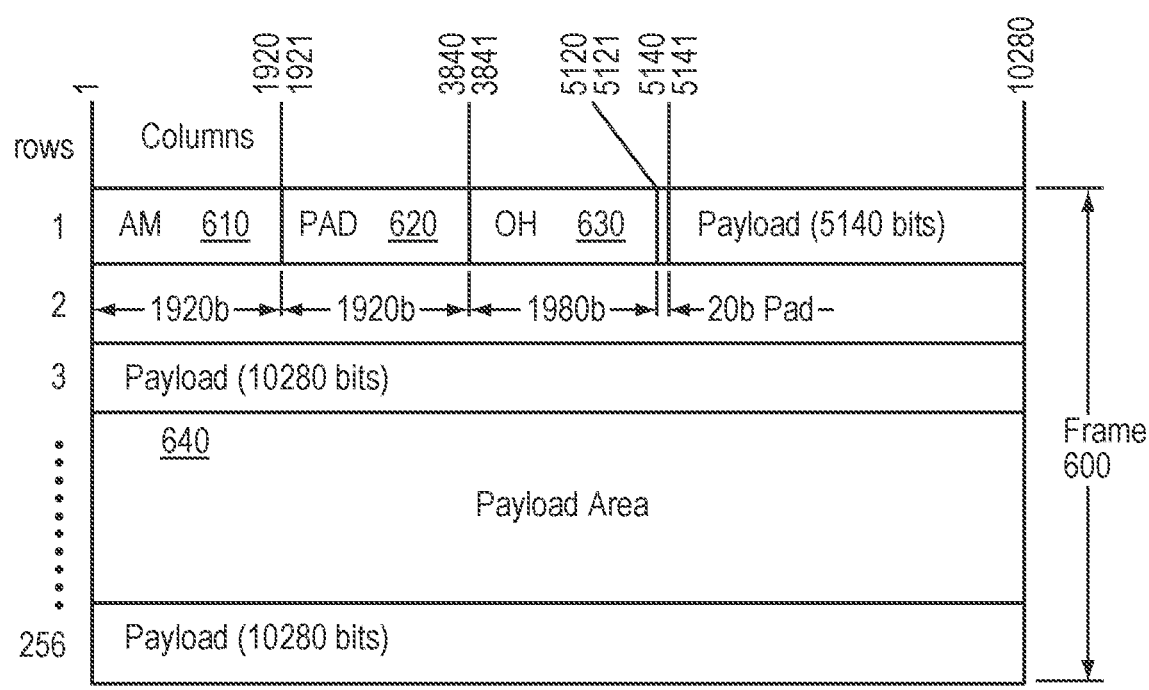
FIG. 6 is a simplified illustration of an oFrame-4, in accordance with an embodiment of the present disclosure.

Refer now to the example embodiment of FIG. 6. In this example embodiment, a 400G oFRAME (oFRAME-4) structure is shown in the example embodiment of Error!

Reference source not found. and contains a frame alignment marker sequence (AM 610), padding (PAD 620), and overhead area (OH630) every 256 rows. Columns are defined as 1-bit wide and a frame consists of 10280 columns. In total there are 2,631,680 bits. A frame is partitioned into 100G tributary slots supporting 1×400G, 2×200G, or 4×100G clients. oFrame 600 has payload area 640.

In many embodiments, an oFRAME-4 may also support mixed rate clients (e.g. 1×200G plus 2×200G, or 1×300G plus 1×100G). In most embodiments, an oFRAME-4 payload area may be partitioned into Tributary Slots (.ts).

In some embodiments, each tributary slot may be assigned as follows: 1) 4 100G tributaries numbered T1, T2, T3, and T4, 2) 10220 257-block locations are numbered 1 through 10220, ordered left to right, top to bottom in oFRAME-4 frame view, 3) each tributary is assigned 2555 257-bit blocks 4) T1 consumes locations 1, 5, 9, ..., 10217, 5) T2 consumes locations 2, 6, 10, ..., 10218, 6) T3 consumes locations 3, 7, 11, ..., 10219, 7) T4 consumes locations 4, 8, 12, ..., 10220, and 8) Simple round-robin ordering.

In some embodiments, an oFRAME-4 overhead (OH) area may be partitioned as 4×320b (4×40 Byte) fields starting at bit position 3841 to 5120 in the first row. In some embodiments, an OH area may include GMP mapping information. In certain embodiments, OH fields may be numbered OH1, OH2, OH3, OH4 ordered left to right in oFRAME-4 view where T1 uses OH1, T2 uses OH2, T3 uses OH3, and T4 uses OH4.

In some embodiments, there may be 4×257-bit GMP stuffing locations where each 4×257-bit stuffing block divided into 4 stuffing locations numbered S1 through S4, ordered left to right in oFRAME-4 view. In certain embodiments, each tributary may be assigned 1 257-bit block of stuffing where T1 may use S, T2 may use S2, T3 may use S3, and T4 may use S4. In some embodiments, a stuffing location may be by CM value of each OH. In certain embodiments, every 4×257 bit stuffing location may have mix of data and stuff when multiplexing is in play.

In many embodiments, an oFRAME-4 pad (PAD) areas may contain 4×480b blocks (1920b total) of consecutive zeros starting at bit 1921 in the first row to bit 3840 plus 20b of additional pad location starting at bit 5121 to 5140. The 20b padding is for 257b payload alignment.

In some embodiments, an oFRAME-4 4×100G Data Multiplexing may combine 4 100G clients numbered CL1, CL2, CL3, CL4, where each client may be assigned one tributary and one corresponding overhead field, and a GMP for each client may be stored in the assigned overhead.

Figure 7:
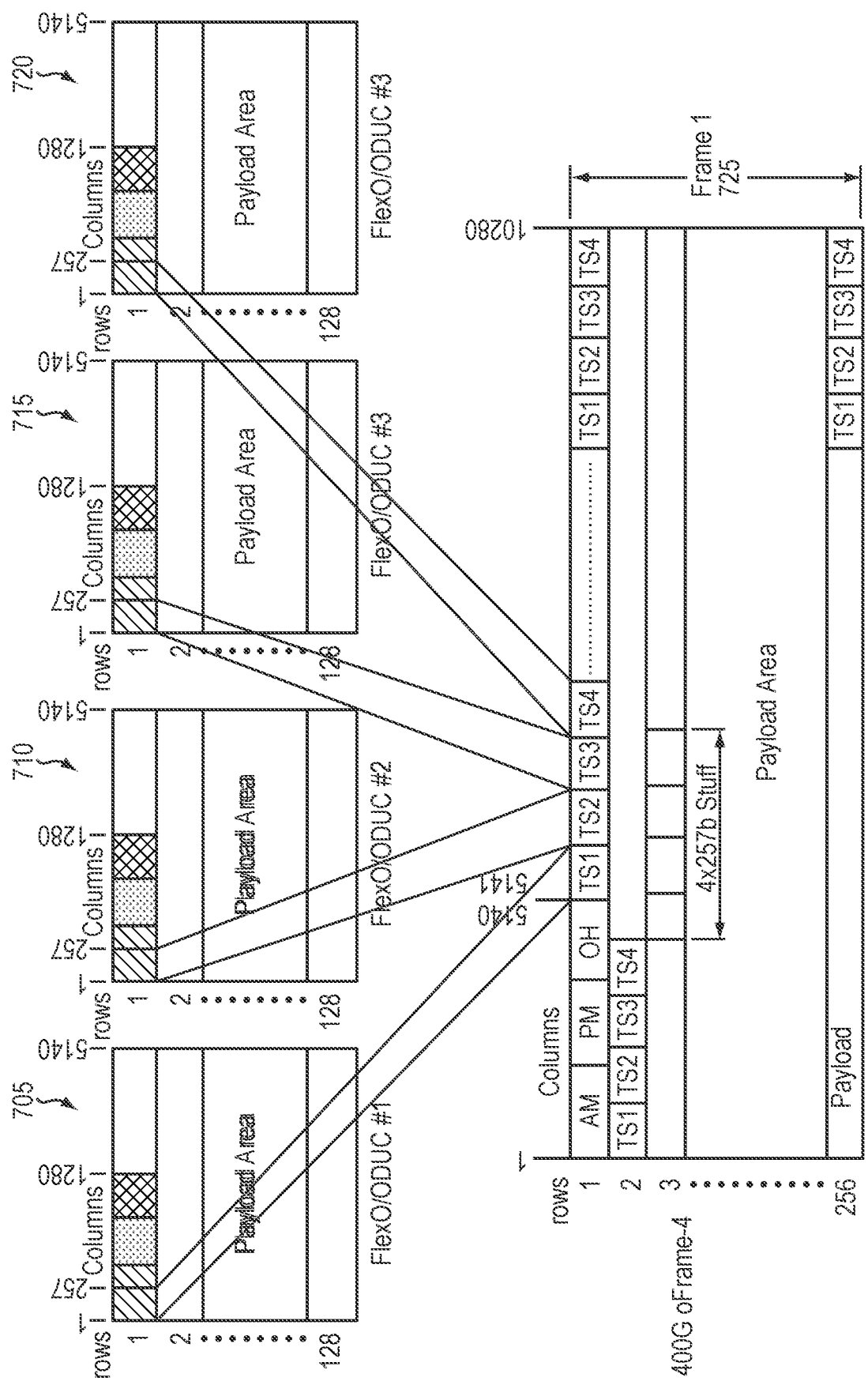
FIG. 7 is a simplified illustration of an oFrame-4 with 4×100G clients, in accordance with an embodiment of the present disclosure.

Refer now to the example embodiment of FIG. 7, which shows 4×100G FLEXO clients mapped into oFRAME-4. 100G FLEXO clients 705, 710, 715, and 720 are mapped into oFRAME-4 725.

In certain embodiments, an oFRAME-4 2×200G Data Multiplexing may combine 2 200G clients numbered CL1, CL2, where each client assigned two tributaries and two corresponding overhead, where tributaries assigned to clients need not be consecutive but data is ordered with first data in time assigned to lower ordinal tributary, and an GMP for the client may be stored in the overhead with the lowest ordinal number.

Figure 8:
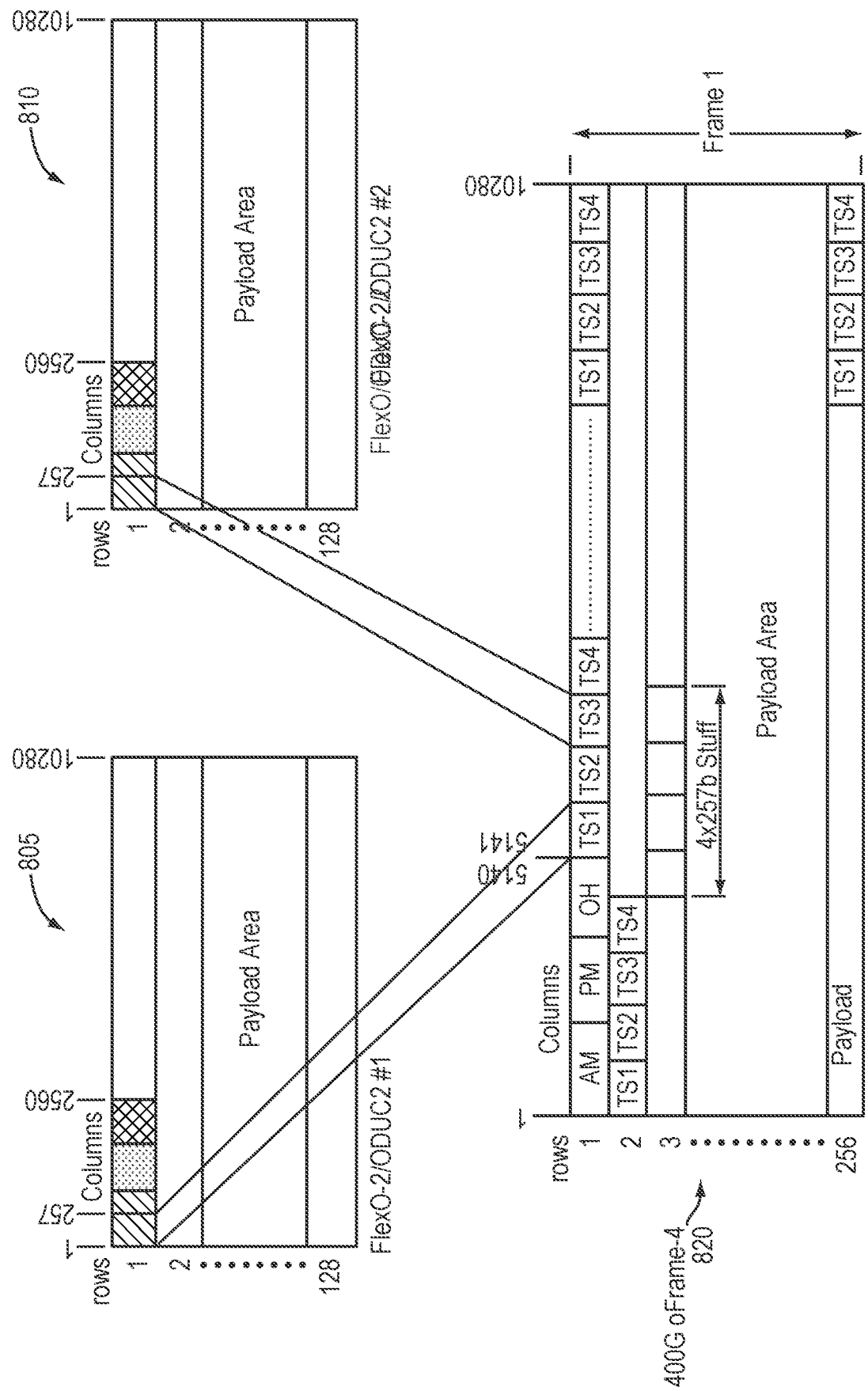
FIG. 8 is a simplified illustration of an oFrame-4 with 2×200G clients, in accordance with an embodiment of the present disclosure.

Refer now to the example embodiment of FIG. 8, which shows 2×200G FLEXO-2 clients mapped into oFRAME-4. In the example embodiment of FIG. 8, 200G FLEXO 805 and 200G FLEXO 810 are mapped into oFrame-4 820.

In many embodiments, an oFRAME-4 1×300G plus 1×100G Data Multiplexing may combine 1 300G client numbered CL1 or CL2 and 1 100G client numbered CL1 or CL2. In certain embodiments, an oFRAME-4 1×300G plus 1×100G Data Multiplexing may have a 300G client assigned three tributaries and three corresponding overhead. In some embodiments, an oFRAME-4 1×300G plus 1×100G Data Multiplexing may have a 100G client assigned one tributary and one corresponding overhead. In particular embodiments, tributaries assigned to 300G client need not be consecutive but data may be ordered with first data in time assigned to lower ordinal tributary. In many embodiments, an oFRAME-4 1×300G plus 1×100G Data Multiplexing may have a GMP for a client stored in the overhead with the lowest ordinal number.

Figure 9:
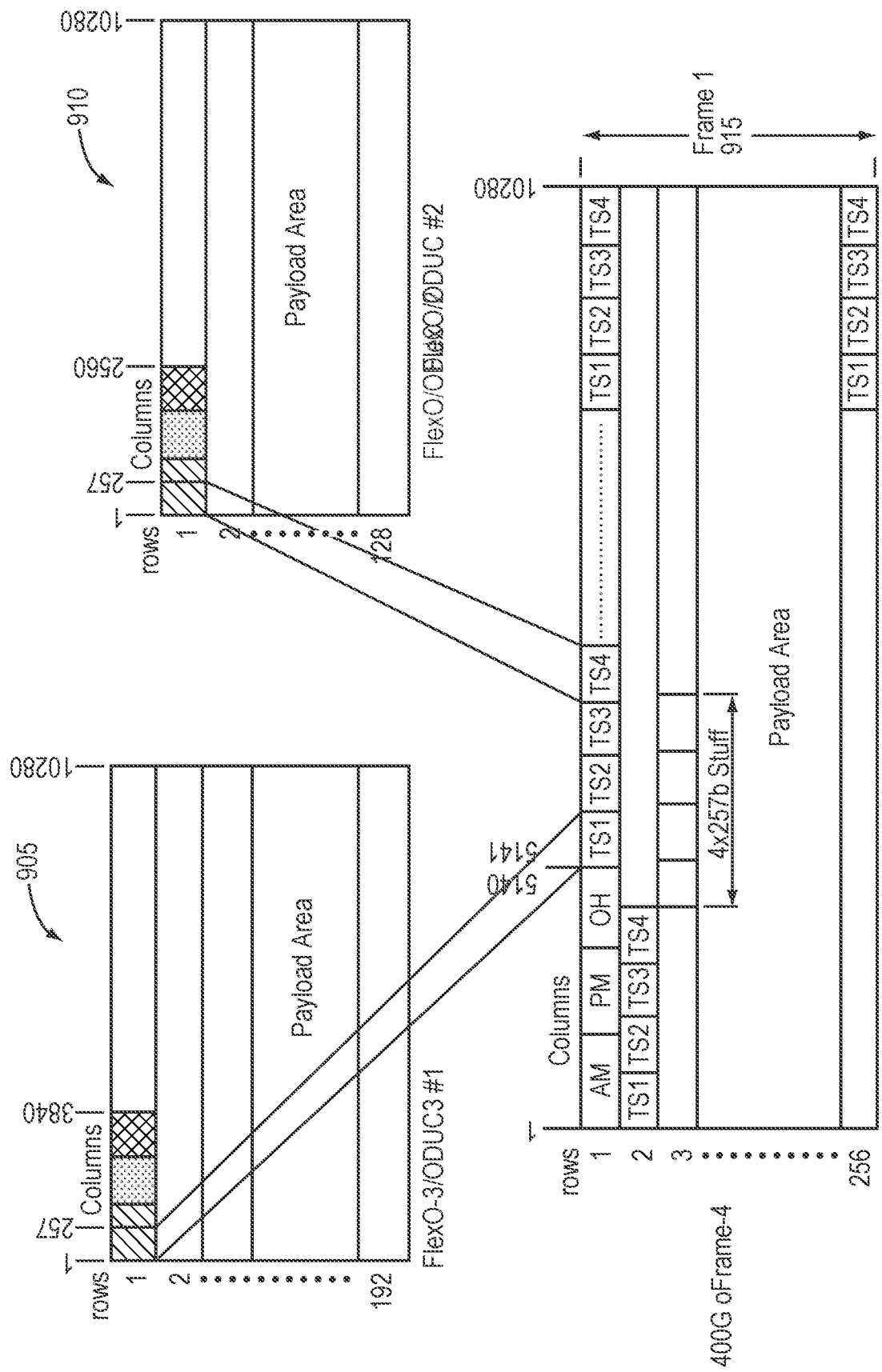
FIG. 9 is a simplified illustration of an oFrame-4 with 1×300G Client plus 1×100G Client, in accordance with an embodiment of the present disclosure

Refer now to the example embodiment of FIG. 9, which shows 1×300G FlexO-3 client plus 1×100G FlexO mapped into an oFRAME-4. 300G FlexO-3 client 905 and 100G FlexO 910 are mapped into oFrame-4 915.

In some embodiments, an oFRAME-4 1×400G Data Multiplexing (400G Transponder) may have a single 400G client numbered CL1, where the 400G client is assigned all four tributaries and all four corresponding overhead fields and a GMP for the 400G client is stored in the overhead with the lowest ordinal number (OH1).

Figure 10:
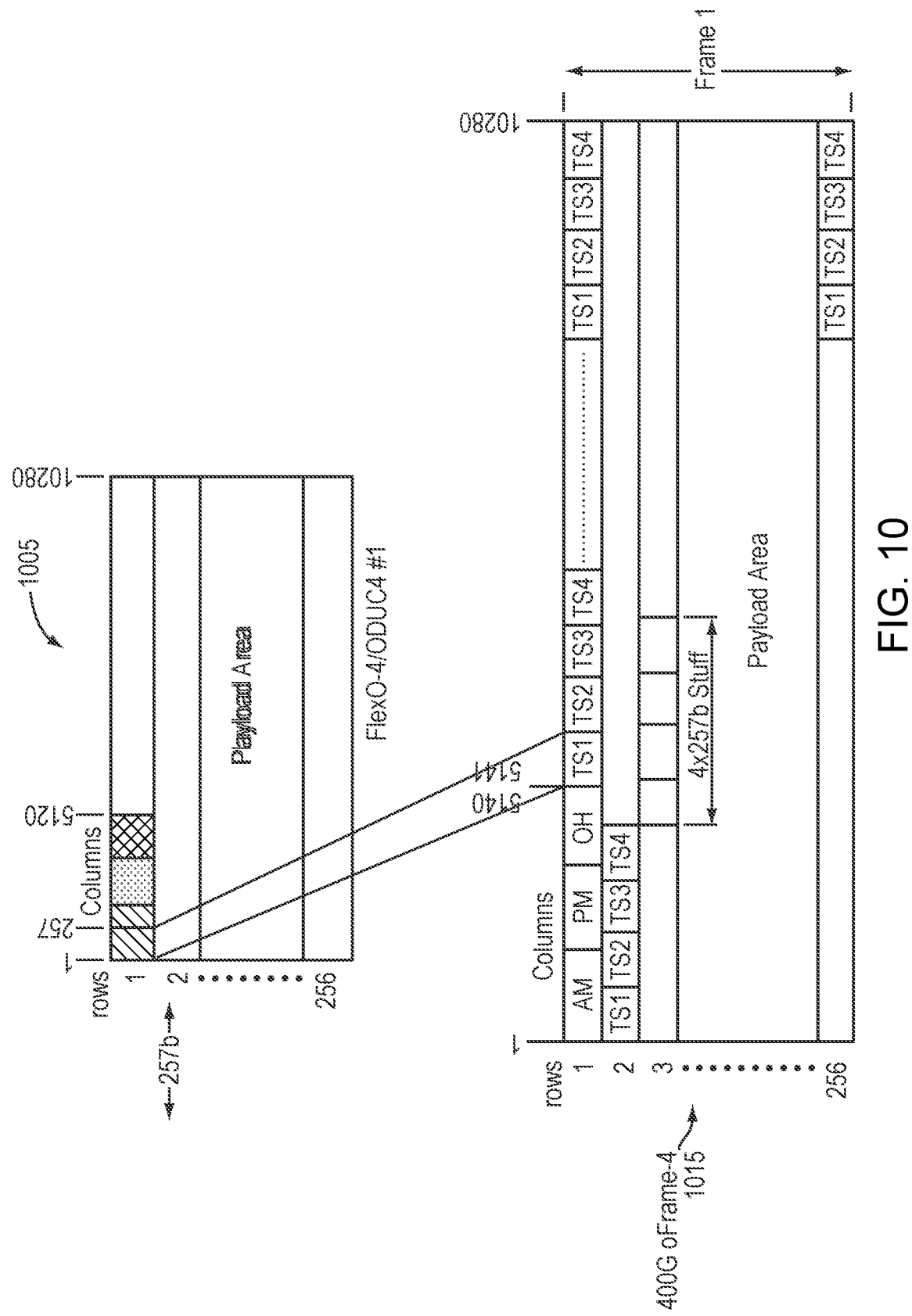
FIG. 10 is a simplified illustration of an oFrame-4 with 1×400G client (Transponder), in accordance with an embodiment of the present disclosure.
Figure 11:
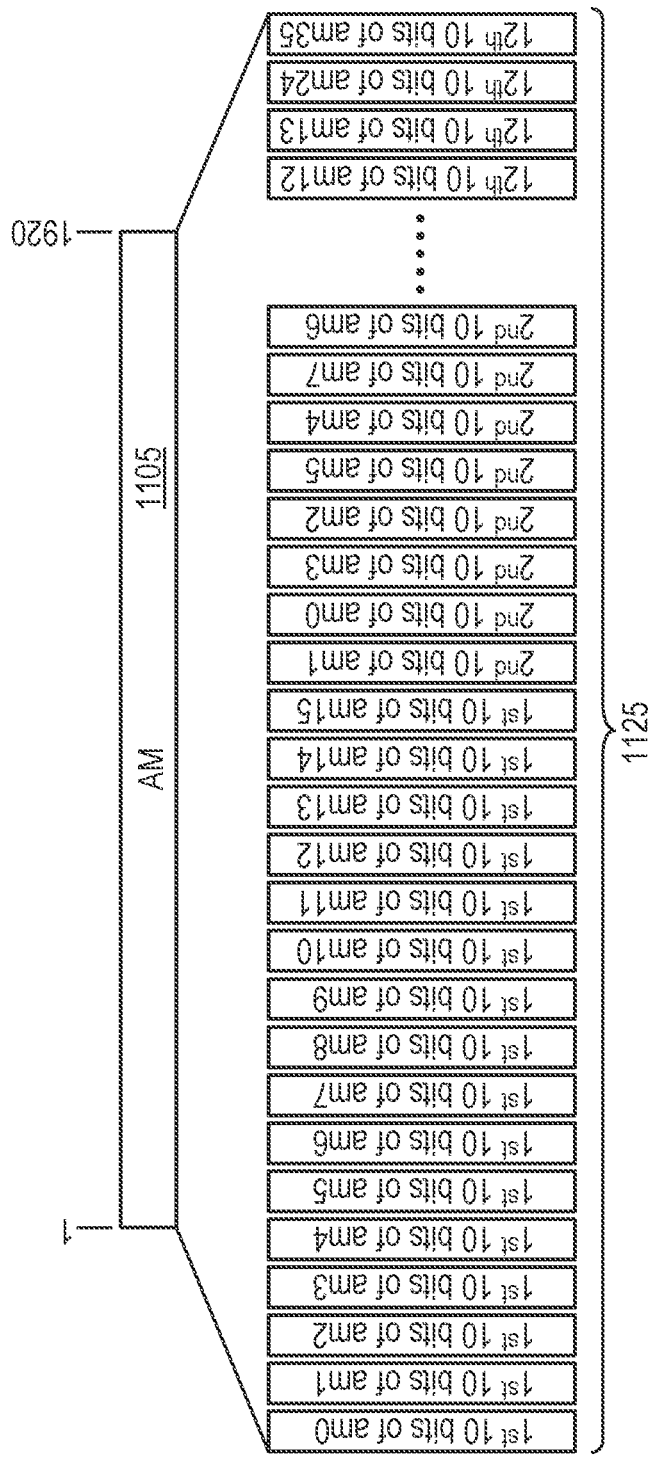
FIG. 11 is a simplified illustration an oFrame-4 AM Transmission order—10b interleaved, in accordance with an embodiment of the present disclosure.

Refer now to the example embodiment of FIG. 10, which shows 1×400G FlexO-4 client mapped into an oFRAME-4. FlexO-4 1005 is mapped into oFrame-4 1015. Refer now to the example embodiment of FIG. 11, which illustrates an oFrame-4 AM Transmission order—10b interleaved. In the example embodiment of FIG. 11, Alignment marker 1105 are expanded as alignment markers 1125.

Figure 12:
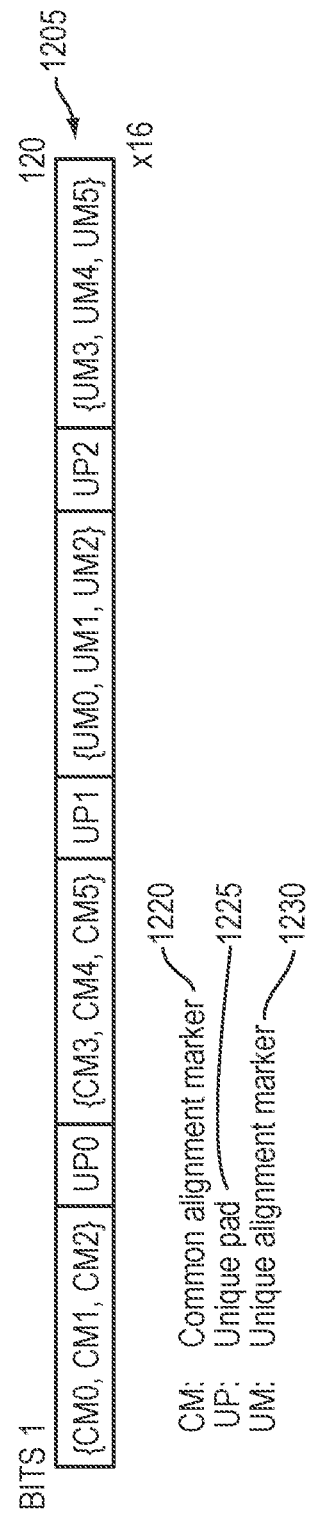
FIG. 12 is a simplified illustration of an oFrame-4 Alignment Marker Format, in accordance with an embodiment of the present disclosure.

In many embodiments, an oFRAME-4 structure may carry 5140 bits of AM/PAD/OH+20b additional PAD. In some embodiments, a transmission order for each of these fields may be 10-bit interleaved which is the same as with IEEE 802.3bs and 400G FlexO-4. In many embodiments, an oFRAME-4 AM field may consist of 16 logical lanes (ami, i=0, 1 ... 15). In most embodiments, each lane of an oFrame may carry a 120-bit lane alignment marker. Refer now to FIG. 12 and rows of Table 8, which give example values of ami transmitted over lane i. In the example embodiment of FIG. 12, bits 1205 have common alignment marker 1220, unique pad 1225, and unique alignment marker 1230.

TABLE 8 example embodiment of an oFRAME-4 alignment marker encodings

| Logical Lane am<i> | Encoding$^a$ {CM$_0$,CM$_1$,CM$_2$,UP$_0$,CM$_3$,CM$_4$,CM$_5$,UP$_1$,UM$_0$,UM$_1$,UM$_2$,UP$_2$,UM$_3$,UM$_4$,UM$_5$} |
|---|---|
| 0 | 0x9A,0x4A,0x26,0xB6,0x65,0xB5,0xD9,0xD9,0x01,0x71,0xF3,0x26,0xFE,0x8E,0x0C |
| 1 | 0x9A,0x4A,0x26,0x04,0x65,0xB5,0xD9,0x67,0x5A,0xDE,0x7E,0x98,0xA5,0x21,0x81 |
| 2 | 0x9A,0x4A,0x26,0x46,0x65,0xB5,0xD9,0xFE,0x3E,0xF3,0x56,0x01,0xC1,0x0C,0xA9 |
| 3 | 0x9A,0x4A,0x26,0x5A,0x65,0xB5,0xD9,0x84,0x86,0x80,0xD0,0x7B40x79,0x7F,0x2F |
| 4 | 0x9A,0x4A,0x26,0xE1,0x65,0xB5,0xD9,0x19,0x2A,0x51,0xF2,0xE6,0xD5,0xAE,0x0D |

TABLE 8-continued example embodiment of an oFRAME-4 alignment marker encodings

| Logical Lane am<i> | Encoding$^a$ {CM$_0$,CM$_1$,CM$_2$,UP$_0$,CM$_3$,CM$_4$,CM$_5$,UP$_1$,UM$_0$,UM$_1$,UM$_2$,UP$_2$,UM$_3$,UM$_4$,UM$_5$} |
|---|---|
| 5 | 0x9A,0x4A,0x26,0xF2,0x65,0xB5,0xD9,0x4E,0x12,0x4F,0xD1,0xB1,0xED,0xB0,0x2E |
| 6 | 0x9A,0x4A,0x26,0x3D,0x65,0xB5,0xD9,0xEE,0x42,0x9C,0xA1,0x11,0xBD,0x63,0x5E |
| 7 | 0x9A,0x4A,0x26,0x22,0x65,0xB5,0xD9,0x32,0xD6,0x76,0x5B,0xCD,0x29,0x89,0xA4 |
| 8 | 0x9A,0x4A,0x26,0x60,0x65,0xB5,0xD9,0x9F,0xE1,0x73,0x75,0x60,0x1E,0x8C,0x8A |
| 9 | 0x9A,0x4A,0x26,0x6B40x65,0xB5,0xD9,0xA2,0x71,0xC4,0x3C,0x5D,0x8E,0x3B,0xC3 |
| 10 | 0x9A,0x4A,0x26,0xFA,0x65,0xB5,0xD9,0x04,0x95,0xEB,0xD8,0xFB,0x6A,0x14,0x27 |
| 11 | 0x9A,0x4A,0x26,0x6C,0x65,0xB5,0xD9,0x71,0x22,0x66,0x38,0x8E,0xDD,0x99,0xC7 |
| 12 | 0x9A,0x4A,0x26,0x18,0x65,0xB5,0xD9,0x5B40xA2,0xF6,0x95,0xA4,0x5D,0x09,0x6A |
| 13 | 0x9A,0x4A,0x26,0x14,0x65,0xB5,0xD9,0xCC,0x31,0x97,0xC3,0x33,0xCE,0x68,0x3C |
| 14 | 0x9A,0x4A,0x26,0xD0,0x65,0xB5,0xD9,0xB1,0xCA,0xFB,0xA6,0x4E,0x35,0x04,0x59 |
| 15 | 0x9A,0x4A,0x26,0xB4,0x65,0xB5,0xD9,0x56,0xA6,0xBA,0x79,0xA9,0x59,0x45,0x86 |

In certain embodiments, following a 1920 bit AM field in an oFrame may be 1920 bits of all-Zero's PAD. In most embodiments, 1280 bits of 10b interleaved OH may be transmitted after the 1920 bits of PAD in an oFrame. Refer now to the example embodiment of FIG. 13, which represents an oFRAME-4 PAD Transmission Order—10b interleaved. In FIG. 13, there is PAD 1305.

In certain embodiments, an oFRAME-3 (300G) may have a 300G frame contain 192 rows×10280 bits, an AM area contains 12 lanes of 120 bits alignment markers (1440b), a PAD area contains 3 blocks of 480 bits (1440b), an OH area contains 3 blocks of 320 bits (960b), additional PAD between OH and payload is 15 bits. In certain oFrame-3 there may be 15 257-bit blocks of framing and 7665 257 bit blocks of payload in the frame. Refer now to the example embodiment of FIG. 14, which illustrates an oFRAME-4 OH Transmission Order—10b interleaved. In the example embodiment of FIG. 14, OH 1405 is represented by OH 1425.

Figure 15:
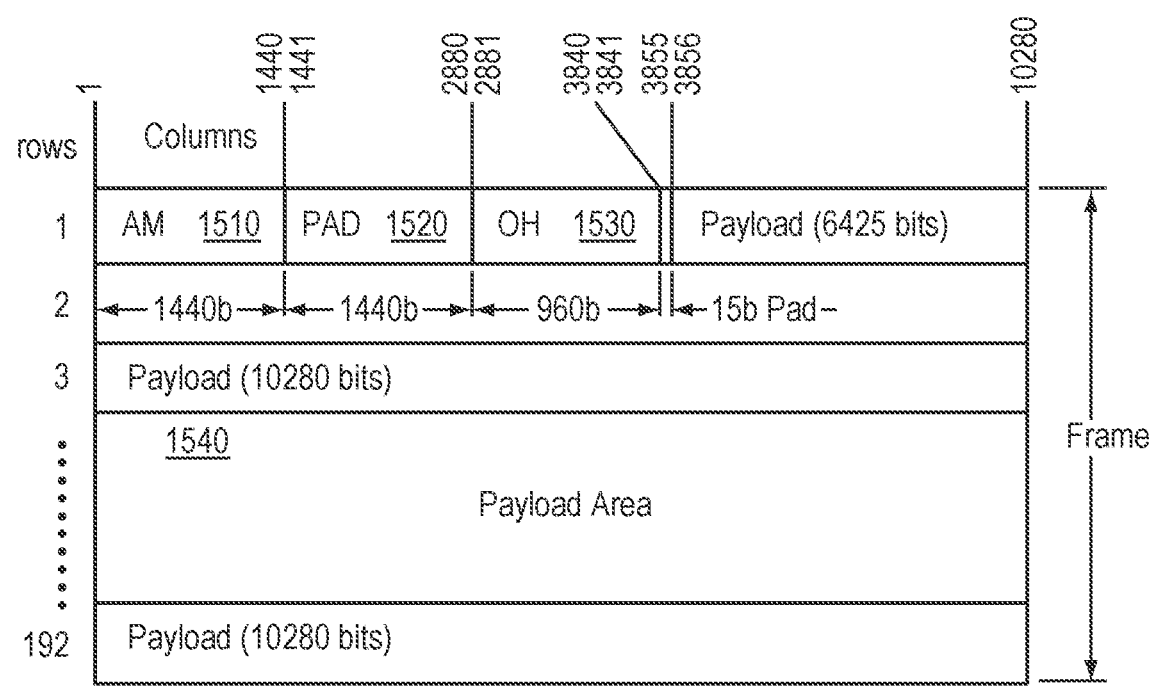
FIG. 15 is a simplified illustration of an oFrame-3, in accordance with an embodiment of the present disclosure.

Refer now to the example embodiment of FIG. 15, which illustrates an example embodiment of a 300G oFRAME (oFRAME-3) structure, which contains a frame alignment marker sequence, padding, and overhead area every 192 rows. In this embodiment, columns are defined as 1-bit wide and a frame consists of 10280 columns. In total there are 1,973,760 bits. In this embodiment, the frame is partitioned into 100G tributary slots supporting 1×300G, or 3×100G clients. In this example embodiment there is AM 1510, PAD 1520, OH 1530, and payload 1540.

Figure 16:
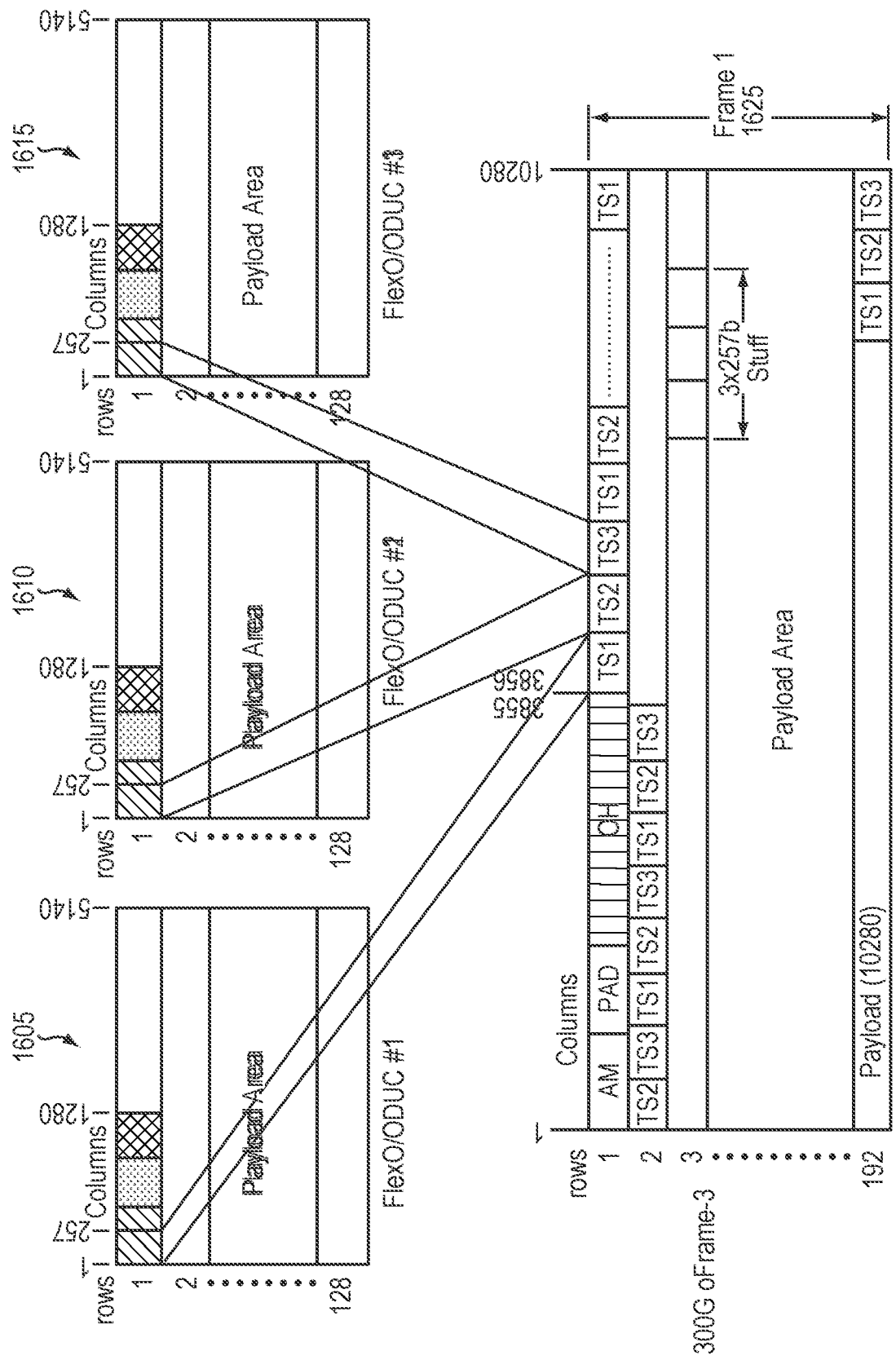
FIG. 16 is a simplified illustration of an oFRAME-3 with 3×100G Clients, in accordance with an embodiment of the present disclosure.

Refer now to the example embodiment of FIG. 16, which represents an oFRAME-3 with 3×100G Client. In FIG. 16, 100G Clients, 1605, 1610, and 1615 are mapped into oFrame 1625.

In many embodiments, an oFRAME-3 can also support mixed rate clients (e.g. 1×200G plus 1×100G). In most embodiments, an oFRAME-3 payload area may be partitioned into Tributary Slots (.ts). In many embodiments, each tributary slot may be assigned as follows 3 100G tributaries numbered T1, T2, and T3, 7665 257-block locations are numbered 1 through 7665, ordered left to right, top to bottom in oFRAME-3 frame view, where each tributary may be assigned 2555 257-bit blocks, T1 consumes locations 1, 4, 7, . . . , 7663, T2 consumes locations 2, 5, 8, . . . , 7664, T3 consumes locations 3, 6, 9, . . . , 7665, and round-robin ordering may be used.

In certain embodiments, oFRAME-3 overhead (OH) area may be partitioned as 3×320 bits (3×40 Byte) fields starting at bit position 2881 to 3840 in the first row. In some embodiments, OH area may include GMP mapping information. In certain embodiments, OH fields may be numbered OH1, OH2, and OH3, ordered left to right in oFRAME-3 view, T1 may use OH1, T2 may use OH2, and T3 may use OH3. In some embodiments, an oFrame-3 may have 3×257 bit GMP stuffing locations, where each 3×257-bit stuffing block may be divided into 3 stuffing locations numbered S1 through S3, ordered left to right in oFRAME-3 view.

In certain embodiments, an oFrame 3 may have tributaries and each tributary may have assigned 1 257-bit block of stuffing, where T1 may use S, T2 may use S2, T3 may use S3. In some embodiments, a stuffing location may be defined by CM value of each OH. In many embodiments, every 3×257 bit stuffing location may have mix of data and stuff when multiplexing is in play.

In some embodiments, an oFRAME-3 pad (PAD) areas may contains 3×480b blocks (1440b total) of consecutive zeros starting at bit 1441 in the first row to bit 2880, plus 15b of additional pad location starting at bit 3841 to 3855. In certain embodiments, a 15b padding may be for 257 bit payload alignment.

In certain embodiments, an oFRAME-3 3×100G with data multiplexing may have 3 100G clients numbered CL1, CL2, CL3, where each client may be assigned one tributary and one corresponding overhead field, and the GMP for the client may be stored in the assigned overhead. Refer now to FIG. 7 shows, which is an example embodiment of 3×100G FLEXO clients mapped into an oFRAME-3.

Figure 17:
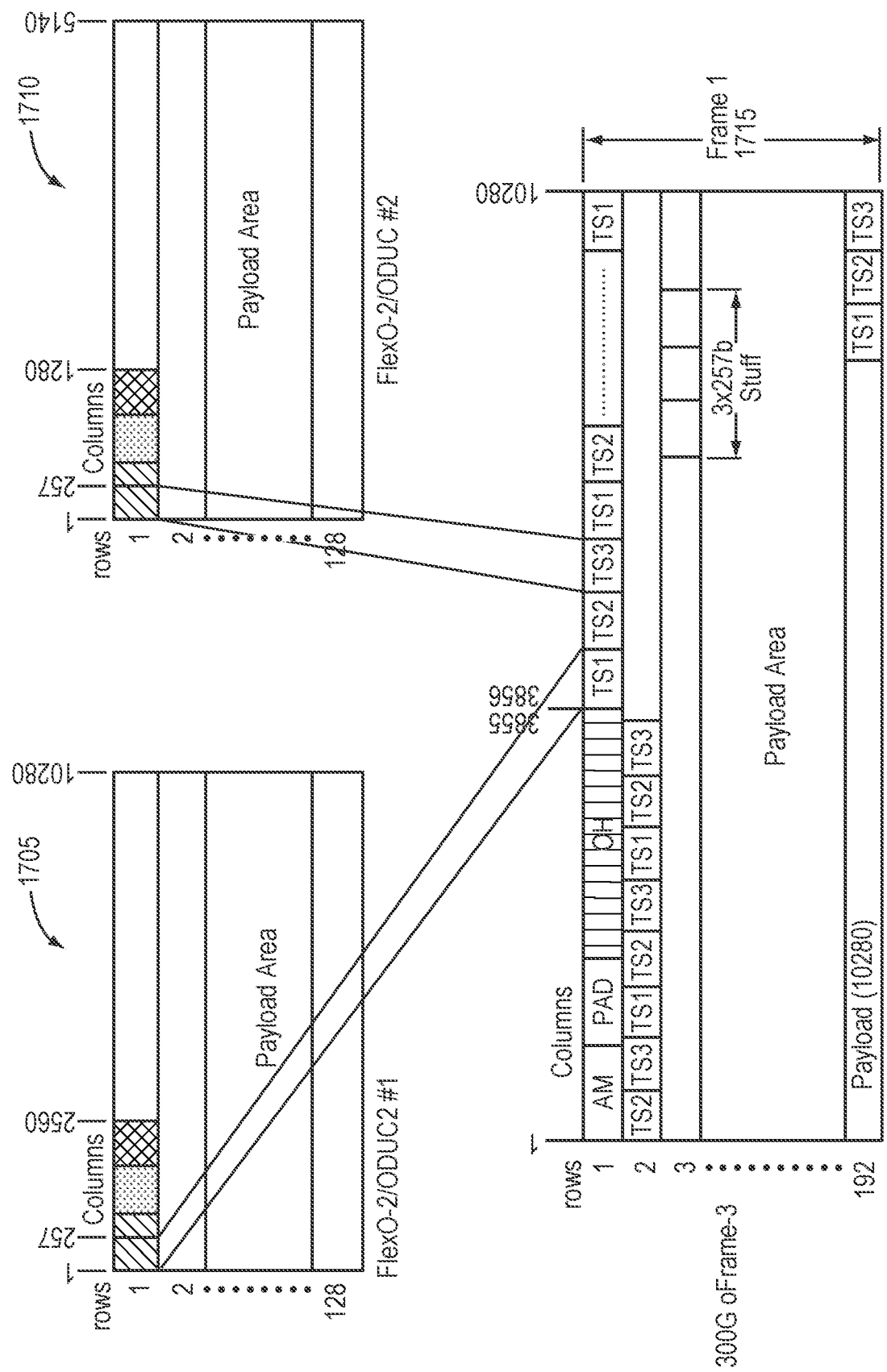
FIG. 17 is a simplified illustration an oFRAME-3 with 1×200G Client plus 1×100G Client, in accordance with an embodiment of the present disclosure.

In some embodiments, an oFRAME-3 may have 1×200G plus 1×100G multiplexing the data from the clients. Refer now to the example embodiment of FIG. 17, which illustrates an oFRAME-3 with 1×200G Client plus 1×100G Client mapped into the oFrame. FlexO 200 1705 and FlexO 100 1710 are mapped into oFrame 1715.

In a particular example, an oFrame 3 may have 1 200G client numbered CL or CL2 and 1 100G client numbered CL1 or CL2. In certain embodiments, an oFrame-3 may have an 200G client assigned two tributaries and two corresponding overhead and a 100G client assigned one tributary and one corresponding overhead. In certain embodiments, tributaries assigned to 200G client may need not be consecutive but data may be ordered with first data in time assigned to lower ordinal tributary. In certain embodiments, a GMP for a client may be stored in an overhead with the lowest ordinal number. Refer now to the example embodiment of FIG. 9, which shows an example embodiment of an 1×200G FlexO-2 client plus 1×100G FlexO mapped into an oFRAME-3.

Figure 18:
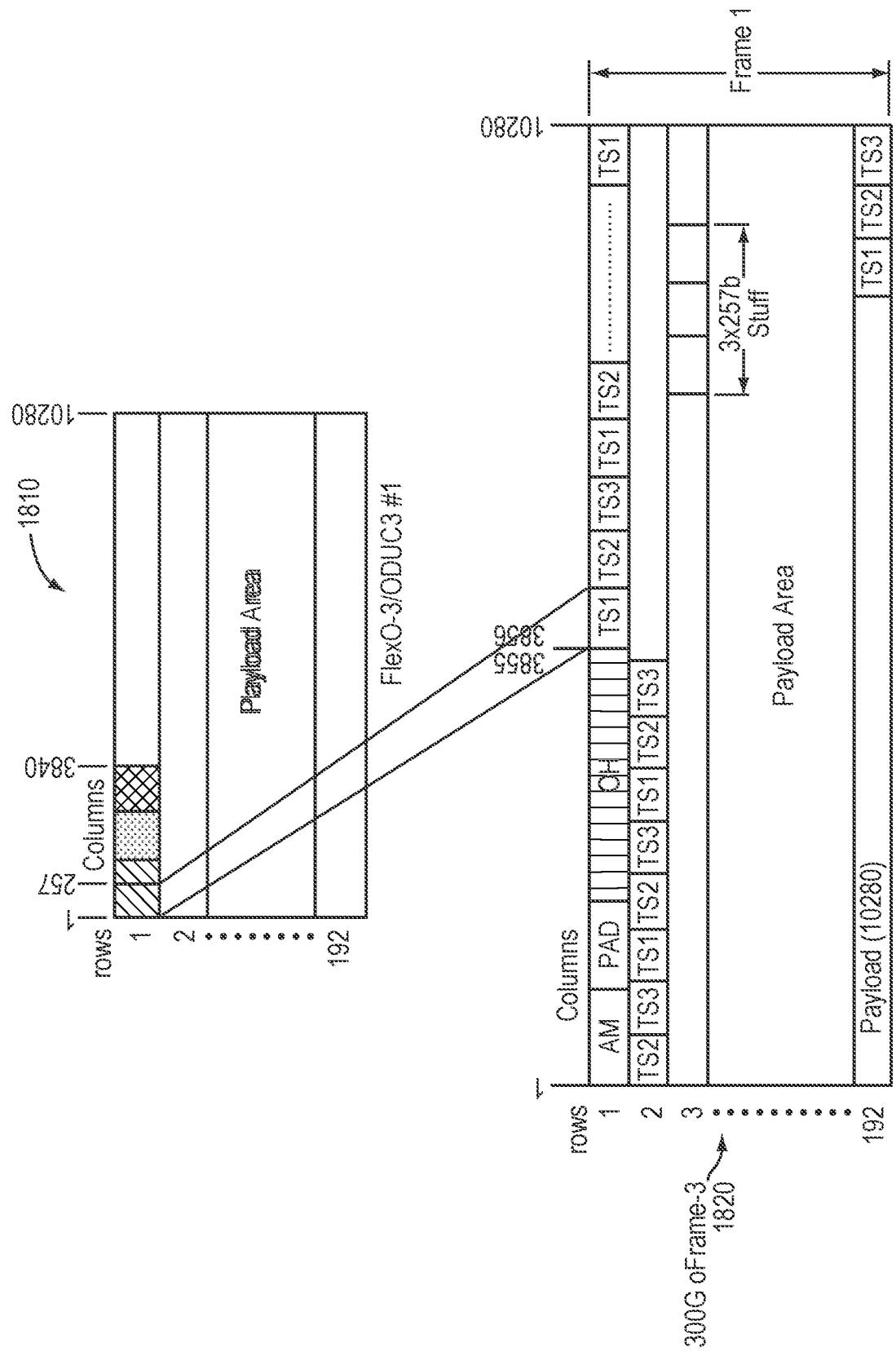
FIG. 18 is a simplified illustration of an oFrame-3 an oFRAME-3 with 1×300G client (Transponder), in accordance with an embodiment of the present disclosure.

In some embodiments, an oFRAME-3 may have one 1×300G client, which is three tributaries and three corresponding overhead fields. Refer now to the example embodiment of FIG. 18, which illustrates an oFRAME-3 with 1×300G client (Transponder). In this example embodiment, FlexO 300G is mapped into oFrame 3 1820.

In certain embodiments, a GMP for a client may be stored in an overhead with a lowest ordinal number (OH1). Refer now to the example embodiment of FIG. 10, which illustrates a 1×300G FlexO-3 client mapped into an oFRAME-3. In some embodiments, an oFRAME-3 structure may carry 3840 bits of AM/PAD/OH+15b additional PAD. In most embodiments, a transmission order for each of these fields may be 10-bit interleaved which is the same as 300G FlexO-3.

Figure 19:
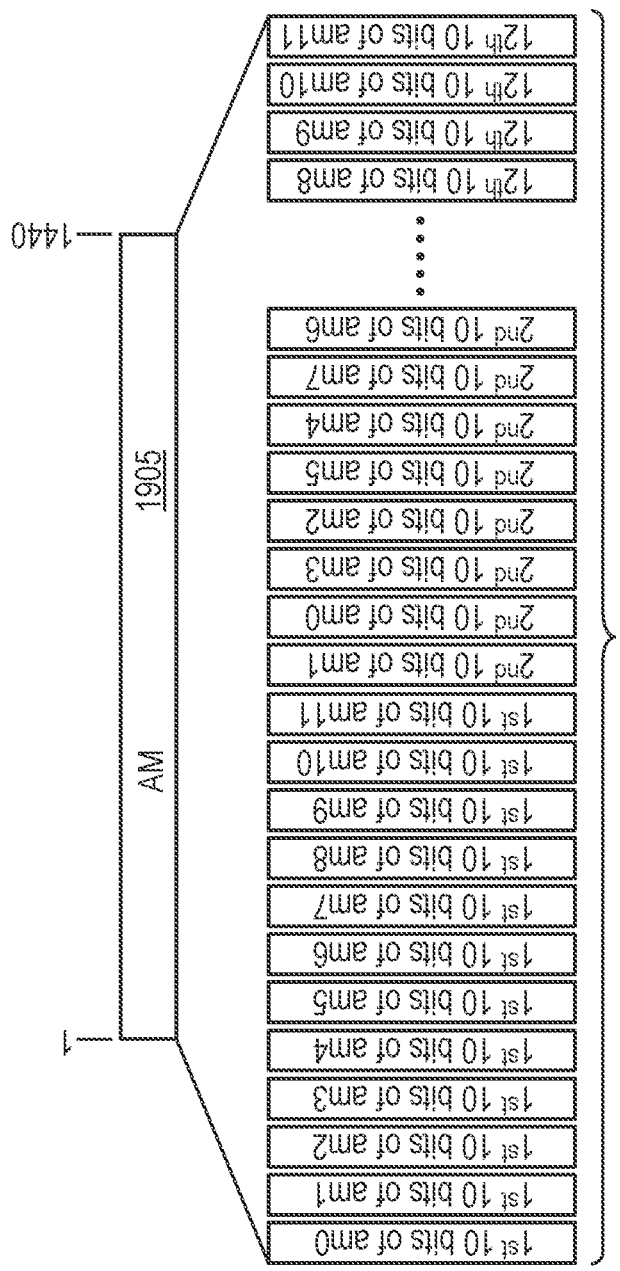
FIG. 19 is a simplified illustration of an oFRAME-3 AM Transmission order—10b interleaved, in accordance with an embodiment of the present disclosure.
Figure 20:
FIG. 20 is a simplified illustration of an oFRAME-3 Alignment Marker Format, in accordance with an embodiment of the present disclosure.

In some embodiments, an oFRAME-3 AM field may consists of 12 logical lanes (ami, i=0, 1 . . . 11). In certain embodiments, each lane may carry a 120-bit lane alignment marker. Refer now to the example embodiment of FIG. 12 and rows of the examples of Table 8 gives the values of ami transmitted over lane i. Refer now to the example embodiment of FIG. 19, which illustrates an oFRAME-3 AM Transmission order—10b interleaved. In FIG. 19, alignment markers 1905 are shown as alignment markers 1925. Refer now to the example embodiment of FIG. 20, which represents an oFRAME-3 Alignment Marker Format. Alignment marker 2005 has common alignment marker 2020, unique pad, 2025, and unique alignment marker 2030.

Figure 23:
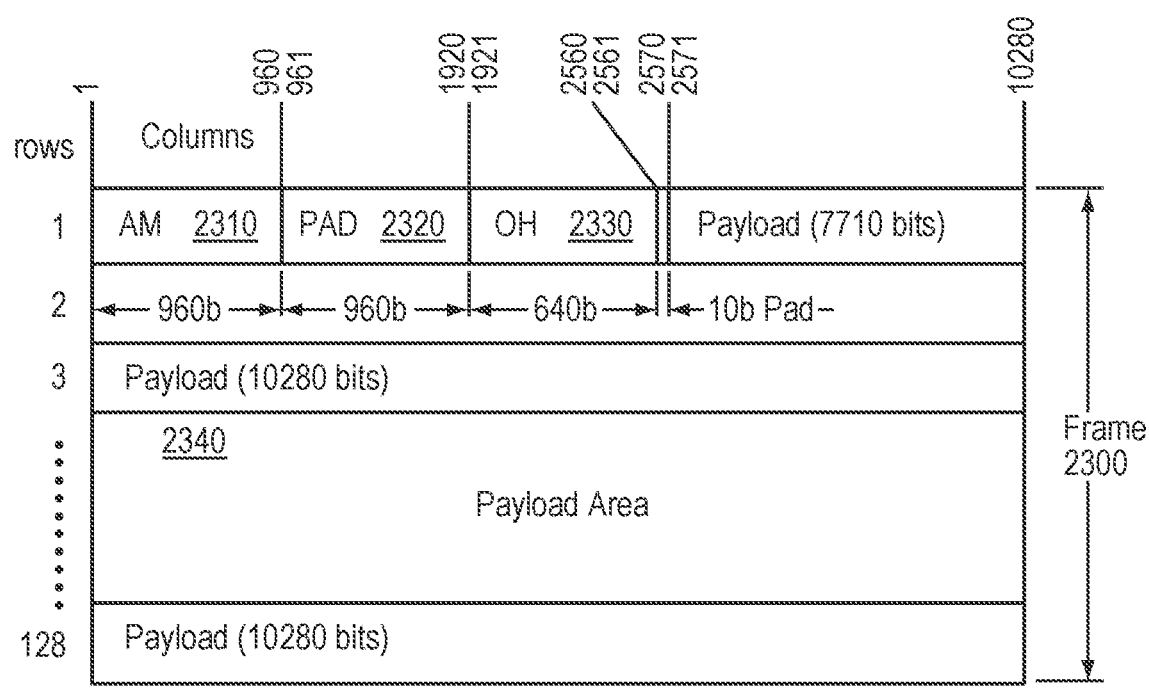
FIG. 23 is a simplified illustration of an oFrame-2, in accordance with an embodiment of the present disclosure.

Refer now to the example embodiment of FIG. 23, which illustrates an example embodiment of a 200G oFRAME (oFRAME-2). In this embodiment, the oFrame contains a frame alignment marker sequence, padding, and overhead area every 128 rows. Columns are defined as 1-bit wide and a frame consists of 10280 columns. In total in this embodiment, there are 1,315,840 bits. A frame is partitioned into 100G tributary slots supporting 1×200G, or 2×100G clients. oFrame 2300 has AM 2310, PAD 2320, and OH 2330.

In certain embodiments, an oFRAME-2 payload area may be partitioned into Tributary Slots (.ts). In some embodiments, each tributary slot may be assigned as follows 2 100G tributaries numbered T, and T2, 5110 257-block locations may be numbered 1 through 5110, ordered left to right, top to bottom in oFRAME-2 frame view, each tributary assigned 2555 257-bit blocks, where T1 consumes locations 1, 3, 5, . . . , 5109, T2 consumes locations 2, 4, 6, . . . , 5110, and round robin ordering is used.

In some embodiments, an oFRAME-2 overhead (OH) area may be partitioned as 2×320b (2×40 Byte) fields starting at bit position 1921 to 2560 in the first row. In many embodiments, an OH area includes GMP mapping information. In certain embodiments, OH fields may be numbered OH1, and OH2, ordered left to right in oFRAME-2 view, where, T1 uses OH1 and T2 uses OH2. In some embodiments, there may be 2×257-bit GMP stuffing locations, where each 2×257-bit stuffing block may be divided into 2 stuffing locations numbered S1 through S2, ordered left to

TABLE 9 example embodiment of an oFRAME-3 alignment marker encodings

Logical
Lane   Encoding$^a$
am<i>   {CM$_0$,CM$_1$,CM$_2$,UP$_0$,CM$_3$,CM$_4$,CM$_5$,UP$_1$,UM$_0$,UM$_1$,UM$_2$,UP$_2$,UM$_3$,UM$_4$,UM$_5$}

| | |
|---|---|
| 0  | 0x9A,0x4A,0x26,0xB6,0x65,0xB5,0xD9,0xD9,0x01,0x71,0xF3,0x26,0xFE,0x8E,0x0C |
| 1  | 0x9A,0x4A,0x26,0x04,0x65,0xB5,0xD9,0x67,0x5A,0xDE,0x7E,0x98,0xA5,0x21,0x81 |
| 2  | 0x9A,0x4A,0x26,0x46,0x65,0xB5,0xD9,0xFE,0x3E,0xF3,0x56,0x01,0xC1,0x0C,0xA9 |
| 3  | 0x9A,0x4A,0x26,0x5A,0x65,0xB5,0xD9,0x84,0x86,0x80,0xD0,0x7B,0x79,0x7F,0x2F |
| 4  | 0x9A,0x4A,0x26,0xE1,0x65,0xB5,0xD9,0x19,0x2A,0x51,0xF2,0xE6,0xD5,0xAE,0x0D |
| 5  | 0x9A,0x4A,0x26,0xF2,0x65,0xB5,0xD9,0x4E,0x12,0x4F,0xD1,0xB1,0xED,0xB0,0x2E |
| 6  | 0x9A,0x4A,0x26,0x3D,0x65,0xB5,0xD9,0xEE,0x42,0x9C,0xA1,0x11,0xBD,0x63,0x5E |
| 7  | 0x9A,0x4A,0x26,0x22,0x65,0xB5,0xD9,0x32,0xD6,0x76,0x5B,0xCD,0x29,0x89,0xA4 |
| 8  | 0x9A,0x4A,0x26,0x60,0x65,0xB5,0xD9,0x9F,0xE1,0x73,0x75,0x60,0x1E,0x8C,0x8A |
| 9  | 0x9A,0x4A,0x26,0x6B,0x65,0xB5,0xD9,0xA2,0x71,0xC4,0x3C,0x5D,0x8E,0x3B,0xC3 |
| 10 | 0x9A,0x4A,0x26,0xFA,0x65,0xB5,0xD9,0x04,0x95,0xEB,0xD8,0xFB,0x6A,0x14,0x27 |
| 11 | 0x9A,0x4A,0x26,0x6C,0x65,0xB5,0xD9,0x71,0x22,0x66,0x38,0x8E,0xDD,0x99,0xC7 |

In some embodiments, following the 1440 bit AM field may be 1440 bits of all-Zero's PAD for an oFrame 3. In many embodiments, 960 bits of 10b interleaved OH may be transmitted after the 1440 bits of PAD. Refer now to the example embodiment of FIG. 21, which represents an oFRAME-3 PAD Transmission Order—10b interleaved. FIG. 21 illustrates pad 2105.

In some embodiments, an oFRAME-2 (200G) may have a 200G frame that contain 128 rows×10280 bits, where an AM area may contain 8 lanes of 120 bit alignment markers (960b), a PAD area may contain 2 blocks of 480 bits (960b), an OH area may contain 2 blocks of 320 bits (640b), there may be an additional PAD between OH and payload is 10 bits, and there may be 10 257-bit blocks of framing and 5110 257-bit blocks of payload in the frame. Refer now to the example embodiment of FIG. 22, which represents an oFRAME-3 OH Transmission Order—10b interleaved. In the example embodiment of FIG. 22, overhead 2205 is represented as OH 2225.

right in oFRAME-2 view, each tributary assigned 1 257-bit block of stuffing, where T1 uses S1, T2 uses S2, stuffing location defined by CM value of each OH, and every 2×257 bit stuffing location will have mix of data and stuff when multiplexing is in play.

In many embodiments, an oFRAME-2 pad (PAD) areas may contain 2×480b blocks (960b total) of consecutive zeros starting at bit 961 in the first row to bit 1920 plus 10b of additional pad location starting at bit 3841 to 3855. In some embodiments, a 10b padding may be for 257b payload alignment.

Figure 24:
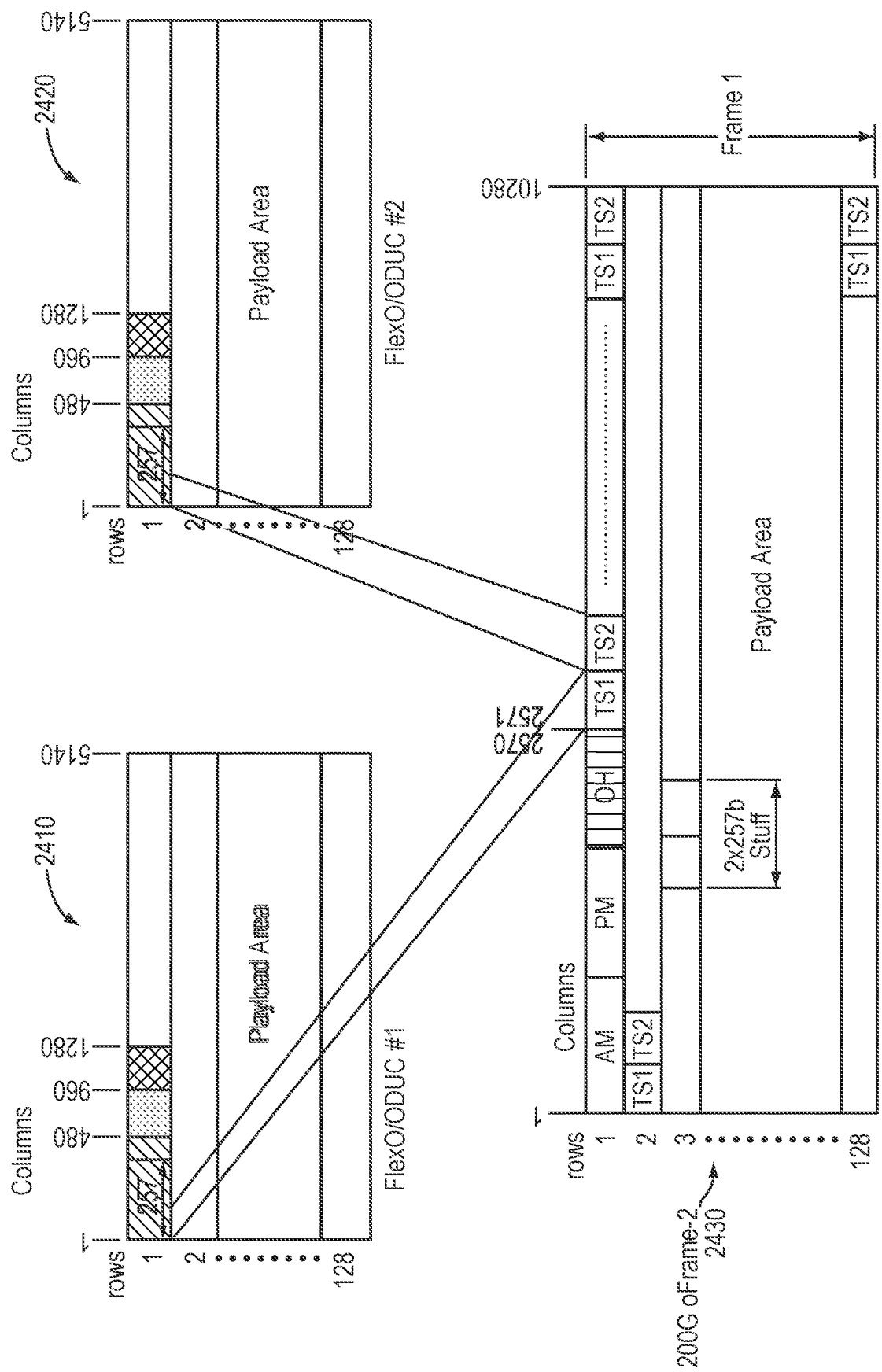
FIG. 24 is a simplified illustration of an oFRAME-2 with 2×100G Client, in accordance with an embodiment of the present disclosure.

In a particular embodiment, an oFRAME-2 with 2×100G Data Multiplexing may have 2 100G clients numbered CL1, CL2. Refer now to the example embodiment of FIG. 24, which illustrates an oFRAME-2 with 2×100G Client. In the example embodiment of FIG. 24, FlexO 100 2410 and FlexO 100 2420 are mapped into oFrame 3420. In some embodiments, each client may be assigned one tributary and one corresponding overhead field. In certain embodiments, a GMP for a client may be stored in the assigned overhead.

Figure 25:
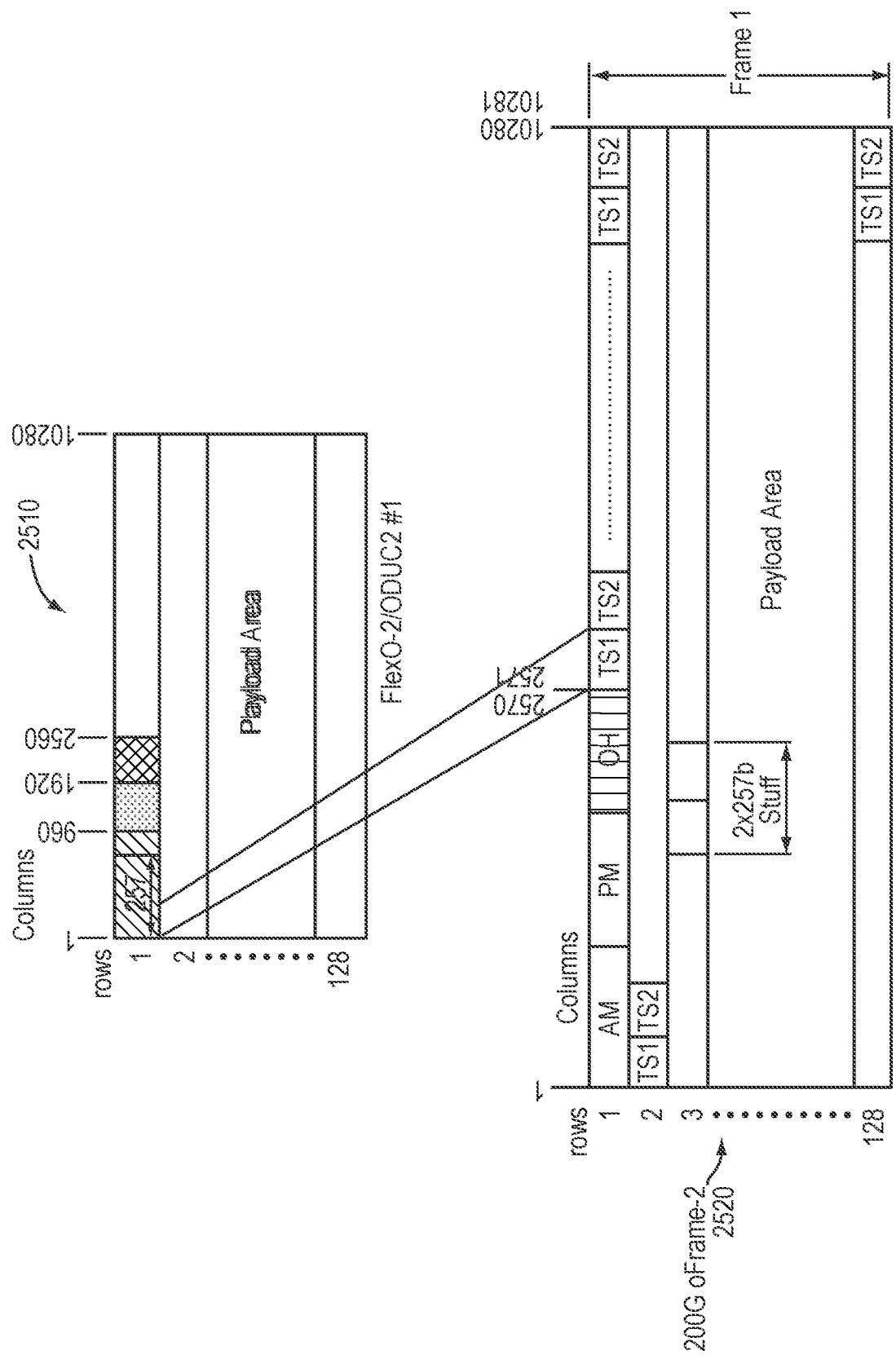
FIG. 25 is a simplified illustration of an oFRAME-2 with 1×200G clients (Transponder), in accordance with an embodiment of the present disclosure.

In a particular embodiment, an oFRAME-21×200G may have 1 200G client numbered CL1, where the 200G client assigned both tributaries and both overhead fields, and GMP for the client is stored in the overhead with the lowest ordinal number (OH1). Refer now to the example embodiment of FIG. 25, which is an example embodiment of 1×200G FlexO-2 client mapped into an oFRAME-2. In the example embodiment of FIG. 25, FlexO 200 is mapped into oFrame 2520

Figure 26:
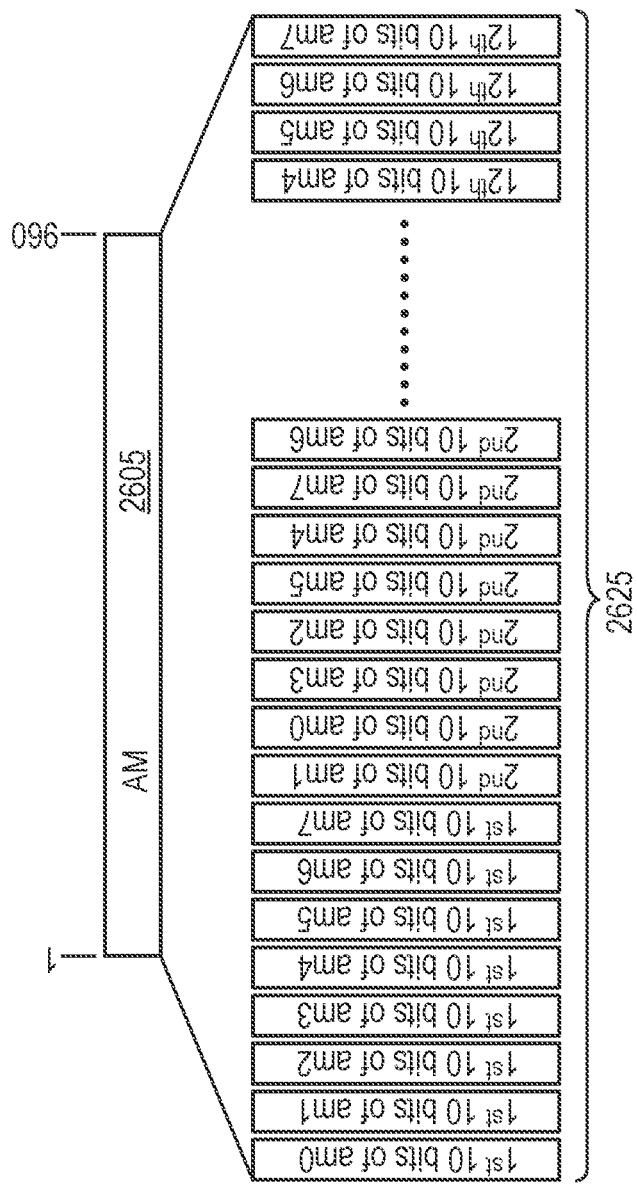
FIG. 26 is a simplified illustration of an oFRAME-4 AM Transmission order—10b interleaved, in accordance with an embodiment of the present disclosure.

In a certain embodiments, an oFRAME-2 structure may have 2560 bits of AM/PAD/OH+10b additional PAD. In many embodiments, a transmission order for fields of an oFrame 2 may be 10-bit interleaved which is the same as with IEEE 802.3bs and 200G FlexO-2. In some embodiments, an oFRAME-2 AM field may consist of 8 logical lanes (ami, i=0, 1 . . . 7). In certain embodiments, each lane may carry a 120-bit lane alignment marker. The example embodiment of FIG. 26 and rows of the example embodiment of Table 10 give values of ami transmitted over lane i. In the example embodiment of FIG. 26, AM 2605 is represented as AM 2625.

may be 1×320b (1×40 Byte) fields starting at bit position 961 to 1280 in the first row. In certain embodiment, an OH area may include GMP mapping information. In some embodiments, there may be a 1×257-bit GMP stuff location per frame, stuffing location may be defined by CM value and each 257 bit stuffing location may have mix of data or stuff.

In certain embodiments, oFRAME pad (PAD) areas may contain 1×480 bit block of consecutive zeros starting at bit 481 in the first row to bit 960 plus 5b of additional pad location starting at bit 1281 to 1285. The 5b padding is for 257b payload alignment.

Figure 31:
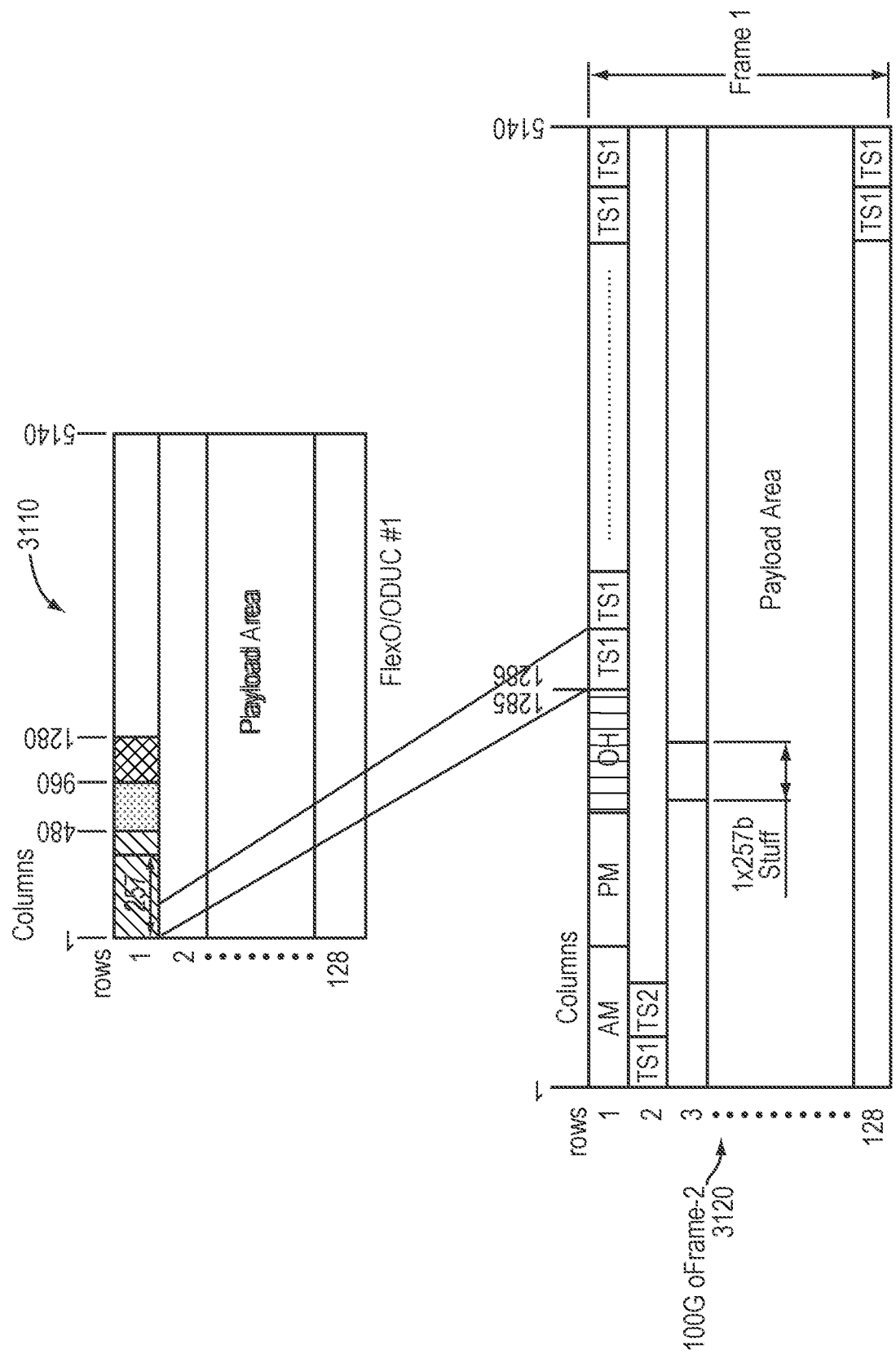
FIG. 31 is a simplified illustration of an oFRAME-1 with 1×100G clients (Transponder), in accordance with an embodiment of the present disclosure.

In some embodiments, an oFRAME-1 1×100G Data Multiplexing (100G Transponder) may have 1 100G client numbered CL1, where the 100G client may be assigned one tributaries and one overhead field, and GMP for the client may be stored in the overhead area. Refer now to the example embodiment of FIG. 31, which shows 1×100G FlexO client mapped into an oFRAME-1. In the example embodiment of FIG. 31, FlexO/ODUC 100 is mapped to oFrame 3120. Refer now to the example embodiment of FIG. 32, which illustrates an oFRAME-4 AM Transmission

TABLE 10 example embodiment of an oFRAME-2 alignment marker encodings

Logical
Lane   Encoding$^a$
am<i>  {CM$_0$,CM$_1$,CM$_2$,UP$_0$,CM$_3$,CM$_4$,CM$_5$,UP$_1$,UM$_0$,UM$_1$,UM$_2$,UP$_2$,UM$_3$,UM$_4$,UM$_5$}

| Lane | Encoding |
|---|---|
| 0 | 0x9A,0x4A,0x26,0xB6,0x65,0xB5,0xD9,0xD9,0x01,0x71,0xF3,0x26,0xFE,0x8E,0x0C |
| 1 | 0x9A,0x4A,0x26,0x04,0x65,0xB5,0xD9,0x67,0x5A,0xDE,0x7E,0x98,0xA5,0x21,0x81 |
| 2 | 0x9A,0x4A,0x26,0x46,0x65,0xB5,0xD9,0xFE,0x3E,0xF3,0x56,0x01,0xC1,0x0C,0xA9 |
| 3 | 0x9A,0x4A,0x26,0x5A,0x65,0xB5,0xD9,0x84,0x86,0x80,0xD0,0x7B,0x79,0x7F,0x2F |
| 4 | 0x9A,0x4A,0x26,0xE1,0x65,0xB5,0xD9,0x19,0x2A,0x51,0xF2,0xE6,0xD5,0xAE,0x0D |
| 5 | 0x9A,0x4A,0x26,0xF2,0x65,0xB5,0xD9,0x4E,0x12,0x4F,0xD1,0xB1,0xED,0xB0,0x2E |
| 6 | 0x9A,0x4A,0x26,0x3D,0x65,0xB5,0xD9,0xEE,0x42,0x9C,0xA1,0x11,0xBD,0x63,0x5E |
| 7 | 0x9A,0x4A,0x26,0x22,0x65,0xB5,0xD9,0x32,0xD6,0x76,0x5B,0xCD,0x29,0x89,0xA4 |

Figure 27:
FIG. 27 is a simplified illustration of an oFRAME-2 Alignment Marker Format, in accordance with an embodiment of the present disclosure.

Refer now to the example embodiment of FIG. 27, which illustrates a sample alignment marker. In the example embodiment of FIG. 27, alignment marker 2705 has common alignment maker 2720, unique pad 2725, and unique alignment marker 2730.

Figure 28:
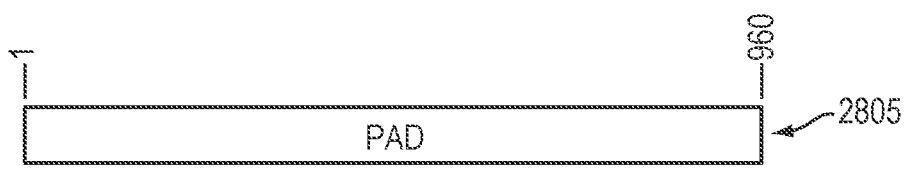
FIG. 28 is a simplified illustration of an oFRAME-2 PAD Transmission Order—10b interleaved, in accordance with an embodiment of the present disclosure.
Figure 29:
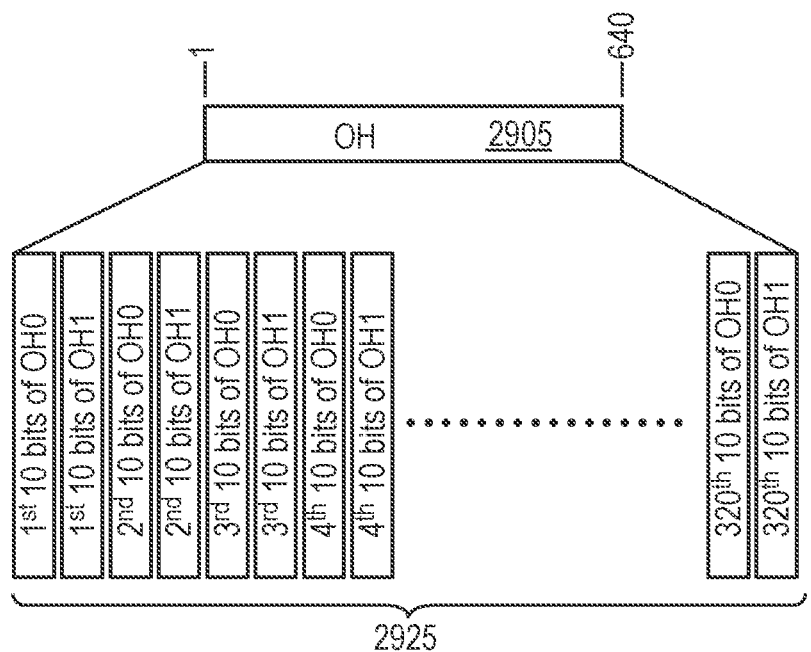
FIG. 29 is a simplified illustration of an oFRAME-2 OH Transmission Order—10b interleaved, in accordance with an embodiment of the present disclosure.

In most embodiments, following a 960 bit AM field may be 960 bits of all-Zero's PAD. In most embodiments, 640 bits of 10b interleaved OH may be transmitted after the 960 bits of PAD. Refer now to the example embodiment of FIG. 28, which illustrates an oFRAME-2 PAD Transmission Order—10b interleaved. FIG. 28 has PAD 2805. Refer now to the example embodiment of FIG. 29, which illustrates an oFRAME-2 OH Transmission Order—10b interleaved. FIG. 29 has OH 2905 represented as OH 2925.

Figure 30:
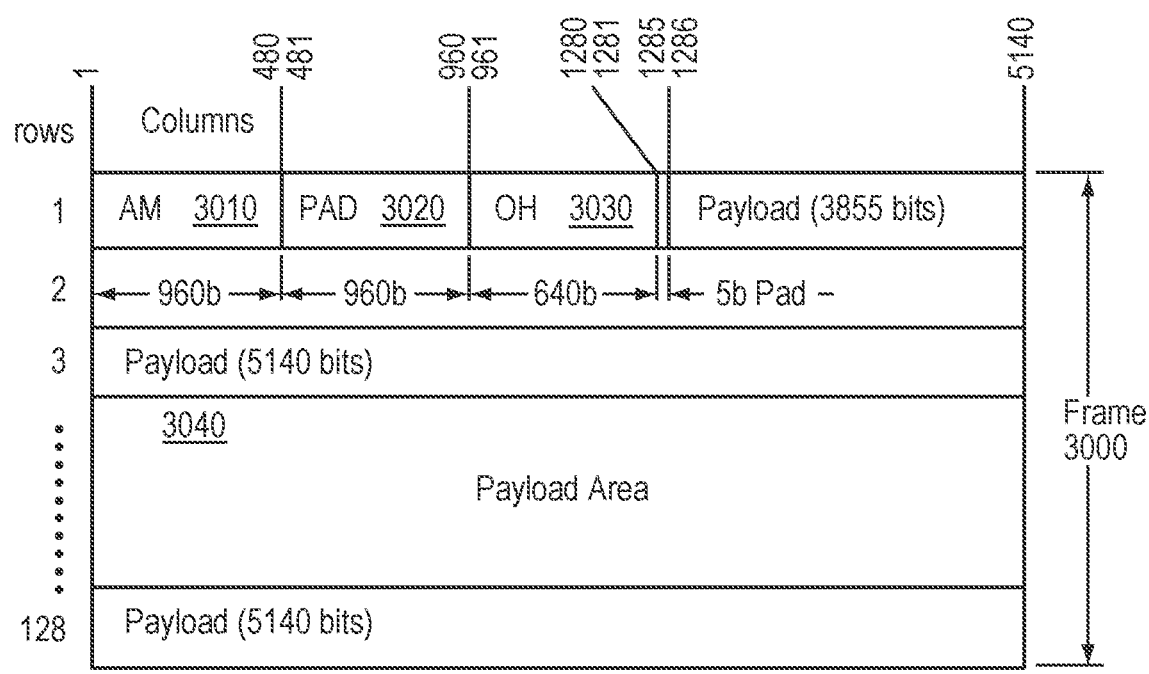
FIG. 30 is a simplified illustration of an oFrame-1, in accordance with an embodiment of the present disclosure.

An example embodiment of a 100G oFRAME (oFRAME-1) structure is shown in FIG. 30 and contains a frame alignment marker sequence every 128 rows. In this example embodiment, columns may be defined as 1-bit wide and a frame consists of 5140 columns. In the example embodiment of FIG. 30, oFrame 3000 has AM 3010, PAD 3020, OH 3030, and Payload 3040.

Figure 32:
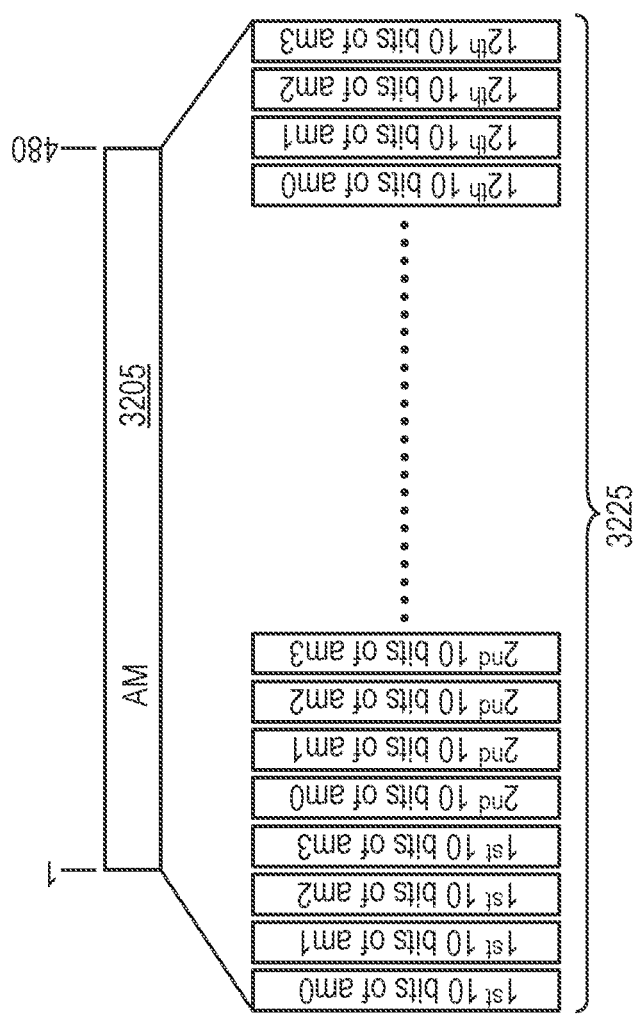
FIG. 32 is a simplified illustration of an oFRAME-4 AM Transmission order—10b interleaved, in accordance with an embodiment of the present disclosure.
Figure 33:
FIG. 33 is a simplified illustration of an oFRAME-1 Alignment Marker Format, in accordance with an embodiment of the present disclosure.
Figure 34:
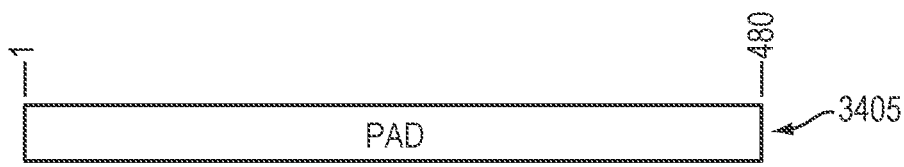
FIG. 34 is a simplified illustration of an oFRAME-1 PAD Transmission Order—10b interleaved, in accordance with an embodiment of the present disclosure.
Figure 35:
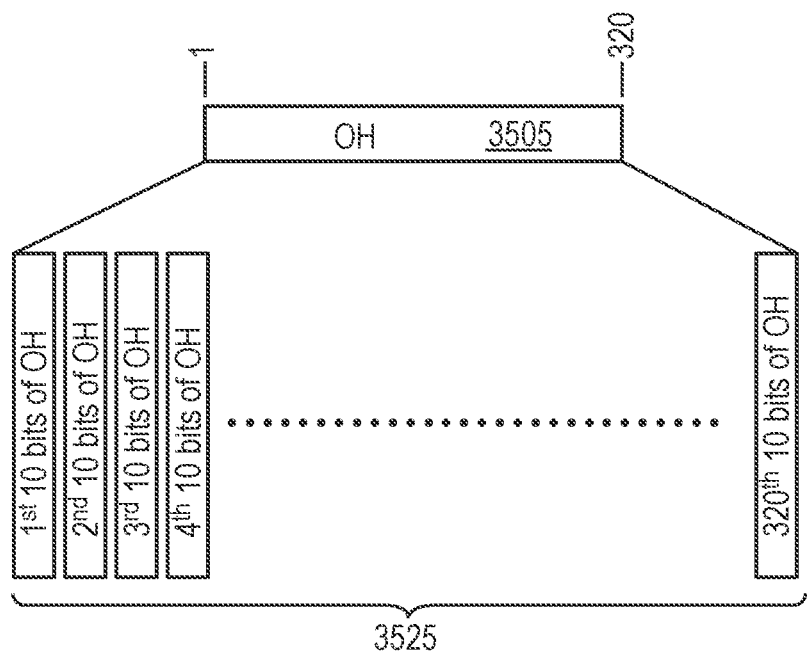
FIG. 35 is a simplified illustration of an oFRAME-1 OH Transmission Order—10b interleaved, in accordance with an embodiment of the present disclosure.

In some embodiments, an oFRAME payload area may contains 2555 257b blocks, have 1×100G tributaries numbered T1, 2555×257 bit block locations are numbered 1 through 2555, ordered left to right, top to bottom in oFRAME-2 frame view, and may use round-robin ordering. In many embodiments, an oFRAME overhead (OH) area order—10b interleaved. FIG. 32 has AM 3205 represented as AM 3225. Refer now to the example embodiment of FIG. 33, which illustrates an oFRAME-1 Alignment Marker Format. In the example embodiment of FIG. 33, alignment marker 3305 has common alignment maker 3320, unique pad 3325, and unique alignment marker 3330. Refer now to the example embodiment of FIG. 34, which an oFRAME-1 PAD Transmission Order—10b interleaved. FIG. 34 has PAD 3405. Refer now to the example embodiment of FIG. 35, which illustrates an oFRAME-2 OH Transmission Order—10b interleaved. FIG. 35 has OH 3505 represented as OH 3525.

In some embodiments, an oFRAME-1 structure may carry 1285 bits of AM/PAD/OH+5b additional PAD. In certain embodiments, a transmission order for each of these fields may be 10-bit interleaved which is the same as with IEEE 802.3bs and 100G FlexO-1.

In some embodiments, an oFRAME-1 AM field may of 4 logical lanes (ami, i=0, 1 . . . 3). In certain embodiments, each lane may carry a 120-bit lane alignment marker. In certain embodiments, FIG. 12, and rows of the example embodiment of Table 11 gives the values of ami transmitted over lane i.

TABLE 11 example embodiment of an oFRAME-1 alignment marker encodings

| Logical Lane am<i> | Encoding[a] {$CM_0,CM_1,CM_2,UP_0,CM_3,CM_4,CM_5,UP_1,UM_0,UM_1,UM_2,UP_2,UM_3,UM_4,UM_5$} |
|---|---|
| 0 | 0x9A,0x4A,0x26,0xB6,0x65,0xB5,0xD9,0xD9,0x01,0x71,0xF3,0x26,0xFE,0x8E,0x0C |
| 1 | 0x9A,0x4A,0x26,0x04,0x65,0xB5,0xD9,0x67,0x5A,0xDE,0x7E,0x98,0xA5,0x21,0x81 |
| 2 | 0x9A,0x4A,0x26,0x46,0x65,0xD9,0xFE,0x3E,0xF3,0x56,0x01,0xC1,0x0C,0xA9 |
| 3 | 0x9A,0x4A,0x26,0x5A,0x65,0xB5,0xD9,0x84,0x86,0x80,0xD0,0x7B40x79,0x7F,0x2F |

In most embodiments, following the 480 bit AM field may be 480 bits of all-Zero's PAD. In many embodiments, 320 bits of 10b interleaved OH may be transmitted immediately after the 480 bits of PAD. In many embodiments, oFRAMEs may operate at a fixed carrier frequency. In some embodiments, a carrier frequency may be higher than what is required to carry the payload. In certain embodiments, a difference between the input payload and the payload capacity may be handled using GMP stuffing blocks. In some embodiments, client traffic may be mapped into an oFRAME payload using GMP blocks. In certain embodiments, a GMP processor may calculates a number of active and stuffing GMP blocks for each frame. In most embodiments, active GMP blocks may be filled with client traffic while the stuffing GMP blocks are filled with a fixed pattern of all zeros.

In certain embodiments, a consecutive set of 257 bit blocks may be combined to form a GMP block. In most embodiments, an oFRAME may support time-division multiplexing of both 100G, 200G and 300G clients into the oFRAME container frame. In many embodiments, each client rate may use a different number of 257 bit blocks for each GMP block. In many embodiments, a GMP algorithm may be used across a period of four 400ZR frames. In some embodiments, examples of a number of GMP blocks for each client rate is shown in the example embodiments of Table 12. In most embodiments, client rates may have a same number of GMP blocks across four frames. In many embodiments, GMP block count may serve as the Pmserver parameter in the GMP algorithm.

TABLE 12 example embodiment of an GMP Block Counts

| Client Mode | Number of 257 bit Blocks in 1 GMP Block | Number of 257 bit Blocks in 4 Frames | Number of GMP blocks In 4 Frames |
|---|---|---|---|
| 100G | 1 | 10220 | 10220 |
| 200G | 2 | 20440 | 10220 |
| 300G | 3 | 30660 | 10220 |
| 400G | 4 | 40880 | 10220 |

Figure 36:
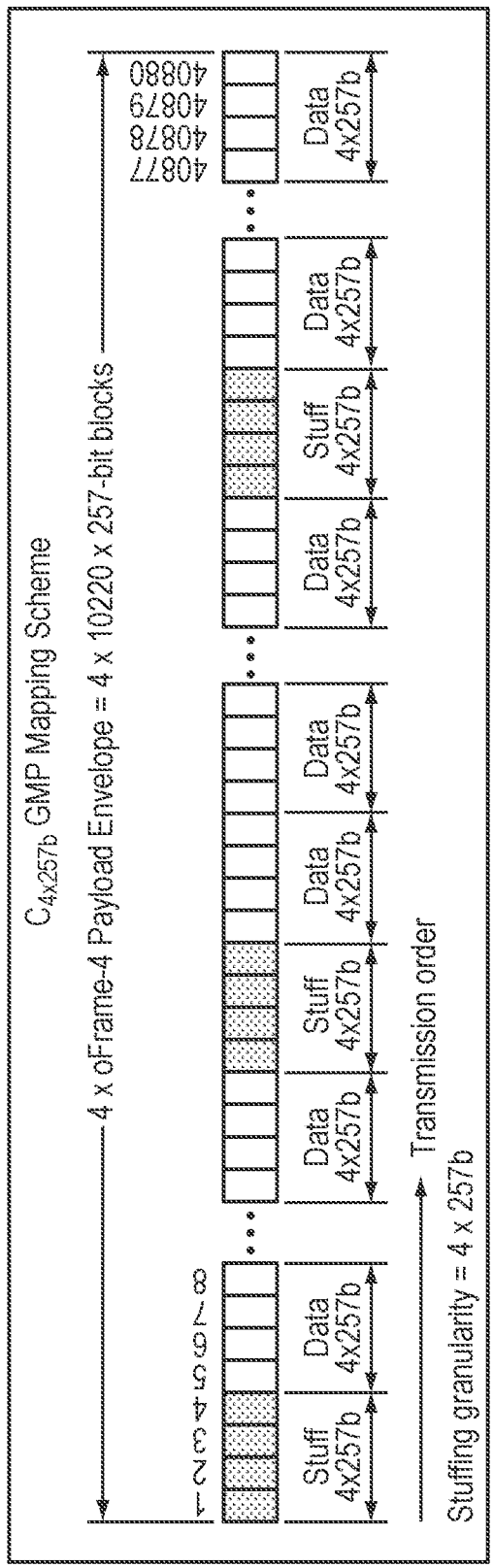
FIG. 36 is a simplified illustration of a GMP Mapping Clients into oFRAME-4, in accordance with an embodiment of the present disclosure.

Refer now to the example embodiment of FIG. 36, which describes how data and stuffing are used in the oFRAME container and illustrates GMP Mapping Clients into an oFRAME-4. In this example embodiment, for the oFRAME-4 container, each GMP block is 4×257-bit blocks. Each GMP block containers either data or stuffing. The GMP mapping scheme operates over a period of four oFRAMEs. The number of stuffing blocks in a frame is defined by the Cm value that is stored in the oFRAME OH. A new Cm value is made available every four oFRAMEs. An example embodiment of a number of 257-bit blocks in a GMP stuffing block is a function of the oFRAME container rate is shown in Table 12.

In some embodiments, an oFRAME GMP overhead for this mapping may consist of three justification control (JC1, JC2, JC3) bytes carrying the value of GMP overhead Cm, and three justification control (JC4, JC5, JC6) bytes carrying the value of GMP overhead Σ CnD.

TABLE 13 example embodiment of a GMP Justification Control

| | GMP $C_n$ encoding | | | | | | | |
|---|---|---|---|---|---|---|---|---|
| | 1 | 2 | 3 | 4 | 5 | 6 | 7 | 8 |
| JC1 | C1 | C2 | C3 | C4 | C5 | C6 | C7 | C8 --- 14-bit $\Sigma C_{1028}$ |
| JC2 | C9 | C10 | C11 | C12 | C13 | C14 | II | DI GMP Overhead & |
| JC3 | | | | CRC8 | | | | parameters (4 x257b blocks Stuffing granularity) |
| JC4 | RES | RES | RES | RES | D1 | D2 | D3 | D4 --- 7-bit $\Sigma C_{nD}$ |
| JC5 | RES | RES | RES | RES | D5 | D6 | D7 | D8 Provides 8-bit granularity |
| JC6 | RES | RES | RES | RES | | CRC4 | | |

In many embodiments, JC1, JC2 and JC3 bytes may consist of a 14-bit Cm field (bits C1, C2, . . . , C14), a 1-bit Increment Indicator (II) field, a 1-bit Decrement Indicator (DI) field and an 8-bit CRC-8 field which contains an error check code over the JC1, JC2 and JC3 fields. In certain embodiments, JC4, JC5 and JC6 bytes may consist of a 7-bit CnD field (bits D1, D2, . . . , D7), a 4-bit CRC-8 field which contains an error check code over the JC4, JC5 and JC6 fields. In some embodiments, an oFRAME payload may consist of some number of GMP blocks (see Table 12). In many embodiments, each GMP block may consist of some number of 257-bits blocks (see Table 12).

In some embodiments, an oFRAME signal may be created from a locally generated clock (such as shown in the example embodiment of Table 5) which may be independent of the client signal. In many embodiments, a client signal may be adapted to locally generated oFRAME clock by means of a generic mapping procedure (GMP) as specified in G.709 Annex D. In certain embodiments, a generic mapping process may generate Cm(t) and CnD(t) information, once per four oFRAME, according to Annex D and may encode this information in the justification control overhead JC1/JC2/JC3 and JC4/JC5/JC6. In certain embodiments, demapping process may decode Cm(t) and CnD(t) from JC1/JC2/JC3 and JC4/JC5/JC6 and may interpret Cm(t) and CnD(t) according to Annex D. CRC-8 may be used to protect against an error in JC1/JC2/JC3 and CRC4 protect against and error JC4/JC5/JC6 signals.

TABLE 14 example embodiment of a Client and oFRAME GMP parameter values

| Mapping | OTUC1 to oFRAME | FLEXO-SR to oFRAME |
|---|---|---|
| Fclient | 105258138053 | 105643510782 |
| Fserver | 105725952000 | 105725952000 |
| Bserver | 2626540 | 2626540 |
| Pserver | 10220 | 10220 |
| m | 1x257 | 1x257 |
| M | 128 | 128 |
| n | 8.03125 | 8.03125 |
| Cn | 10174.779 | 10212.031 |
| Cn(t) | 10174 | 10212 |
| Cnmin | 10174.372 | 10211.622 |
| Cnmax | 10175.186 | 10212.439 |
| Cm | 10174.779 | 10212.031 |
| Cm(t) | 10174 | 10212 |
| Cmmin | 1.01743717781E+04 | 1.02116223459E+04 |
| Cmmax | 1.01553123507E+04 | 1.02124393084E+04 |
| CnD | 0.779 | 0.031 |
| CnD(t) | 0 to 127 | 0 to 127 |

Example Embodiment of an Stuffing Locations

Table 15 shows example embodiments of the location of the "stuff" GMP blocks for a few specific Cm values.

TABLE 15 example embodiment of a GMP STUFF Locations of oFRAME

| Cm | Stuff Locations (M) |
|---|---|
| 10220 | N/A |
| 10219 | 1 |
| 10218 | 1, 477 |
| 10217 | 1, 318, 635 |
| 10216 | 1, 239, 477, 715 |

TABLE 15-continued example embodiment of a GMP STUFF Locations of oFRAME

| Cm | Stuff Locations (M) |
|---|---|
| 10215 | 1, 191, 381, 572, 762 |
| 10216 | 1, 159, 318, 477, 635, 794 |

In many embodiments, a CRC-8 located in JC3 is calculated over the JC1 and JC2 bits. In some embodiments, a CRC-8 may use the following generator polynomial:

$$g(x)=x^8+x^3+x^2+1$$

Where
1. The JC1 and JC2 octets are taken in order, most significant bit first, to form a 16-bit pattern representing the coefficients of a polynomial M(x) of degree 15.
2. M(x) is multiplied by $x^8$ and divided (modulo 2) by G(x), producing a remainder R(x) of degree 7 or less.
3. The coefficients of R(x) are considered to be an 8-bit sequence, where $x^7$ is the most significant bit.
4. This 8-bit sequence is the CRC-8 where the MSB of the CRC-8 is the coefficient of $x^7$ and the LSB is the coefficient of $x^0$.

In some embodiments, a de-mapper process may performs steps 1-3 in a same manner as a mapper process, except that here, the M(x) polynomial of step 1 includes the CRC bits of JC3, which may result in M(x) having degree 23. In most embodiments, in the absence of bit errors, the remainder may be 0000 0000.

In some embodiments, a CRC-4 located in JC6 may use the generator polynomial:

$$g(x)=x^4+x+1.$$

Where
1. The JC1 and JC2 octets are taken in order, most significant bit first, to form a 16-bit pattern representing the coefficients of a polynomial M(x) of degree 15.
2. M(x) is multiplied by $x^8$ and divided (modulo 2) by G(x), producing a remainder R(x) of degree 7 or less.
3. The coefficients of R(x) are considered to be an 8-bit sequence, where $x^7$ is the most significant bit.
4. This 8-bit sequence is the CRC-8 where the MSB of the CRC-8 is the coefficient of $x^7$ and the LSB is the coefficient of $x^0$.

In some embodiments, a de-mapper process may perform steps 1-3 above in the same manner as the mapper process, except that here, the M(x) polynomial of step 1 may include a CRC bits of JC6, resulting in M(x) having degree 11. In certain embodiments, in the absence of bit errors, the remainder may be 0000. In some embodiments, replacement signals for a host interface in the event of Signal Fail (SF).

Figure 37:
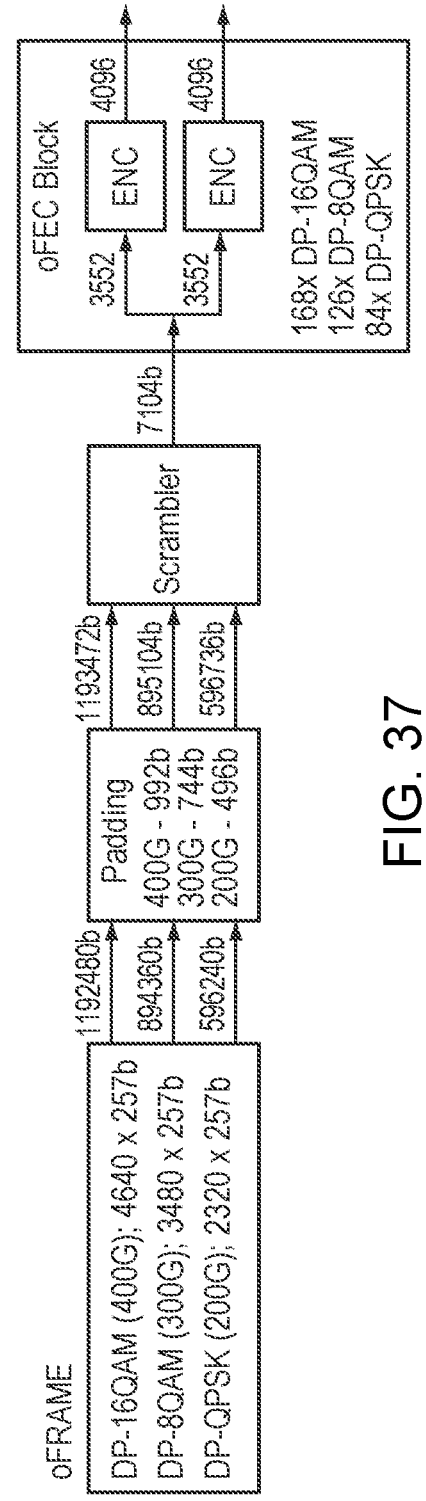
FIG. 37 is a simplified illustration of an oFEC to oFRAME adaptation, in accordance with an embodiment of the present disclosure.

In some embodiments, an oFEC may be a block code based encoder and iterative soft decision decoder with 11.6 dB @ $10^{-15}$ (16QAM) Net Coding Gain (NCG) after 3 SD iterations (correction to $\leq 10^{-15}$ with pre-FEC BER 2.0 $e^{-2}$). Refer now to the example embodiment of FIG. 37. FIG. 37 illustrates a relationship of an oFEC to an oFRAME-n. In this embodiment, an optical DSP frame is fixed size anD
    For oFRAME-4 116 rows (4640×257b blocks) of information (1192480 bits)+992b of pad (1193472 bits total) is mapped to 168 oFEC Blocks.
    For oFRAME-3 87 rows (3480×257b blocks) of information (894360 bits)+744b of pad (895104 bits total) is mapped to 126 oFEC Blocks.

For oFRAME-2 58 rows (2320×257b blocks) of information (596240 bits)+496b of pad (596736 bits total) is mapped to 84 oFEC Blocks.

TABLE 16 example embodiment of an oFEC adaptation rates

| Optical Format | oFRAME Lanes | oFEC Blocks | PAD | Total (bits) | Post FEC encode (bits) |
|---|---|---|---|---|---|
| (400G) DP-16QAM (4640×257b) | oFRAME-4 116 Rows, | 168 | 992b | 1193472 | 1376256 |
| (300G) DP-8QAM | oFRAME-3 87 Rows, (3480×257b) | 126 | 744b | 895104 | 1032192 |
| (200G) DP-QPSK | oFRAME-2 58 Rows, (2320×257b) | 84 | 496b | 596736 | 688128 |

In some embodiments, for the purpose of oFEC alignment and synchronization pad bits may be prepended/removed from the oFRAME payload area. In certain embodiments, padding may be a Zero field that gets scrambled prior to encoding and removed after decoding and descrambling.

In some embodiments, a scrambler/descrambler may be located before oFEC on transmit, and after the decoder on receive. In some embodiments, an operation of a scrambler may be functionally equivalent to that of a frame-synchronous scrambler of sequence 65535 and the generating polynomial shall be:

$$x^{16}+x^{12}+x^{3}+x+1.$$

In certain embodiments, a scrambler/descrambler may reset to 0xFFFF at the start of the pad insertion block of the oFEC block structure.

Figure 38:
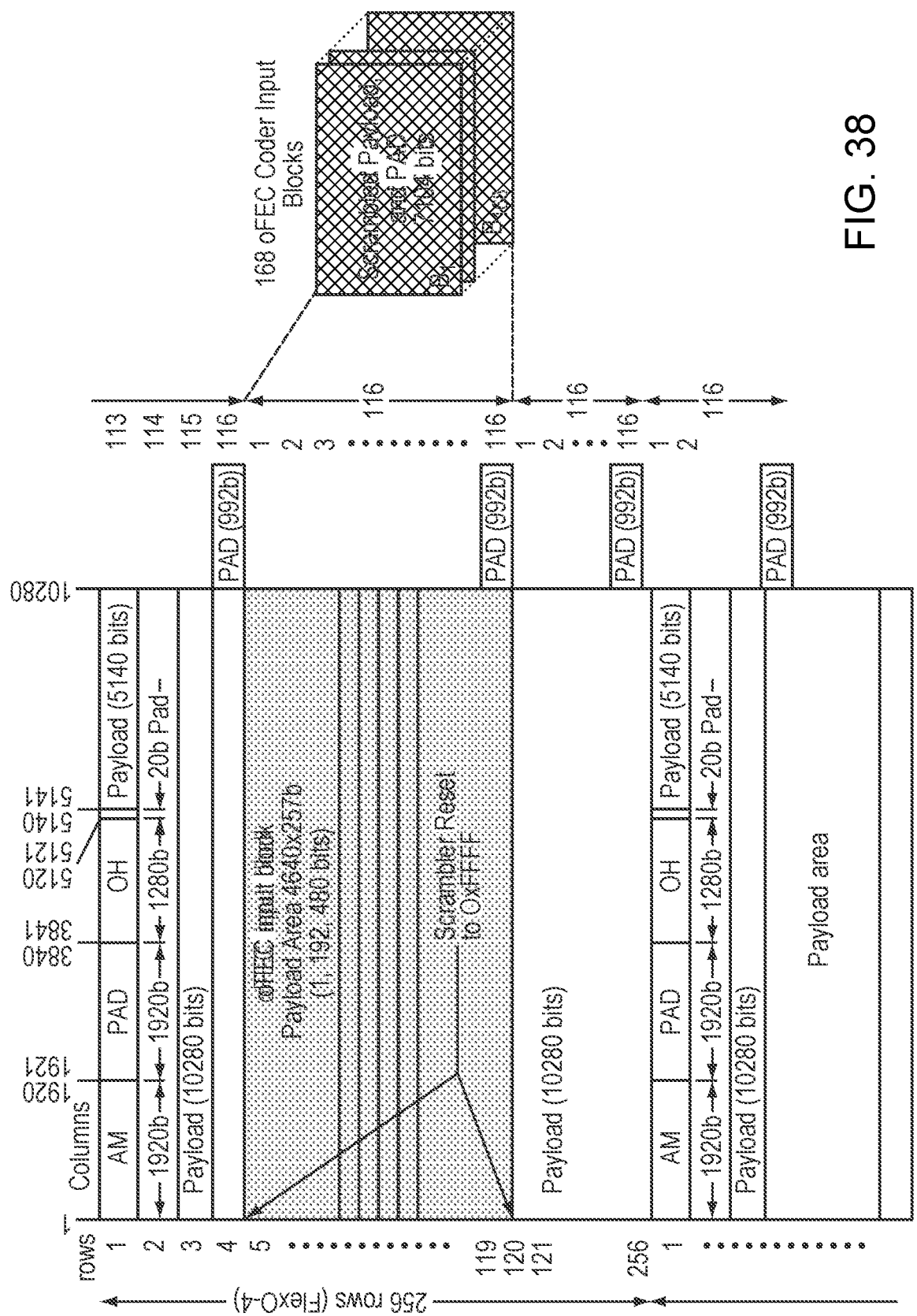
FIG. 38 is a simplified illustration of an oFRAME-4 to oFEC mapping, in accordance with an embodiment of the present disclosure.
Figure 39:
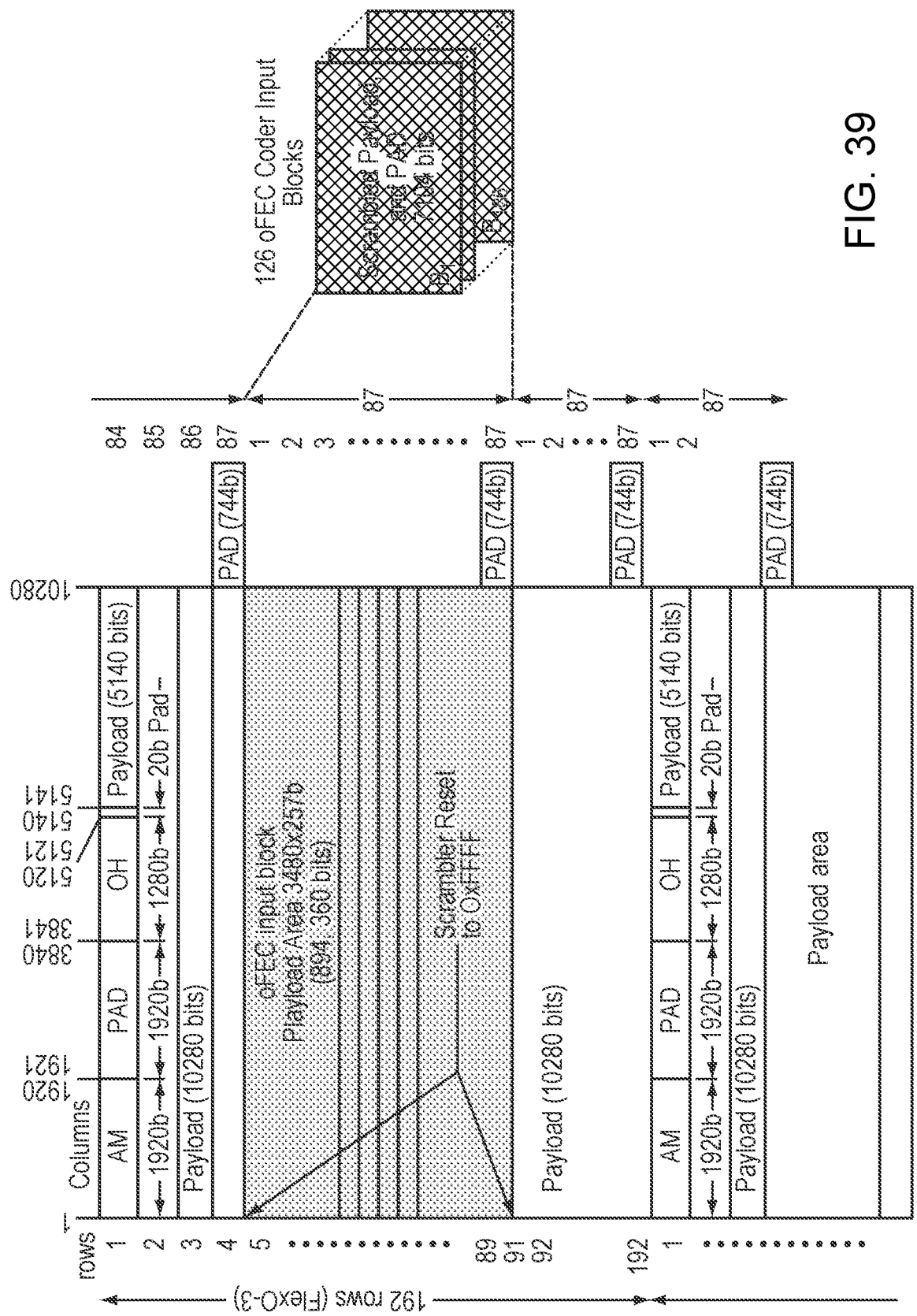
FIG. 39 is a simplified illustration of an oFRAME-3 to oFEC mapping, in accordance with an embodiment of the present disclosure.
Figure 40:
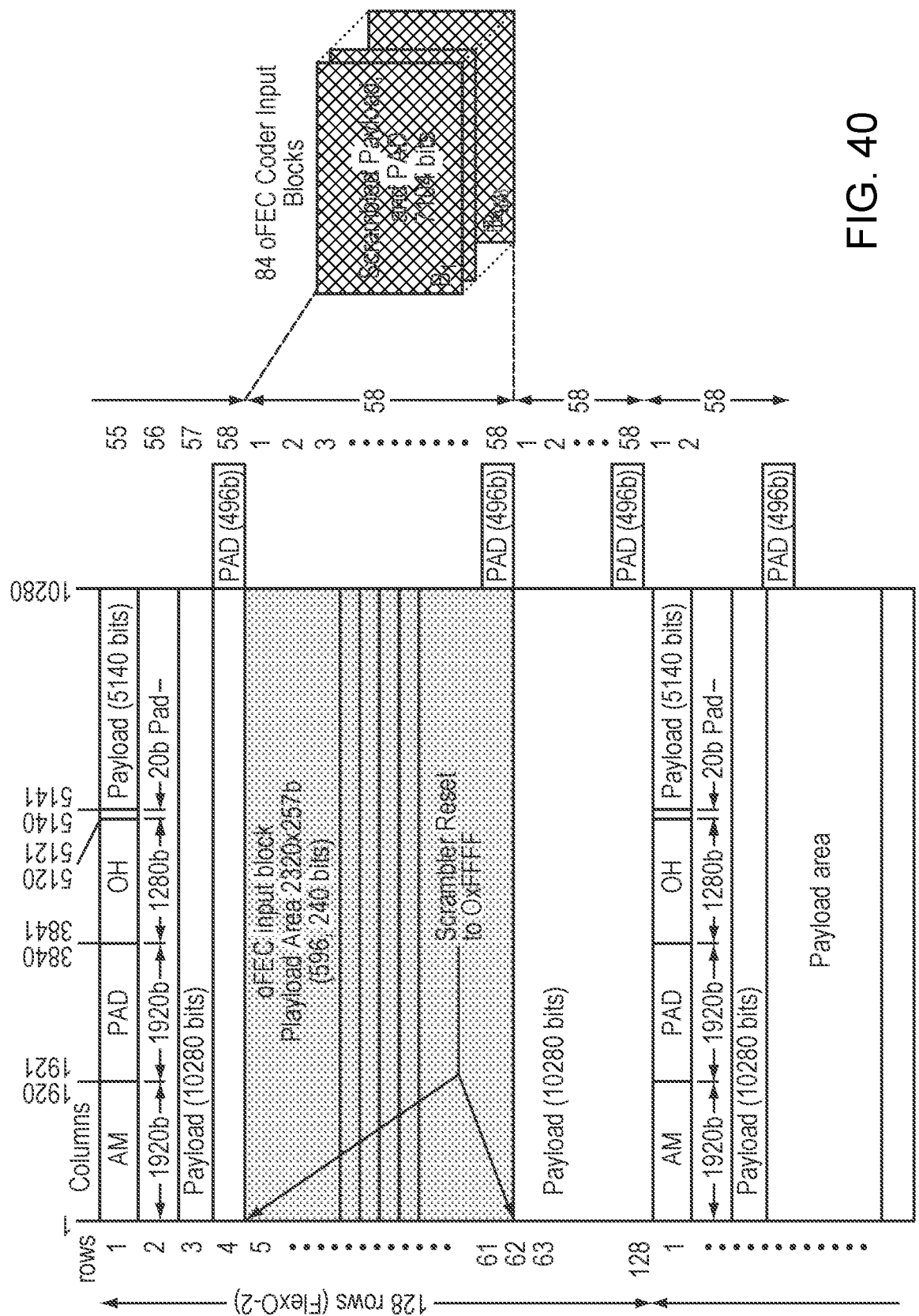
FIG. 40 is a simplified illustration of an oFRAME-2 to oFEC mapping, in accordance with an embodiment of the present disclosure.

Refer now to the example embodiment of FIG. 38, which shows a relationship of the oFRAME-4, additional FEC padding, and scrambler reset location. The example embodiment of FIG. 39 shows a relationship of the oFRAME-3, additional FEC padding, and scrambler reset location. The example embodiment of FIG. 40 shows a relationship of the oFRAME-2, additional FEC padding, and scrambler reset location.

Example Embodiments of Open Forward Error Correction (oFEC)

NOTE: This section uses base 0 for mathematical formula convenience.

Figure 41:
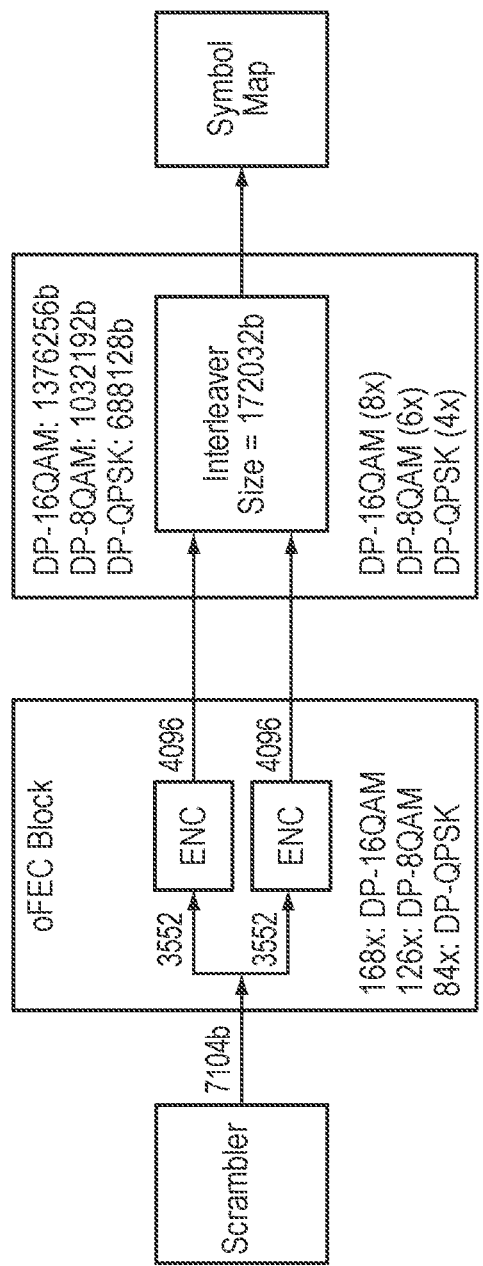
FIG. 41 is a simplified illustration of an oFEC block encoder and Interleaver, in accordance with an embodiment of the present disclosure.

Refer now to the example embodiment of FIG. 41. The example of FIG. 41 shows an oFEC and interleaver datapath. In this embodiment, 7041 bits from the Scrambler is bit muxed into (2) parallel 3552/4096 encryption engines. The encryption engine is a block code based encoder and iterative soft decision decoder with 11.6 dB @ $10^{-15}$ (16QAM) Net Coding Gain (NCG) after 3 SD iterations (correction to $\leq 10^{-15}$ with pre-FEC BER $2.0^{-2}$).

In certain embodiments herein, a single instance of an oFEC encryption engine is described. In other embodiments, applications may use two or more encryption engines operate in parallel, with each engine producing an oFEC codeword. In a particular embodiments, a codeword in oFEC may be an infinite set of bits organized in a matrix with infinite number of rows and N columns (N=128).

In some embodiments, a code word may have a property that each bit is part of two "constituent codewords", where each constituent codeword is a binary vector x of length 2 N satisfying the constraint x H=0, where H is a (2N, 2N–k) binary matrix, with 2N>k>N. In most embodiments, a k=239 and each constituent code has (2N–k)=17 parity bits. In some embodiments, the fraction of bits that are parity bits is 17/128, the rate of the code is 111/128=0.867 and the overhead is 17/111=15.3%.

In many embodiments, H may be a parity check matrix of an extended BCH(256, 239) code with minimum Hamming distance 6, using a textbook encoding, i.e. if x is a codeword satisfying x H=0, then
 1. x has an even parity
 2. if the first 255 bits of x are seen as the coefficients of a polynomial of degree 254 (with bit 0 of x being the coefficient of power 254), then this polynomial is divisible by the binary polynomial $y^{16}+y^{14}+y^{13}+y^{11}+y^{10}+y^{9}+y^{8}+y^{6}+y^{5}+y+1$.

Figure 42:
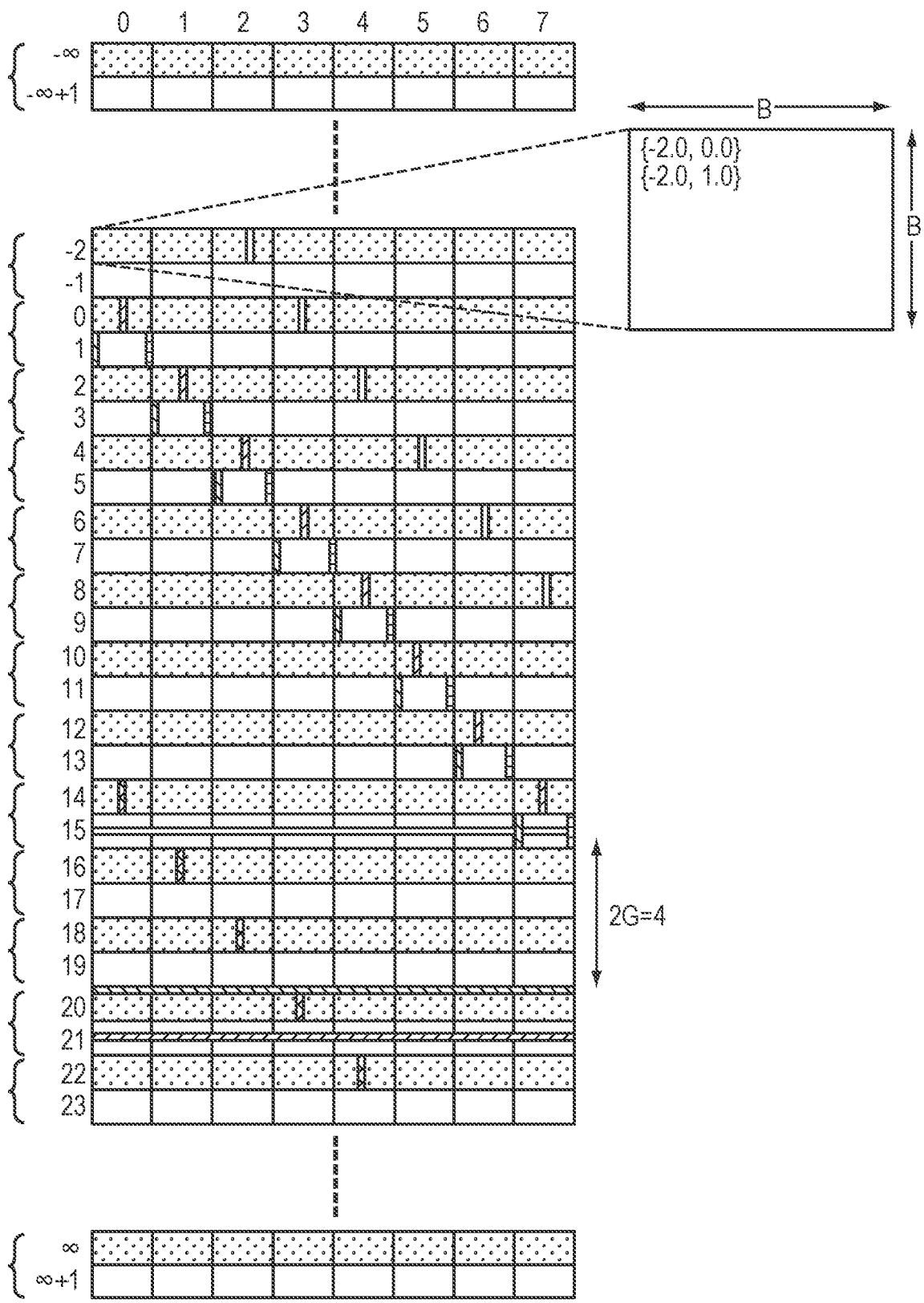
FIG. 42 is a simplified illustration of a Structure of an openFEC, in accordance with an embodiment of the present disclosure.

In certain embodiments, constituent codewords may constructed as explained below to allow high speed parallel encoding and decoding. In some embodiments, to define what bits are part of a given constituent code the following structure may be followed:

The infinite matrix of bits may be partitioned in blocks of B×B bits (B=16), arranged in rows and columns as shown in the example embodiment of FIG. 42. In the example embodiment of FIG. 42, there may be N/B (N/B=8) blocks per row, and each block is identified by a block row number, R, and a block column number, C=0, 1, . . . , N/B−1, appearing respectively on the left hand side and at the top of the figure.

In some embodiments, each bit inside a block may be identified by its row number, r=0, 1, . . . , B−1, and column number, c=0, 1, . . . , B−1, where bit 0, 0 is at the upper left corner of a block. In many embodiments, each bit in the infinite matrix may be identified by a quadruple {R, C, r, c}.

In certain embodiments, another parameter of an oFEC may be the number of guard block rows whose purpose will be clarified below. In many embodiments, a number of guard block rows may need to be even (4 in FIG. 42) with value 2 G, (G=2).

In a particular embodiment, a constituent codeword (R, r) may be labelled by a block row number R and a bit row number r, r=0, 1, . . . , B−1. In this particular embodiment, the $k^{th}$ bit (k=0, 1, . . . , 2 N−1) of constituent code (R, r) is the bit identified with the quadruple:

If $k<N$: $\{(R\char`\^1)-2G-2N/B+2[k/B],[k/B],(k\% B)\char`\^r,r\}$ (1)

If $k \geq N$: $\{R,[(k-N)/B],r,(k\% B)\char`\^r\}$ (2)

where [ ] denotes the floor operator, (a % b) denotes the value of a modulo b, and (a ˆ b) represents the number with a binary representation equal to the bit-wise "exclusive or" of the binary representations of the numbers a and b.

Particular examples of formulas are illustrated in the example embodiment of FIG. 42. In the example of FIG. 42, the union of line segments (both vertical or horizontal) of a given color show the bits forming a constituent codeword. In the example of FIG. 42, consider for example constituent code (20, 0). The position of its bits in the infinite matrix are indicated by the red line segments. Bit 0 to 15 are in column 0 of block (1, 0), bits 16 to 31 in column 0 of block (3, 1), . . . , and bits 112 to 127 in the column 0 of block (15, 7). The bit indices go up as one descends in the columns. Bits 128 to 255 are located in row 0 of blocks (20, 0) to (20, 7) and their indices go up as one moves to the right in a row.

In the example embodiment of FIG. 42, bits 0 to 127 are referred to as the "front" of a constituent code, and bits 128 to 255 as the "back." In many embodiments, each bit in an oFEC may belongs to the front of a constituent code and to the back of another one. In some embodiments, if the back of a constituent codeword is in an odd numbered row of blocks (yellow background), then its front may be in even numbered rows of blocks (blue background), and conversely. In some embodiments, by using a reasoning similar to the one for Product Codes, one can show that the minimum Hamming distance of an oFEC may then be at least as large as the square of the minimum Hamming distance of a constituent code (thus the distance is at least 36). In some embodiments, blocks located below the front blocks and above the back blocks are guard blocks, relative to the constituent code of interest.

Refer again to the example embodiment of FIG. 42. In FIG. 42, now consider the bits of constituent code (20, 15). They are identified by the orange line segments. They are in the same blocks as the segments of constituent code (20, 0). However because "r" is 15 instead of 0 as previously, the expressions "^ r" in formulas (1) and (2) become significant, and the bits are taken in reverse order in each block. For example, bits 0 to 15 in the front of code (20, 15) are bits 15 to 0 in column 15 of block (1, 0). For r different from 0 and 15 the effect of the expression "^ r" is simple but hard to describe in a few words. Note that these intra-block permutations can be realized by proper "wiring" and their implementation is virtually cost-free.

In many embodiments, oFEC may be seen as a convolutional code and its performances characterized by its "error events." In many embodiments, without the "^ r" permutation, there may be about 625,000 possible error events of weight 36 that may start at every decoding of a constituent code (this number was obtained by an exhaustive computer search). For comparison, in other embodiments, a Product Code based on the same constituent code may have more than 3.3 e13 codewords of weight 36. In some embodiments, the possible error events of weight 36 may give an advantage to oFEC over well-known Turbo Product Codes when it comes to decoding performance, in particular error floors. In some embodiments, presence of the "^ r" permutation may be observed to eliminate error events of weight 36. In most embodiments, a minimum Hamming distance of the oFEC may be at least 42.

In some embodiments, encoding may be performed sequentially, in order of increasing rows. In other embodiments, at the time when a constituent code (R, r) is being encoded, constituent codes (R', r') with R'<R-2 G may already be encoded (or be in the last stages of their pipelines). In many embodiments, to encode a constituent code (R, r), a vector x of length 2 N may be formed where the front N bits are read from previously encoded bits in the infinite matrix according to formula (1) above. In some embodiments, in a back of a vector, the first k-N (i.e. 111) bits may be fresh information bits. In other embodiments, the last 2N-k (i.e. 17) back bits of a vector may be parity bits that can be calculated to satisfy x H=0. In many embodiments, after encoding, N back bits may be placed at their positions in the infinite matrix according to formula (2) above and bits in those positions are output to an interleaver.

Considering the example embodiment of FIG. 42, where G is large enough to allow the parallel encoding of 2 B (G+1)=96 constituent codes, assuming the pipeline delay is small. In the example embodiment of FIG. 42, this number is considerably reduced when the pipeline delay increases, which is typically the case in the decoder.

In many embodiments, at most N/B (N/B+2 G+1)=104 blocks may need to be kept in the encoder memory (excluding the current input). In certain embodiments, example blocks that may need to be kept in memory in order to encode block rows 20 and 21 may be indicated by a hash pattern in the example embodiment of FIG. 42. In most embodiments, a large G may allow for longer pipeline delays in the encoding and decoding operations, and may allow for more parallel execution in the encoder and decoder, at the expense of increased memory.

Figures 43, 44:
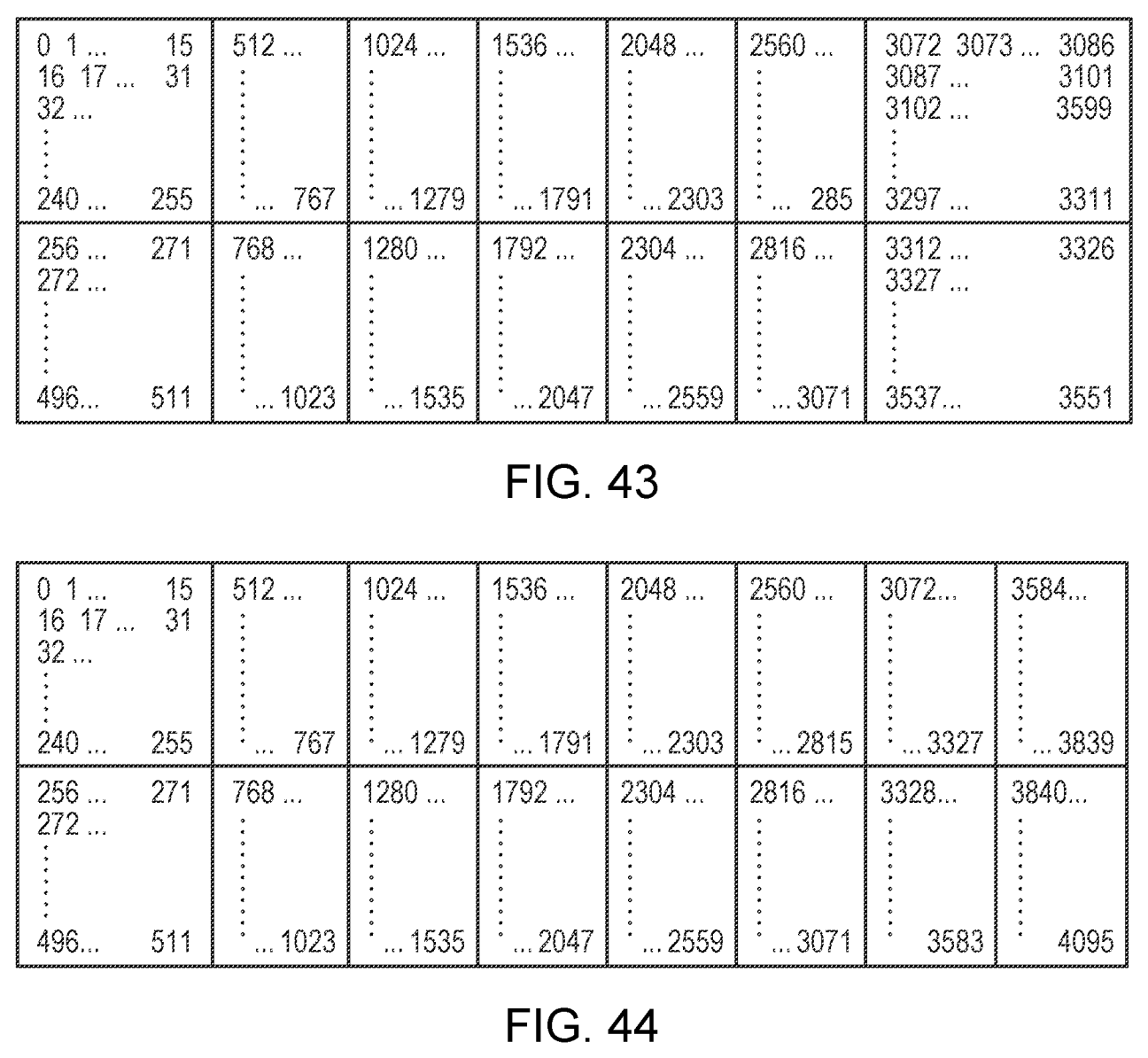

In most embodiments, an encoder input may consist of rectangular blocks=s of size (2 B)×(2N−k)=32×111 bits. In some embodiments, rectangles may be numbered 0, 1, 2, . . . . In certain embodiments, input bits into the encoder may be sequenced. In some embodiments, an i, input bit may be placed in rectangle [i/(32*111)] at the position indicated by the value i % (32*111) as shown in the example embodiment of FIG. 43. In certain embodiments, a rectangle may be divided in 16×16 bit blocks, except along the right edge where its size is 16×15. In certain embodiments, Bit k=0, 1, 2 . . . of row p in rectangle P may be placed in position N+k of constituent code (2 P+[p/B], p % B).

In many embodiments, an encoder output may consist of rectangular blocks of size (2 B)×N=32×128 bits. In certain embodiments, rectangles may be numbered 0, 1, 2, . . . . Bit k=0, 1, 2, . . . of row p in rectangle P is the bit {2 P+[p/B], [p/B], k/B, p % B} of the infinite array. In some embodiments, bits within an output rectangular block may be sequenced according to the example embodiment of FIG. 44.

In some embodiments, encoder output bits may be a function of the input bits. In many embodiments, an open-FEC encoder may be an entity that produces a binary output y(i) from a binary input u(i), where i=0, 1, 2. In certain embodiments, a relationship between y and u may be expressed through intermediate variables.

In particular embodiments, there may be a multidimensional vector V(R, C, r, c) where R is an integer, C=0, 1, . . . , 7, r=0, 1, . . . , 15, c=0, 1, . . . , 15. In some embodiments, associated with a vector V there may be constituent code vectors $W_{R,r}(i)$ where R≥0, r=0, 1, 2 . . . 15 and i=0, 1, . . . , 255.

For $R \geq 0$, $$W_{R,r}(k) = \begin{cases} V((R \wedge 1) - 20 + 2[k/16], [k/16], (k \% 16) \wedge r, r) & \text{for } k < 128 \\ V(R, [(k-128)/16], r, (k \% 16) \wedge r) & \text{for } 128 \leq k < 256 \end{cases}$$

where the [ ] denote the floor function, (a % b) denotes the value of a modulo b, (a $\rightarrow$ b) means the number with a binary representation equal to the bit-wise "exclusive or" of the binary representations of the numbers a and b.

In some embodiments, bits in the $W_{R,r}$ may need to satisfy the following equalities:

For R≥20, r=0,1, . . . ,15 and k=0,1, . . . ,110

$$W_{R,r}(128+k) = u([R/2]*32*111+((R\%2)*16+r)*(16-[k/96])+[k/16]*512+k\%16)$$

In many embodiments, for R.≥20, $W_{R,r}$ H=0, where H is the parity check matrix of an extended BCH(256, 239) code, using a textbook encoding, i.e. if x is a vector satisfying x H=0, then the following may need to be true
1. x has an even parity
2. if the first 255 bits of x are seen as the coefficients of a polynomial of degree 254 (with bit 0 of x being the coefficient of power 254), then this polynomial is divisible by the binary polynomial $y^{16}+y^{14}+y^{13}+y^{11}+y^{10}+y^9+y^8+y^6+y^5+y+1$.

In some embodiments, output y may satisfy the relationship

For $R \geq 0$, $C=0, 1, \ldots, 7$, $r=0, 1, \ldots, 15$, $c=0, 1, \ldots, 15$.

$$V(R,C,r,c)=y([R/2]*32*128+(R\%2)*256+C*16*32+r*16+c)$$

In some embodiments, 20*16*17 values may be left undefined in $W_{R,r}$ and in V(R, C, r, c) for 0≤R<20, and thus also in the output y. In other embodiments, an implementation may choose any convenient values v for 20*16(17 values in in $W_{R,r}$ and in V(R, C, r, c) for 0≤R<20. In some embodiments, for test vectors the output may need be totally specified. In certain embodiments, the following additional constraints may be added:

For 0≤R<20, $W_{R,r}$ H'=0, where H' is a 256×17 binary matrix where the first 128 rows are all 0 and the last 128 rows are equal to the last 128 rows of H.

In some embodiments, for use with iterative decoding, the bits in block row R may be been decoded as front bits in later constituent codewords after 2 (N/B+G+1) rows of blocks have been decoded. In the example embodiment of FIG. 42, bits in row R=0 are all have been decoded as front bits by the time block row 21 has been decoded. In some embodiments, the constituent codes in block row 0 again may be decoded again.

Refer now to the example embodiment of FIG. 41. FIG. 41 shows a DSP frame mapping datapath. In some embodiments, after oFEC encoding block interleaving of 172032-bit blocks may be done followed by symbol mapping. In some embodiments, a bit stream may be interleaved, to de-correlate the noise between consecutively received symbols, as well as to uniformly distribute the symbols. In certain embodiments, a number of blocks interleaved per DSP frame may be dependent on the modulation:

DP-16QAM=(1376256/172032)=8
DP-8QAM=(1032192/172032)=6
DP-QPSK=(688128/172032)=4

In some embodiments, an interleaver buffer size for the oFEC may be 172,032 bits. In certain embodiments, 172,032 bits may be organized as an (84, 8) array of 16×16 bit blocks, such as shown in the example embodiment of Table 17, below. In many embodiments, the format is similar to the format used by the encoder and decoder. In some embodiments, one or more of the following mechanisms may be applied:

1. An intra-block interleaver that reorders the bits in each 16×16 block to insure that the bits in each row and column of a block at the encoder output are remapped almost uniformly in the block for transmission on the line. That operation can be seen as happening on input to the interleaver.
2. An inter-block interleaver that attempts to have nearby symbols on the line contain bits that are widely separated in the encoder output.

Figure 45:
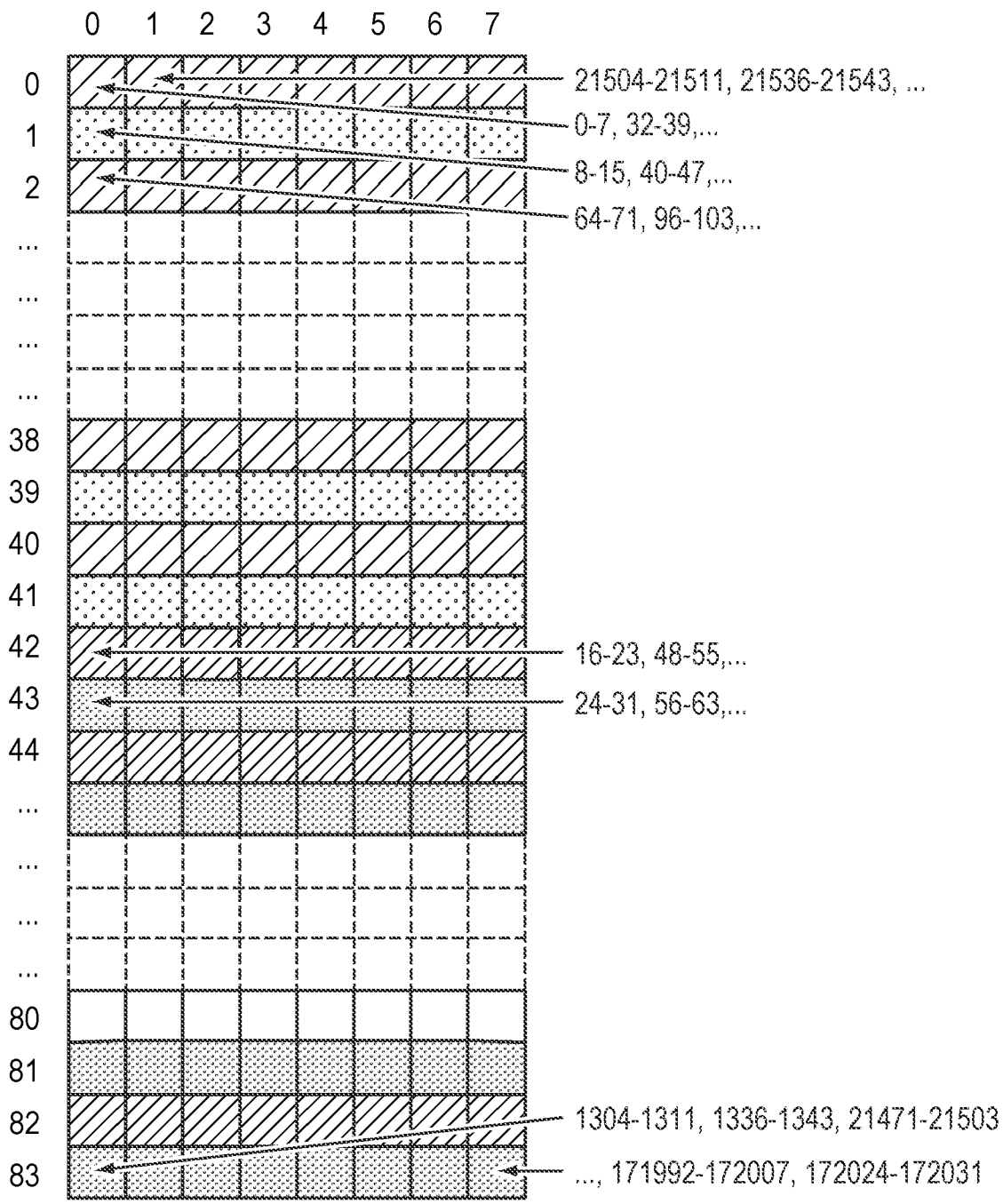
FIG. 45 is a simplified illustration of Inter-block interleaving, in accordance with an embodiment of the present disclosure.

In some embodiments, an interleaver may be full rate, but may be fed by two half rate encoders, 0 and 1. In many embodiments, successive rows of blocks from encoder 0 may be written in even block rows of the interleaver buffer (such as the yellowish colors of the example embodiment of FIG. 45), while successive rows of blocks from encoder 1 may be written in odd block row (pinkish colors). In other embodiments, content of an interleaver buffer may be the row by row interleaving of vertical segments of the infinite matrices of encoders 0 and 1.

In some embodiments, for the purpose of intra-block interleaving, the interleaver may be considered to receive 16×16 blocks of bits from the encoders and each such block may be separately. In certain embodiments, intra-block interleaving may be specified by the following table, which indicates the row and column of the source bit for each destination bit in the block. In this example embodiment, bit (14, 15) [base 0] in an interleaver input block (i.e. encoder output block) may be placed in row 1 of column 0 of the corresponding interleaver buffer block.

TABLE 17 example embodiment of a Source positions (row, col) for intra-block interleaving

| | | | | | | | | | | | | | | | |
|---|---|---|---|---|---|---|---|---|---|---|---|---|---|---|---|
| 0, 0 | 1, 1 | 2, 2 | 3, 3 | 4, 4 | 5, 5 | 6, 6 | 7, 7 | 8, 8 | 9, 9 | 10, 10 | 11, 11 | 12, 12 | 13, 13 | 14, 14 | 15, 15 |
| 14, 15 | 15, 0 | 0, 1 | 1, 2 | 2, 3 | 3, 4 | 4, 5 | 5, 6 | 6, 7 | 7, 8 | 8, 9 | 9, 10 | 10, 11 | 11, 12 | 12, 13 | 13, 14 |
| 12, 14 | 13, 15 | 14, 0 | 15, 1 | 0, 2 | 1, 3 | 2, 4 | 3, 5 | 4, 6 | 5, 7 | 6, 8 | 7, 9 | 8, 10 | 9, 11 | 10, 12 | 11, 13 |
| 10, 13 | 11, 14 | 12, 15 | 13, 0 | 14, 1 | 15, 2 | 0, 3 | 1, 4 | 2, 5 | 3, 6 | 4, 7 | 5, 8 | 6, 9 | 7, 10 | 8, 11 | 9, 12 |
| 8, 12 | 9, 13 | 10, 14 | 11, 15 | 12, 0 | 13, 1 | 14, 2 | 15, 3 | 0, 4 | 1, 5 | 2, 6 | 3, 7 | 4, 8 | 5, 9 | 6, 10 | 7, 11 |
| 6, 11 | 7, 12 | 8, 13 | 9, 14 | 10, 15 | 11, 0 | 12, 1 | 13, 2 | 14, 3 | 15, 4 | 0, 5 | 1, 6 | 2, 7 | 3, 8 | 4, 9 | 5, 10 |
| 4, 10 | 5, 11 | 6, 12 | 7, 13 | 8, 14 | 9, 15 | 10, 0 | 11, 1 | 12, 2 | 13, 3 | 14, 4 | 15, 5 | 0, 6 | 1, 7 | 2, 8 | 3, 9 |
| 2, 9 | 3, 10 | 4, 11 | 5, 12 | 6, 13 | 7, 14 | 8, 15 | 9, 0 | 10, 1 | 11, 2 | 12, 3 | 13, 4 | 14, 5 | 15, 6 | 0, 7 | 1, 8 |
| 15, 7 | 0, 8 | 1, 9 | 2, 10 | 3, 11 | 4, 12 | 5, 13 | 6, 14 | 7, 15 | 8, 0 | 9, 1 | 10, 2 | 11, 3 | 12, 4 | 13, 5 | 14, 6 |
| 13, 6 | 14, 7 | 15, 8 | 0, 9 | 1, 10 | 2, 11 | 3, 12 | 4, 13 | 5, 14 | 6, 15 | 7, 0 | 8, 1 | 9, 2 | 10, 3 | 11, 4 | 12, 5 |
| 11, 5 | 12, 6 | 13, 7 | 14, 8 | 15, 9 | 0, 10 | 1, 11 | 2, 12 | 3, 13 | 4, 14 | 5, 15 | 6, 0 | 7, 1 | 8, 2 | 9, 3 | 10, 4 |
| 9, 4 | 10, 5 | 11, 6 | 12, 7 | 13, 8 | 14, 9 | 15, 10 | 0, 11 | 1, 12 | 2, 13 | 3, 14 | 4, 15 | 5, 0 | 6, 1 | 7, 2 | 8, 3 |
| 7, 3 | 8, 4 | 9, 5 | 10, 6 | 11, 7 | 12, 8 | 13, 9 | 14, 10 | 15, 11 | 0, 12 | 1, 13 | 2, 14 | 3, 15 | 4, 0 | 5, 1 | 6, 2 |
| 5, 2 | 6, 3 | 7, 4 | 8, 5 | 9, 6 | 10, 7 | 11, 8 | 12, 9 | 13, 10 | 14, 11 | 15, 12 | 0, 13 | 1, 14 | 2, 15 | 3, 0 | 4, 1 |
| 3, 1 | 4, 2 | 5, 3 | 6, 4 | 7, 5 | 8, 6 | 9, 7 | 10, 8 | 11, 9 | 12, 10 | 13, 11 | 14, 12 | 15, 13 | 0, 14 | 1, 15 | 2, 0 |
| 1, 0 | 2, 1 | 3, 2 | 4, 3 | 5, 4 | 6, 5 | 7, 6 | 8, 7 | 9, 8 | 10, 9 | 11, 10 | 12, 11 | 13, 12 | 14, 13 | 15, 14 | 0, 15 |

In most embodiments, the left entries in this table form a Latin Square. In some embodiments, right entries almost form a Latin square, except that they are duplicated in the first and last row. In many embodiments, intra-block permutation may be applied to each block in the buffer as it comes in from an encoder.

In other embodiments, in addition to partitioning the interleaver buffer as a function of the encoder, 0 or 1, it may also partitioned in an upper half of 42 columns (light color tones) and a bottom part of 42 block rows (dark color tones). In many embodiments, overall a buffer may be then portioned in 4 subsets, each containing 21×8 blocks or 336×128 bits.

TABLE 18 example embodiment of Interleaver subsets

| Subset number | Row Blocks |
|---|---|
| 0 | 0, 2, . . . , 40 |
| 1 | 1, 3, . . . , 41 |
| 2 | 42, 44, . . . , 82 |
| 3 | 43, 45, . . . , 83 |

In many embodiments, on output, groups of 8 bits may be taken in turn from each subset, reading them out of a column of bits before proceeding to the next columns of bits. Refer now to the example embodiment of FIG. 45. As shown in the example embodiment of FIG. 45, the first 8 bits are read from the top of first column of subset 0, then the first 8 bits from the first column of subsets 1, 2 and 3. Those 32 bits are then followed by the taking the next 8 bits in the first column of each of the subsets 0, 1, 2 and 3. After 42 such cycles of 4×8 bits each, the first bit column of the interleaver buffer will be completely read out, and the output process continues by reading bit columns 1 to 127.

In most embodiments, reading by columns of bits may be superior to reading by rows, because interleaver columns are much longer than rows, and thus bits in a column are spread over more constituent codes than bits in a row and this increases the tolerance to long bursts. In certain embodiments, a maximum correctable burst length, when used with a hard decoder, is a traditional measure of interleaver quality. In some embodiments, it may be shown to be 2681 bits. In certain embodiments, bits read out of the interleaver may be passed to the modulator where they are used in groups of S=4, 6 or 8, for QPSK, 8QAM and 16QAM respectively in both the H and V polarizations.

In many embodiments, output bits with even indexes may be used to form symbols for the H polarization, while those in odd positions are formed to symbols in the V polarization. In certain embodiments, using even and odd indexes may simplify the line BER estimation in each polarization. In some embodiments, H and V bits may appear at fixed positions in each block in the decoder independently of the modulation.

Example Embodiment of Signal Degrade Monitoring and Signaling

In some embodiments, a Transponder/Muxponder link may provide detection and signaling of Signal Degrade (SD) for use by switch/routers with soft reroute capabilities. Local/Remote Degrade Interworking between Router and OTN.

Figure 46:
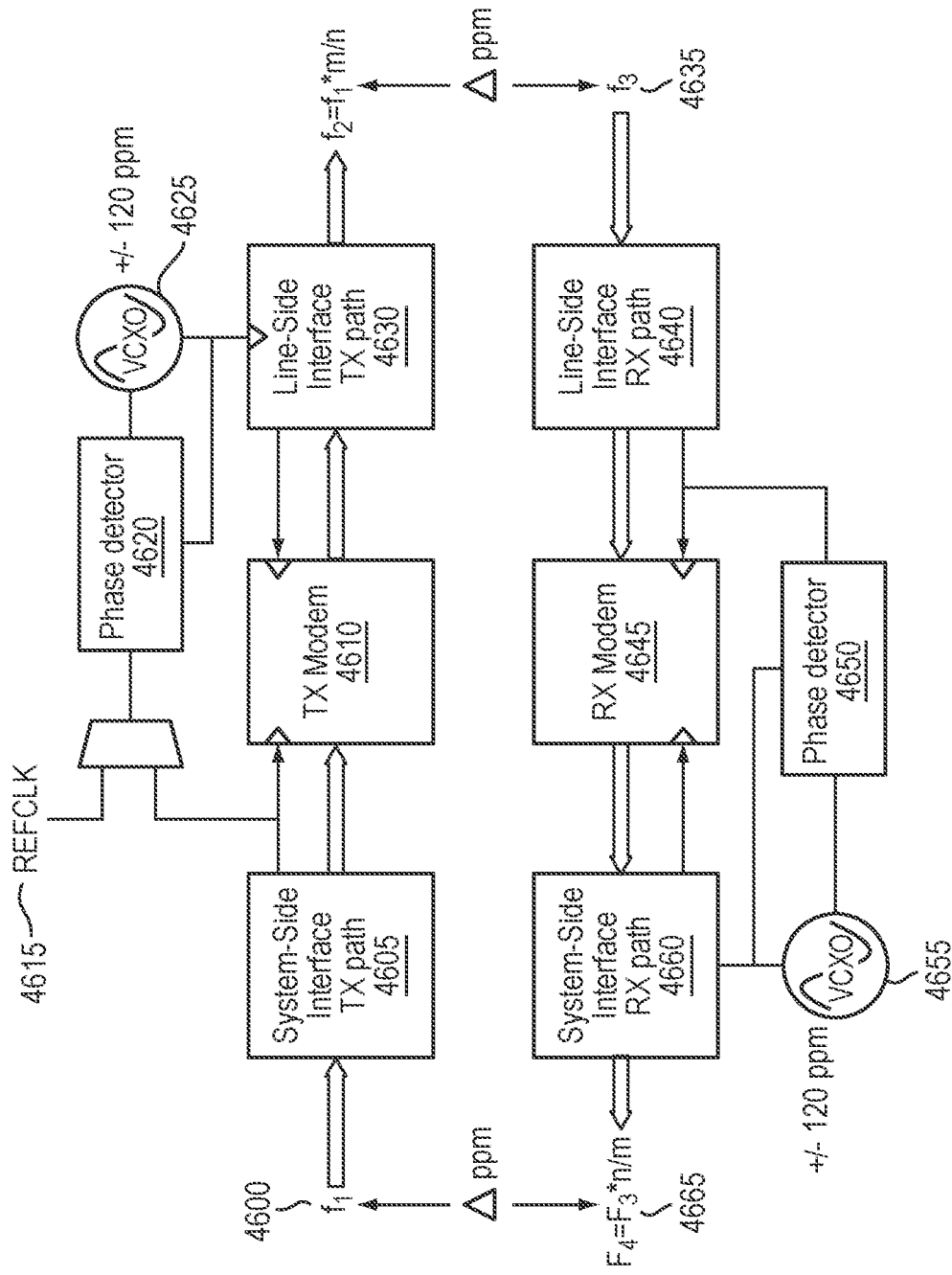
FIG. 46 is a simplified illustration of using GMP to map synchronous data to tributaries of an oFRAME, in accordance with an embodiment of the present disclosure.
Figure 47:
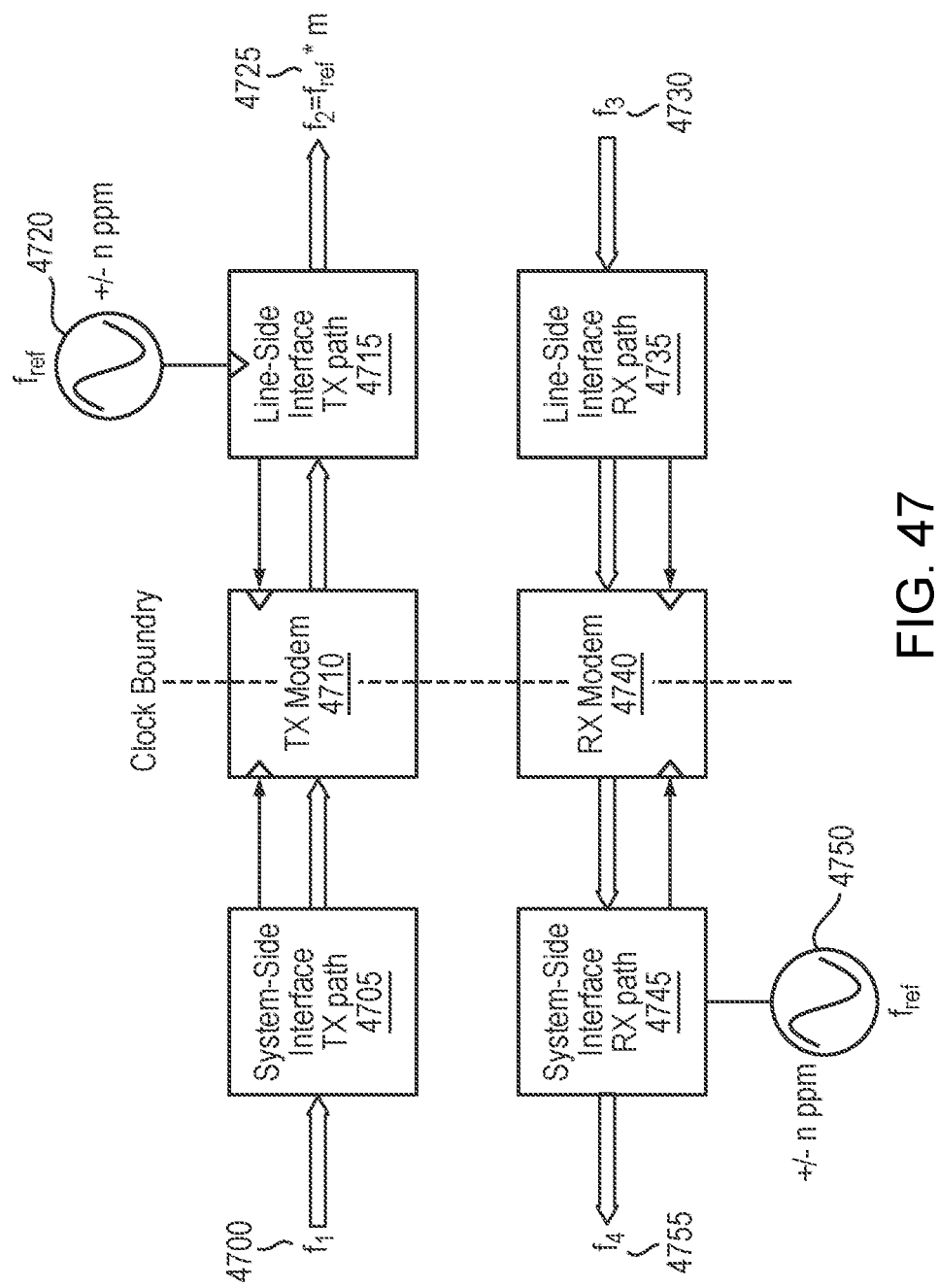
FIG. 47 is a simplified illustration of using GMP to map asynchronous data to tributaries of an oFrame, in accordance with an embodiment of the present disclosure.

Refer now to the example embodiment of FIG. 46 which represents a process for synchronous mapping. Refer now to the example embodiment of FIG. 47, which represents a process for asynchronous mapping. Refer now to the example embodiment of FIG. 48, which illustrates mapping synchronous and asynchronous mapping in to a single transport medium.

Figure 48:
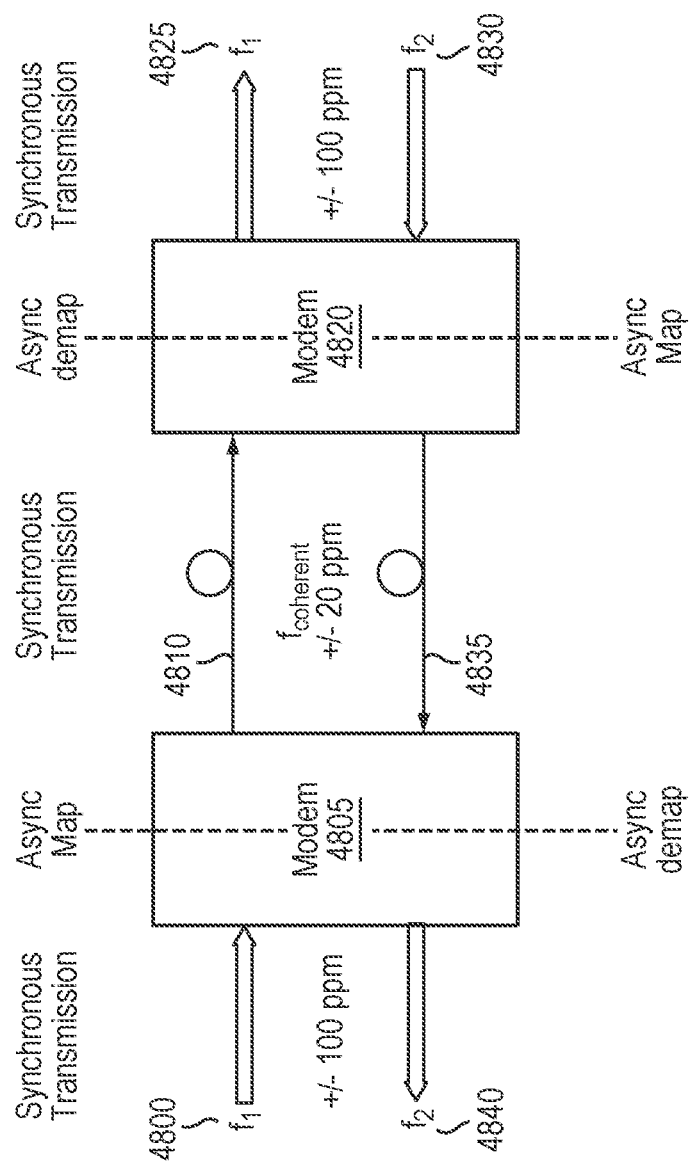
FIG. 48 is a simplified illustration mapping synchronous and asynchronous data sources into a single datapath, in accordance with an embodiment of the present disclosure.
Figure 49:
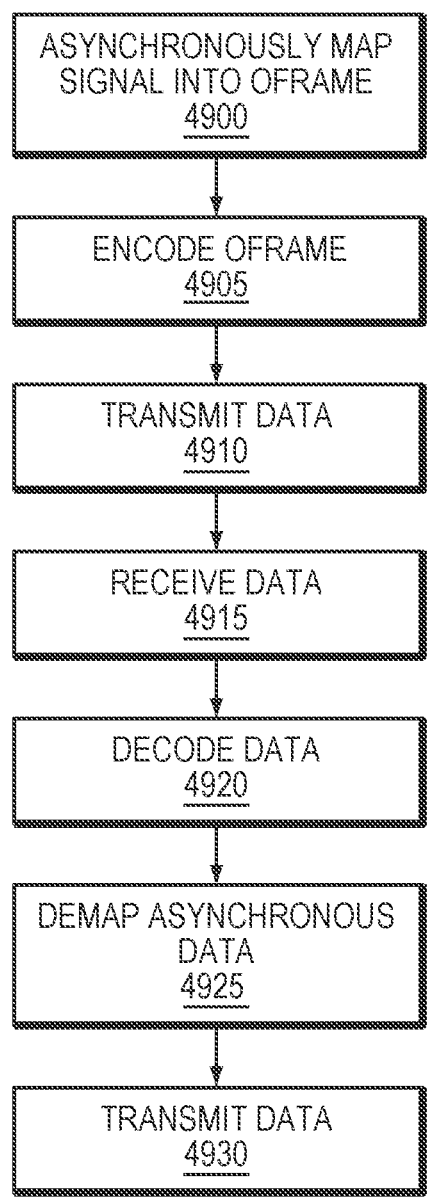
FIG. 49 is a simplified method for mapping and demapping data to an oFrame, in accordance with an embodiment of the present disclosure.

Refer now to the example embodiment of FIGS. 48 and 49, which illustrate mapping a synchronous or asynchronous client in to a single transport medium. In the example embodiment of FIG. 48, data signal f1 4800 is asynchronously mapped into an oFrame using a generic mapping procedure in modem 4805 (step 4900). oFrame is encoded in a FEC protocol (step 4905) and transmitted using synchronous transmission over connection 4810 to modem 4820 (step 4910). Modem 4820 receives (step 4915), decodes FEC encoding (step 4920) and demaps data signal f1 from oFrame (step 4925), and transmits it as data signal f1 4825 on receiver side (step 4930). Modem 4820 also receives data signal f2 4830, adds it to an oFrame using a generic mapping procedure (step 4900), encodes the signal using a FEC (4905), and transmits it over link 4835 to modem 4805 (step 4910). Modem 4805 receives the signal (step 4915), decodes the received signal (step 4920), demaps data signal f2 4830 from oFrame (step 4925), and transmits it as data signal f2 4840 (step 4930).

In many embodiments, one or more of the current techniques may be performed in a Digital Signal Processing (DSP) of a receiver. In some embodiments, a DSP may encode a particular constellation. In most embodiments, one or more of the current techniques may be performed in real time.

In some embodiments, one or more of the embodiments described herein may be stored on a computer readable medium. In certain embodiments, a computer readable medium may be one or more memories, one or more hard drives, one or more flash drives, one or more compact disk drives, or any other type of computer readable medium. In certain embodiments, one or more of the embodiments described herein may be embodied in a computer program product that may enable a processor to execute the embodiments. In many embodiments, one or more of the embodiments described herein may be executed on at least a portion of a processor. In most embodiments, a processor may be a physical or virtual processor. In other embodiments, a virtual processor may be spread across one or more portions of one or more physical processors. In certain embodiments, one or more of the embodiments described herein may be embodied in hardware such as a Digital Signal Processor DSP. In certain embodiments, one or more of the embodiments herein may be executed on a DSP. One or more of the embodiments herein may be programed into a DSP. In some embodiments, a DSP may have one or more processors and one or more memories. In certain embodiments, a DSP may have one or more computer readable storages. In some embodiments, on or more of an encoder, decoder, mapper, modulator, demodulator, decoder, and demapper may be part of one or more DSPs. In other embodiments, one or more of the embodiments stored on a computer readable medium may be loaded into a processor and executed. In further embodiments, on or more of the techniques herein may be performed by an ASIC chip. In certain embodiments, a DSP may be an ASIC chip.

What is claimed is:

1. A system comprising:
   a first modem; wherein the first modem contains logic enabled to map synchronous and asynchronous data sources into a single payload using a generic mapping system which decouples a clock from each data source and maps data from each data source into a tributary slot of an oFrame container; wherein a clock of each data source is enabled to be mapped to an oFrame clock; wherein n*Y+mZ Gbit/Sec of data is enabled to be mapped and multiplexed into an oFrame container; wherein n and m are integers and Y and Z are client bit rates; and
   a second modem; wherein the first modem contains logic enabled to demap data sources from tributaries in an oFrame to recreate the data sources at the second modem; wherein the mapping includes remapping the clock of each data source signal to the clock of each data source signal from the oFrame clock.

2. The system of claim 1 wherein the logic of the first modem enables inserting padding data to convert variable rate data sources into fixed rate data sources.

3. The system of claim 1 wherein the oFrame includes an alignment marker (AM); wherein the AM is partitioned as an n*480b blocks; wherein the AM is used to find the oFrame block boundary.

4. The system of claim 3 wherein the oFrame includes overhead data (OH); wherein the OH is partitioned into 4×320b fields.

5. The system of claim 4 wherein a first data rate of a first data source of the data sources is larger than a second data rate of a second data source of the data sources.

6. The system of claim 4 wherein the OH is partitioned into 4×320b fields.

7. The system of claim 6 wherein each 100G tributary slot has a corresponding OH field.

8. The system of claim 3 wherein each oFrame container has an AM, padding, and overhead area every 256 rows.

9. The system of claim 1 wherein the oFrame has an AM field.

10. The system of claim 1 wherein the oFrame container is partitioned into 4 100G tributary slots; wherein the oFrame Container is enabled to contain client data selected from the group consisting of 1×400G client, 2×200G clients, 1×300 G, 1×300G plus 1×100G, and 4×100G clients.

11. An apparatus comprising:
a first modem; wherein the first modem contains logic enabled to map synchronous and asynchronous data sources into a single payload using a generic mapping system which decouples a clock from each data source and maps data from each data source into a tributary slot of an oFrame container; wherein a clock of each data source is enabled to be mapped to an oFrame clock; wherein n*Y+mZ Gbit/Sec of data is enabled to be mapped and multiplexed into an oFrame container; wherein n and m are integers and Y and Z are client bit rates; and logic enabled to demap data sources from tributaries in an oFrame to recreate the data sources at the second modem.

12. The apparatus of claim 11 wherein the logic of the first modem enables inserting padding data to convert variable rate data sources into fixed rate data sources.

13. The apparatus of claim 12 wherein the oFrame includes an alignment marker (AM); wherein the AM is partitioned as an n*480b blocks; wherein the AM is used to find the oFrame block boundary.

14. The apparatus of claim 13 wherein a first data rate of a first data source of the data sources is larger than a second data rate of a second data source of the data sources.

15. The apparatus of claim 12 wherein the oFrame includes overhead data (OH); wherein the OH is partitioned into 4×320b fields.

16. A method for transmitting information over a coherent optical link comprising:
enabling synchronous and asynchronous data sources to be mapped together into a single payload of an oFrame container using a generic mapping system; wherein n*Y+mZ Gbit/Sec of data is enabled to be mapped and multiplexed into the oFrame container; wherein n and m are integers and Y and Z are client bit rates;
decoupling-a clock from each data source;
mapping the clock to an oFrame clock; and
mapping data from each data source into a tributary slot of an oFrame container.

17. The method of claim 16 wherein the mapping inserts padding data to convert each variable rate data sources into fixed rate data sources.

18. The method of claim 16 wherein the oFrame includes an alignment marker (AM); wherein the AM is partitioned as an n*480b blocks; wherein the AM is used to find the oFrame block boundary.

19. The method of claim 18 wherein the oFrame includes overhead data; wherein the OH is partitioned into 4×320b fields.

20. The method of claim 19 wherein a first data rate of a first data source of the data sources is larger than a second data rate of a second data source of the data sources.

* * * * *